United States Patent
Bruder et al.

(10) Patent No.: US 9,001,029 B2
(45) Date of Patent: Apr. 7, 2015

(54) DETECTOR FOR OPTICALLY DETECTING AT LEAST ONE OBJECT

(75) Inventors: Ingmar Bruder, Ludwigshafen (DE); Felix Eickemeyer, Heidelberg (DE); Peter Erk, Frankenthal (DE); Rüdiger Sens, Ludwigshafen (DE); Stephan Irle, Siegen (DE); Haroun Al Mohamedi, Tuebingen (DE); Andreas Pelster, Siegen (DE); Erwin Thiel, Siegen (DE)

(73) Assignee: BASF SE, Ludwigshafen (DE)

( * ) Notice: Subject to any disclaimer, the term of this patent is extended or adjusted under 35 U.S.C. 154(b) by 496 days.

(21) Appl. No.: 13/357,206

(22) Filed: Jan. 24, 2012

(65) Prior Publication Data

US 2012/0206336 A1     Aug. 16, 2012

Related U.S. Application Data

(60) Provisional application No. 61/442,838, filed on Feb. 15, 2011.

(51) Int. Cl.
*G09G 5/00* (2006.01)
*G01B 11/02* (2006.01)
(Continued)

(52) U.S. Cl.
CPC .......... *G01B 11/026* (2013.01); *H01L 51/0059* (2013.01); *G01S 17/10* (2013.01); *G01S 17/58* (2013.01); *G01S 7/4808* (2013.01); *H01L 51/422* (2013.01); *Y02E 10/549* (2013.01)

(58) Field of Classification Search
CPC ......... G06F 3/016; G06F 3/011; G06F 3/038; G06F 3/033313

USPC .................... 345/76–83, 156–158, 173–179
See application file for complete search history.

(56) References Cited

U.S. PATENT DOCUMENTS

| 4,023,033 A | 5/1977 | Bricot et al. |
| 4,469,945 A | 9/1984 | Hoeberechts et al. |

(Continued)

FOREIGN PATENT DOCUMENTS

| CN | 1677053 A | 10/2005 |
| CN | 101290348 A | 10/2008 |

(Continued)

OTHER PUBLICATIONS

International Search Report and Written Opinion issued May 31, 2012 in PCT/IB2012/050592 filed on Feb. 9, 2012.

(Continued)

*Primary Examiner* — Kimnhung Nguyen
(74) *Attorney, Agent, or Firm* — Oblon, McClelland, Maier & Neustadt, L.L.P.

(57) ABSTRACT

A detector (110) for optically detecting at least one object (112) is proposed. The detector (110) comprises at least one optical sensor (114). The optical sensor (114) has at least one sensor region (116). The optical sensor (114) is designed to generate at least one sensor signal in a manner dependent on an illumination of the sensor region (116). The sensor signal, given the same total power of the illumination, is dependent on a geometry of the illumination, in particular on a beam cross section of the illumination on the sensor area (118). The detector (110) furthermore has at least one evaluation device (122). The evaluation device (122) is designed to generate at least one item of geometrical information from the sensor signal, in particular at least one item of geometrical information about the illumination and/or the object (112).

22 Claims, 15 Drawing Sheets

(51) Int. Cl.
*H01L 51/00* (2006.01)
*G01S 17/10* (2006.01)
*G01S 17/58* (2006.01)
*G01S 7/48* (2006.01)
*H01L 51/42* (2006.01)

(56) References Cited

U.S. PATENT DOCUMENTS

| | | | |
|---|---|---|---|
| 4,647,193 | A | 3/1987 | Rosenfeld |
| 4,767,211 | A | 8/1988 | Munakata et al. |
| 4,927,721 | A | 5/1990 | Gratzel et al. |
| 5,350,644 | A | 9/1994 | Graetzel et al. |
| 6,359,211 | B1 | 3/2002 | Spitler et al. |
| 6,995,445 | B2 | 2/2006 | Forrest et al. |
| 7,196,317 | B1 * | 3/2007 | Meissner et al. .......... 250/227.14 |
| 7,417,716 | B2 | 8/2008 | Nagasaka et al. |
| 7,626,569 | B2 * | 12/2009 | Lanier ........................ 345/156 |
| 8,228,299 | B1 * | 7/2012 | Maloney et al. ............. 345/173 |
| 2004/0178325 | A1 | 9/2004 | Forrest et al. |
| 2005/0184301 | A1 | 8/2005 | Nagasaka et al. |
| 2006/0049397 | A1 | 3/2006 | Pfeiffer et al. |
| 2007/0176165 | A1 | 8/2007 | Forrest et al. |
| 2008/0259310 | A1 | 10/2008 | Wada |
| 2008/0269482 | A1 | 10/2008 | Pschirer et al. |
| 2010/0282309 | A1 | 11/2010 | Pschirer et al. |
| 2011/0099105 | A1 * | 4/2011 | Mennie et al. ................. 705/41 |
| 2011/0297235 | A1 | 12/2011 | Bergmann |

FOREIGN PATENT DOCUMENTS

| | | |
|---|---|---|
| CN | 101650173 A | 2/2010 |
| DE | 25 01 124 A1 | 8/1975 |
| DE | 32 25 372 A1 | 2/1983 |
| DE | 10 2005 053 995 A1 | 5/2007 |
| EP | 1 176 646 A1 | 1/2002 |
| JP | 8-159714 | 6/1996 |
| JP | 8-159714 A | 6/1996 |
| JP | 10-221064 | 8/1998 |
| WO | WO 02/101838 A1 | 12/2002 |
| WO | WO 2005/106965 A1 | 11/2005 |
| WO | WO 2007/054470 A1 | 5/2007 |
| WO | WO 2009/013282 A1 | 1/2009 |
| WO | WO 2010/094636 A1 | 8/2010 |

OTHER PUBLICATIONS

Extended Search Report issued Aug. 23, 2011 in Europe Application No. 11154531.5 (With English Translation of Category of Cited Documents).

Erwin Bacher, et al., "Synthesis and Characterization of Photo-Cross-Linkable Hole-Conducting Polymers", Macromolecules, vol. 38, 2005, pp. 1640-1647.

H. Bruce Goodbrand, et al., "Ligand-Accelerated Catalysis of the Ullmann Condensation: Application to Hole Conducting Triarylamines", J. Org. Chem., vol. 64, 1999, pp. 670-674.

Felix E. Goodson, et al., "Palladium-Catalyzed Synthesis of Pure, Regiodefined Polymeric Triarylamines", J. Am. Chem. Soc., vol. 121, 1999, pp. 7527-7539.

John F. Hartwig, "Transition Metal Catalyzed Synthesis of Arylamines and Aryl Ethers from Aryl Halides and Triflates: Scope and Mechanism", Angew. Chem. Int. Ed., vol. 37, 1998, pp. 2046-2067.

Sheila I. Hauck, et al., "Tetraazacyclophanes by Palladium-Catalyzed Aromatic Amination. Geometrically Defined, Stable, High-Spin Diradicals", Organic Letters, vol. 1, No. 13, 1999, pp. 2057-2060.

Ping-Hsin Huang, et al., "Synthesis and Characterization of new fluorescent two-photon absorption chromophores", J. Mater. Chem., vol. 16, 2006, pp. 850-857.

Qinglan Huang, et al., "Molecularly 'Engineered' Anode Adsorbates for Probing OLED Interfacial Structure—Charge Injection/Luminance Relationships: Large, Structure-Dependent Effects", J. Am. Chem. Soc., vol. 125, 2003, pp. 14704-14705.

A. Balionyte, et al., "Carbazolyl-substituted triphenyldiamine derivatives as novel photoconductive amorphous molecular materials", Journal of Photochemistry and Photobiology A: Chemistry, vol. 162, 2004, pp. 249-252.

G. R. A. Kumara, et al., "Fabrication of Dye-Sensitized Solar Cells Using Triethylamine Hydrothiocyanate as a CuI Crystal Growth Inhibitor", Langmuir, vol. 18, 2002, pp. 10493-10495.

Lukas Schmidt-Mende, et al., "Organic Dye for Highly Efficient Solid-State Dye-Sensitized Solar Cells", Adv. Mater., vol. 17, No. 7, 2005, pp. 813-815.

James Lindley, "Copper Assisted Nucleophilic Substitution of Aryl Halogen", Tetrahedron, vol. 40, No. 9, 1984, pp. 1433-1456.

Yunqi Liu, et al., "Synthesis and characterization of a novel bipolar polymer for light-emitting diodes", Chem. Commun., vol. 24, 1998, pp. 2747-2748.

Narukuni Hirata, et al., "Interface engineering for solid-state dye-sensitised nanocrystalline solar cells: the use of an organic redox cascade", Chem. Commun., vol. 5, 2006, pp. 535-537.

Qingjiang Yu, et al., "High-Efficiency Dye-Sensitized Solar Cells: The Influence of Lithium Ions on Exciton Dissociation, Charge Recombination, and Surface States", ACS Nano, vol. 4, No. 10, 2010, pp. 6032-6038.

Bin Peng, et al., "Systematic investigation of the role of compact $TiO_2$ solar cells", Coordination Chemistry Reviews, vol. 248, 2004, pp. 1479-1489.

Jiun Yi Shen, et al., "High $T_g$ blue emitting materials for electroluminescent devices", J. Mater. Chem., vol. 15, 2005, pp. 2455-2463.

Tobat P. I. Saragi, et al., "Comparison of Charge-Carrier Transport in Thin Films of Spiro-Linked Compounds and Their Corresponding Parent Compounds", Adv. Funct. Mater., vol. 16, 2006, pp. 966-974.

V. P. S. Perera, et al., "Dye-Sensitized Solid-State Photovoltaic Cells Based on Dye Multilayer-Semiconductor Nanostructures", J. Phys. Chem. B, vol. 107, 2003, pp. 13758-13761.

U. Bach, et al., "Solid-state dye-sensitized mesoporous $TiO_2$ solar cells with high photon-to-electron conversion efficiencies", Nature, vol. 395, 1998, pp. 583-585.

John P. Wolfe, et al., "Rational Development of Practical Catalysts for Aromatic Carbon-Nitrogen Bond Formation", Acc. Chem. Res. vol. 31, 1998, pp. 805-818.

Bryant H. Yang, et al., "Palladium-Catalyzed amination of aryl halides and sulfonates", Journal of Organometallic Chemistry, vol. 576, 1999, pp. 125-146.

Zhong Hui Li, et al., "Synthesis and Functional Properties of Strongly Luminescent Diphenylamino End-Capped Oligophenylenes", J. Org. Chem., vol. 69, 2004, pp. 921-927.

Brian O'Regan, et al., "A low-cost, high-efficiency solar cell based on dye-sensitized colloidal $TiO_2$ films", Letters to Nature, vol. 353, 1991, pp. 737-740.

Supplementary European Search Report issued Nov. 19, 2014, issued in corresponding European Patent Application No. EP 12 74 6808.

* cited by examiner

DETECTOR FOR OPTICALLY DETECTING AT LEAST ONE OBJECT

FIELD OF THE INVENTION

The invention relates to a detector for optically detecting at least one object. Furthermore, the invention relates to a distance measuring device, an imaging device, a human-machine interface, an entertainment device and a security device. Furthermore, the invention relates to a method for optically detecting at least one object and to a use of an organic solar cell as optical sensor. Such devices, methods and uses can be employed for example in various areas of daily life, traffic technology, production technology, security technology, medical technology or in the sciences. However, other applications are also possible in principle.

PRIOR ART

A large number of optical sensors and photovoltaic devices are known from the prior art. While photovoltaic devices are generally used to convert electromagnetic radiation, for example, ultraviolet, visible or infrared light, into electrical signals or electrical energy, optical detectors are generally used for picking up image information and/or for detecting at least one optical parameter, for example, a brightness.

A large number of optical sensors which can be based generally on the use of inorganic and/or organic sensor materials are known from the prior art. Examples of such sensors are disclosed in US 2007/0176165 A1, U.S. Pat. No. 6,995,445 B2, DE 2501124 A1, DE 3225372 A1 or else in numerous other prior art documents. To an increasing extent, in particular for cost reasons and for reasons of large-area processing, sensors comprising at least one organic sensor material are being used, as described for example in US 2007/0176165 A1. In particular, so-called dye solar cells are increasingly of importance here, which are described generally, for example in WO 2009/013282 A1.

A large number of detectors for detecting at least one object are known on the basis of such optical sensors. Such detectors can be embodied in diverse ways, depending on the respective purpose of use. Examples of such detectors are imaging devices, for example, cameras and/or microscopes. High-resolution confocal microscopes are known, for example, which can be used in particular in the field of medical technology and biology in order to examine biological samples with high optical resolution. Further examples of detectors for optically detecting at least one object are distance measuring devices based, for example, on propagation time methods of corresponding optical signals, for example laser pulses. Further examples of detectors for optically detecting objects are triangulation systems, by means of which distance measurements can likewise be carried out.

Proceeding from such known detectors and methods for optically detecting objects, it can be ascertained that in many cases a considerable technical outlay has to be implemented in order to carry out this object detection with sufficient precision.

By way of example, in microscopy a considerable outlay in respect of apparatus is required in order to obtain correct focusing of a light beam and/or in order to obtain depth information about the sample to be imaged.

Distance measurements, by contrast, are based in many cases on technically inadequate assumptions such as, for example, the assumption of a specific size of an object in an image evaluation. Other methods are based in turn on complex pulse sequences, such as, for example, distance measurements by means of laser pulses. Yet other methods are based on the use of a plurality of detectors such as, for example, triangulation methods.

PROBLEM ADDRESSED BY THE INVENTION

Therefore, a problem addressed by the present invention is that of specifying devices and methods for optically detecting at least one object which at least substantially avoid the disadvantages of known devices and methods of this type. In particular, the proposed devices and methods are intended to make it possible to simplify an optical detection of at least one object in respect of apparatus.

DISCLOSURE OF THE INVENTION

This problem is solved by the invention with the features of the independent patent claims. Advantageous developments of the invention, which can be realized individually or in combination, are presented in the dependent claims.

A detector for optically detecting at least one object is proposed in a first aspect of the present invention.

In the context of the present invention, an optical detection should generally be understood to mean a process in which at least one item of information about the detected object is obtained. In this case, the term information should be interpreted broadly. The at least one item of information can comprise in particular one or more of the following items of information: an item of information about the fact that the object is present or not for example in a measurement range and/or visual range of the detector; an item of information about at least one optical property of the detector, for example, at least one brightness and/or at least one radiation property, for example a luminescence property; an item of location information of the object, for example, an item of information about a distance between the object and the detector or a part of the detector and/or a relative orientation of the object with respect to the detector or a part of the detector and/or an item of position information of the object in at least one coordinate system which is determined by the detector and/or the object; an item of information about a movement state of the object, for example a one-dimensional, two-dimensional or three-dimensional velocity of the object and/or an acceleration of the object. Alternatively or additionally, other items of information can also be obtained during the detection of the object. The invention is described below substantially with reference to obtaining an item of location information about the object, without restriction of further embodiments of the at least one item of geometrical information which can be realized alternatively or additionally. Said geometrical information, in particular the location information, can relate to the entire object or else only a part of the object, for example a point, an area or a region of the object, which is detected by means of the detector. Said point, said area or said region can be arranged on a surface of the object or else at least partly within the object.

The object can generally be a living or else inanimate object. Examples of objects which can be detected completely or partly by means of the detector are described in even greater detail below.

The detector comprises at least one optical sensor. The optical sensor has at least one sensor region, in particular at least one sensor region comprising at least one sensor area. The optical sensor is designed to generate at least one sensor signal in a manner dependent on an illumination of the sensor region. The sensor signal, given the same total power of the illumination, is dependent on a geometry of the illumination, in particular on a beam cross section of the illumination in the sensor region, in particular on the sensor area.

The detector furthermore has at least one evaluation device. The evaluation device is designed to generate at least one item of geometrical information from the sensor signal, in particular at least one item of geometrical information about the illumination and/or the object.

The detector can furthermore comprise at least one transfer device. The transfer device can be designed to feed electromagnetic radiation emerging from the object to the optical sensor and to illuminate the sensor region in the process. In the context of the present invention, a transfer device should be understood to mean a device which is embodied in any desired manner, in principle, and which is designed to feed the electromagnetic radiation emerging from the object to the optical sensor and there in particular to the sensor region or preferably the sensor area. This feeding can be embodied in imaging fashion or else in non-imaging fashion. Thus, this optional transfer device can comprise for example at least one beam path. The transfer device can for example comprise one or a plurality of mirrors and/or beam splitters and/or beam deflecting elements in order to influence a direction of the electromagnetic radiation. Alternatively or additionally, the transfer device can comprise one or a plurality of imaging elements which can have the effect of a converging lens and/or a diverging lens. By way of example, the optional transfer device can have one or a plurality of lenses and/or one or a plurality of convex and/or concave mirrors. Once again alternatively or additionally, the transfer device can have at least one wavelength-selective element, for example at least one optical filter. Once again alternatively or additionally, the transfer device can be designed to impress a predefined beam profile on the electromagnetic radiation, for example, at the location of the sensor region and in particular the sensor area. The abovementioned optional embodiments of the optional transfer device can, in principle, be realized individually or in any desired combination.

In the context of the present invention, an optical sensor should be understood generally to mean an element which is designed to convert at least one optical signal into a different signal form, preferably into at least one electrical signal, for example a voltage signal and/or a current signal. In particular the optical sensor can comprise at least one optical-electrical converter element, preferably at least one photodiode and/or at least one solar cell. As is explained in even greater detail below, in the context of the present invention, preference is attached particularly to a use of at least one organic optical sensor, that is to say an optical sensor which comprises at least one organic material, for example at least one organic semiconductor material.

In the context of the present invention, a sensor region should be understood to mean a two-dimensional or three-dimensional region which preferably, but not necessarily, is continuous and can form a continuous region, wherein the sensor region is designed to vary at least one measurable property, in a manner dependent on the illumination. By way of example, said at least one property can comprise an electrical property, for example, by the sensor region being designed to generate, solely or in interaction with other elements of the optical sensor, a photovoltage and/or a photocurrent and/or some other type of signal. In particular the sensor region can be embodied in such a way that it generates a uniform, preferably a single, signal in a manner dependent on the illumination of the sensor region. The sensor region can thus be the smallest unit of the optical sensor for which a uniform signal, for example, an electrical signal, is generated, which preferably can no longer be subdivided to partial signals, for example for partial regions of the sensor region. The optical sensor can have one or else a plurality of such sensor regions, the latter case for example by a plurality of such sensor regions being arranged in a two-dimensional and/or three-dimensional matrix arrangement.

The at least one sensor region can comprise for example at least one sensor area, that is to say a sensor region whose lateral extent considerably exceeds the thickness of the sensor region, for example by at least a factor of 10, preferably by at least a factor of 100 and particularly preferably by at least a factor of 1000. Examples of such sensor areas can be found in organic or inorganic photovoltaic elements, for example, in accordance with the prior art described above, or else in accordance with the exemplary embodiments described in even greater detail below. The detector can have one or a plurality of such optical sensors and/or sensor regions. By way of example, a plurality of optical sensors can be arranged linearly in a spaced-apart manner or in a two-dimensional arrangement or else in a three-dimensional arrangement, for example by a stack of photovoltaic elements being used, preferably organic photovoltaic elements, preferably a stack in which the sensor areas of the photovoltaic elements are arranged parallel to one another. Other embodiments are also possible.

The optional transfer device can, as explained above, be designed to feed electromagnetic radiation emerging from the object to the optical sensor. As explained above, this feeding can optionally be effected by means of imaging or else by means of non-imaging properties of the transfer device. In particular the transfer device can also be designed to collect the electromagnetic radiation before the latter is fed to the optical sensor. The optional transfer device can also, as explained in even greater detail below, be wholly or partly a constituent part of at least one optional illumination source, for example by the illumination source being designed to provide electromagnetic radiation having defined optical properties, for example having a defined or precisely known beam profile, for example at least one Gaussian beam, in particular at least one laser beam having a known beam profile.

The electromagnetic radiation can be in particular light in one or more of the following spectral ranges: in the ultraviolet spectral range, in the visible spectral range, in the infrared spectral range. The ultraviolet spectral range can be considered to be for example a range with a wavelength of 50 nm to 400 nm, the visible spectral range a range of 400 nm to 800 nm, and the infrared spectral range a range of 800 nm to 100 000 nm.

The electromagnetic radiation emerging from the object can originate in the object itself, but can also optionally have a different origin and propagate from this origin to the object and subsequently toward the optical sensor and the sensor region. The latter case can be effected for example by at least one illumination source being used. This illumination source can be for example ambient light or else an artificial illumination source. By way of example, the detector itself can comprise at least one illumination source, for example at least one laser and/or at least one incandescent lamp and/or at least one semiconductor light source, for example, at least one light-emitting diode, in particular an organic and/or inorganic light-emitting diode. On account of their generally defined beam profiles and other properties of handleability, the use of one or a plurality of lasers as illumination source or as part thereof, is particularly preferred. The illumination source itself can be a constituent part of the detector or else be formed independently of the detector. The illumination source can be integrated in particular into the detector, for example a housing of the detector. Alternatively or additionally, at least one illumination source can also be integrated into the object or connected or spatially coupled to the object.

The electromagnetic radiation emerging from the object can accordingly, alternatively or additionally from the option that said radiation originates in the object itself emerge from the illumination source and/or be excited by the illumination source. By way of example, the electromagnetic radiation emerging from the object can be emitted by the object itself and/or be reflected by the object and/or be scattered by the object before it is fed to the optical sensor. In this case, emission and/or scattering of the electromagnetic radiation can be effected without spectral influencing of the electromagnetic radiation or with such influencing. Thus, by way of example, a wavelength shift can also occur during scattering, for example according to Stokes or Raman. Furthermore, emission of radiation can be excited, for example, by a primary light source, for example by the object or a partial region of the object being excited to effect luminescence, in particular phosphorescence and/or fluorescence. Other emission processes are also possible, in principle. If a reflection occurs, then the object can have for example at least one reflective region, in particular at least one reflective surface. Said reflective surface can be a part of the object itself, but can also be for example a reflector which is connected or spatially coupled to the object, for example a reflector plaque connected to the object. If at least one reflector is used, then it can in turn also be regarded as part of the detector which is connected to the object, for example, independently of other constituent parts of the detector. The at least one illumination source of the detector can generally be adapted to the emission and/or reflective properties of the object, for example in terms of its wavelength. Various embodiments are possible.

The feeding of the electromagnetic radiation to the optical sensor can be effected in particular in such a way that a light spot, for example having a round, oval or differently configured cross section, is produced on the optional sensor area. By way of example, the detector can have a visual range, in particular a solid angle range and/or spatial range, within which objects can be detected. Preferably, the optional transfer device is designed in such a way that the light spot, for example in the case of an object arranged within a visual range of the detector, is arranged completely on the sensor region, in particular the sensor area. By way of example, a sensor area can be chosen to have a corresponding size in order to ensure this condition.

As described above, the optical sensor is designed to generate at least one sensor signal in a manner dependent on the illumination of the sensor region. By way of example, this can be an electrical signal, in particular a voltage signal and/or current signal, for example a photovoltage and/or a photocurrent. Hereinafter, without restricting possible further embodiments, reference is made in particular to optical sensors which, in a manner dependent on the illumination generate at least one photocurrent. The optical signal can be temporally constant or vary temporally and can be embodied, in principle, in analog fashion or else in digital fashion, wherein analog signals are preferred hereinafter. The sensor signal can be used as a raw signal, but can also be subjected to one or a plurality of processing operations, for example one or a plurality of filtering operations or similar processing operations. No distinction is drawn hereinafter between these options and the use of a raw signal, and the term sensor signal is used uniformly. Furthermore, without restricting further possible embodiments, it is assumed that the sensor signal has positive values, and the term of a maximum should for example, also be understood in this respect. If one or a plurality of sensor signals having a negative sign are detected, which is likewise possible, then hereinafter either the expression of the maximum should be replaced by the term of a minimum or generally of an extremum, or the actual sensor signal should be replaced, for example by its absolute value, as will readily be evident to the person skilled in the art.

As explained above, the optical sensor is designed to generate at least one sensor signal in a manner dependent on the illumination of the sensor region, wherein the sensor signal, given the same total power of the illumination, is dependent on a geometry of the illumination, in particular on a beam cross section of the illumination on the sensor area.

A geometry of the illumination can generally summarize at least one property of the illumination which characterizes a two-dimensional and/or three-dimensional embodiment of a region of the sensor region which is exposed to the electromagnetic radiation emerging from the object. By way of example, the geometry of the illumination can be characterized by a beam cross section of the illumination on or in the sensor region, for example on a sensor surface, for example by a diameter or equivalent diameter of the illumination, for example of a light spot. As described above, a light spot which can have for example a diameter or an equivalent diameter can be produced for example on the sensor area. Said diameter or equivalent diameter can completely or partly characterize for example the geometry of the illumination. A light spot can be understood to mean for example an illuminated area, in particular in demarcation relative to an unilluminated area. By way of example, light spot can be understood to mean an area of the sensor region within which an intensity of the illumination is at least 10% of a maximum intensity. However, other definitions of a light spot are also possible, in principle, for example by other limit values being set instead of 10%, since an edge of the illumination in practice, will not be sharply defined by virtue of the intensity falling abruptly to zero.

The optical sensor can be designed for example in such a way that the sensor signal, given the same power of the illumination, that is to say for example given the same integral over the intensity of the illumination on the sensor area, is dependent on the geometry of the illumination, that is to say for example on the diameter and/or the equivalent diameter for the sensor spot. By way of example, the sensor can be designed in such a way that upon a doubling of the beam cross section given the same total power, a signal variation occurs by at least a factor of 3, preferably by at least a factor of 4, in particular a factor of 5 or even a factor of 10. This condition can hold true for example for a specific focusing range, for example for at least one specific beam cross section. Thus, by way of example, the signal can have, between at least one optimum focusing at which the signal can have for example at least one global or local maximum and a focusing outside said at least one optimum focusing, a signal difference by at least a factor of 3, preferably by at least a factor of 4, in particular a factor of 5 or even a factor of 10. In particular, the sensor signal can have as a function of the geometry of the illumination, for example of the diameter or equivalent diameter of a light spot, at least one pronounced maximum, for example with a boost by at least a factor of 3, particularly preferably by at least a factor of 4 and particularly preferably by at least a factor of 10.

Consequently, the invention is based generally on the hitherto unreported and surprising insight that specific optical sensors exist whose sensor signal is not only dependent on a total light power of the illumination of the sensor region, for example of the sensor area, of these sensors but in which a pronounced signal dependence on a geometry of the illumination, for example a size of a light spot of the illumination on the sensor region, for example the sensor area, also exists. This is generally not the case for most conventional optical sensors, in particular for most inorganic semiconductor sensors, since here the sensor signal is generally dependent only on a total power of the illumination, that is to say an integral over the intensity over the entire light spot which is generally independent of the size of the light spot, that is to say the geometry of the illumination, as long as the light spot lies within the limits of the sensor region. It has surprisingly been discovered, however, that in specific optical sensors, for example organic optical sensors, such a dependence of the sensor signal occurs in which the sensor signal on the one hand rises with the total power of the illumination, but on the other hand, even given a constant total power, is dependent on a geometry of the illumination. Examples of such optical sensors are explained in even greater detail below. By way of example, the sensor signal, given the same total power, can have at least one pronounced maximum for one or a plurality of focusings and/or for one or a plurality of specific sizes of the light spot on the sensor area or within the sensor region. This effect can additionally be dependent on, or intensified by, a frequency of the illumination by virtue of the fact that the electromagnetic radiation with which the sensor region is illuminated is not incident continuously on the sensor region, but rather is interrupted, for example interrupted periodically with a frequency f. The described optical sensors which have the stated effect of the dependence of the sensor signal, given the same total power of the illumination on a geometry of the illumination and optionally on a frequency of the illumination, are also designated hereinafter as fip sensors since, given the same total power p, the sensor signal can be dependent on the intensity i and optionally the frequency f or since the sensor signal, given the same total power p, can be dependent on an optical flux density $\phi$. By way of example, the sensor signal can comprise a photocurrent and/or a photovoltage. By way of example, the photocurrent can thus be a function of the total power p, of the flux $\phi$ and/or of the geometry of the illumination (e.g. of a diameter or an equivalent diameter of a light spot) and optionally of the frequency, or for example a function of the total power p, of the intensity (for example of a maximum intensity) and of the frequency.

Such effects of the dependence of the sensor signal on a beam geometry were observed in the context of the investigations leading to the present invention in particular in the case of organic photovoltaic components, that is to say photovoltaic components, for example, solar cells, which comprise at least one organic material, for example at least one organic p-semiconducting material and/or at least one organic dye. By way of example, such effects, as is explained in even greater detail below by way of example, were observed in the case of dye solar cells, that is to say components which have at least one first electrode, at least one n-semiconducting metal oxide, at least one dye, at least one p-semiconducting organic material, preferably a solid organic p-type semiconductor, and at least one second electrode. Such dye solar cells, preferably solid dye solar cells (solid dye sensitized solar cells, sDSC), are known in principle in numerous variations from the literature. The described effect of the dependence of the sensor signal on a geometry of the illumination on the sensor area and a use of this effect have not, however, been described heretofore.

In particular, the optical sensor can be designed in such a way that the sensor signal, given the same total power of the illumination, is substantially independent of a size of the sensor region, in particular of a size of the sensor area, in particular as long as the light spot of the illumination lies completely within the sensor region, in particular the sensor area. Consequently, the sensor signal can be dependent exclusively on a focusing of the electromagnetic rays on the sensor area. In particular the sensor signal can be embodied in such a way that a photocurrent and/or a photovoltage per sensor area have/has the same values given the same illumination, for example the same values given the same size of the light spot.

Consequently, by means of the optical detector, for example by a suitable calibration and/or by a suitable analysis of the sensor signal of the optical sensor, at least one additional item of information can be obtained, which is designated hereinafter as geometrical information. The detector comprises at least one evaluation device which is designed to generate the at least one item of geometrical information from the sensor signal.

An item of geometrical information should be understood to mean, in principle, any desired item of information which can be derived directly or indirectly from the abovementioned effect that the sensor signal, given the same total power of the illumination, is dependent on the geometry of the illumination. The geometrical information can comprise, in particular, at least one item of information about the illumination, in particular a geometry of the illumination, and/or at least one item of geometrical information about the object. The geometrical information can, in particular, go beyond an item of information about the light power alone. The geometrical information can preferably comprise at least one item of information about the geometry of the illumination and/or at least one item of information about at least one influencing variable which influences the geometry of the illumination for example an item of information about a distance of the object.

Particularly preferably the geometrical information comprises at least one item of information, selected from the group consisting of: an item of information about the fact that the object is present or not for example in a measurement range and/or visual range of the detector; an item of information about at least one optical property of the detector, for example, at least one brightness and/or at least one radiation property, for example a luminescence property; an item of location information of the object, for example, an item of information about a distance between the object and the detector or a part of the detector and/or a relative orientation of the object with respect to the detector or a part of the detector and/or an item of position information of the object in at least one coordinate system which is determined by the detector and/or the object; an item of information about a movement state of the object, for example a one-dimensional, two-dimensional or three-dimensional velocity of the object and/or an acceleration of the object; an item of information about a geometry of the illumination of the sensor region; an item of information about the fact that an illumination has taken place or is taking place with a specific geometry, in particular an inhomogeneous illumination of the sensor region, in particular a focused illumination, for example an illumination in which at least one light spot is produced on a sensor area. Alternatively or additionally, the geometrical information can also comprise one or a plurality of other items of information. The invention is described below substantially with reference to obtaining an item of geometrical information in the form of at least one item of location information about the object. Said location information can relate to the entire object or else only a part of the object, for example a point, an area or a region of the object which is detected by means of the detector. This point, this area or this region can be arranged on a surface of the object or else at least partly within the object.

The geometrical information can be generated in any desired form, in principle. Preferably, the geometrical information is generated in a machine-readable form and/or a form that can be used by a machine. By way of example, the geometrical information can be generated in the form of at least one electrical and/or optical signal. Alternatively or additionally, the geometrical information can also be generated in a form that can be read and/or detected by a human, for example by printout on paper, by display on a screen, by an output in visual form, by an output in acoustic form, by an output in haptic form or by a combination of two or more of the stated and/or other output forms that can be detected by a human. The geometrical information may have been stored or can be stored in particular on at least one volatile or nonvolatile data memory which can be for example wholly or partly a constituent part of the evaluation device and/or of some other device. Alternatively or additionally, the at least one item of geometrical information can also be provided and/or transferred by means of at least one interface, for example by means of at least one output device.

An evaluation device should generally be understood to mean a device which is designed to generate the at least one item of geometrical information from the at least one sensor signal, using the above-described effect that the sensor signal, given the same total power of the illumination, is dependent on the geometry of the illumination. In particular, in this case it is possible to use a known relationship between the geometry of the illumination and the geometrical function, as is explained in even greater detail below by way of example.

The evaluation device can comprise in particular at least one data processing device, in particular an electronic data processing device, which can be designed to use the at least one sensor signal as at least one input variable and to generate the at least geometrical information using said input variable, for example by calculation and/or using at least one stored and/or known relationship. Besides the at least one sensor signal, one or a plurality of further parameters and/or items of information can influence said relationship, for example at least one item of information about a modulation frequency. In this case, the relationship can be determined or determinable empirically, analytically or else semi-empirically. Particularly preferably, the relationship comprises at least one calibration curve, at least one set of calibration curves, at least one function or a combination of the possibilities mentioned. One or a plurality of calibration curves can be stored for example in the form of a set of values and the associated function values thereof, for example in a data storage device and/or a table. Alternatively or additionally, however, the at least one calibration curve can also be stored for example in parameterized form and/or as a functional equation. Various possibilities are conceivable and can also be combined.

By way of example, the evaluation device can be designed in terms of programming for the purpose of determining the at least one item of geometrical information. The evaluation device can comprise in particular at least one computer, for example at least one microcomputer. Furthermore, the evaluation device can comprise one or a plurality of volatile or nonvolatile data memories. As an alternative or in addition to a data processing device, in particular at least one computer, the evaluation device can comprise one or a plurality of further electronic components which are designed for determining the at least one item of geometrical information using the at least one sensor signal, for example an electronic table and in particular at least one look-up table and/or at least one application-specific integrated circuit (ASIC).

The geometrical information allows a multiplicity of possible uses of such detectors, which will be described by way of example hereinafter. By way of example, as is explained in even greater detail below, at least one item of location information of the object can be generated from said geometrical information, or the geometrical information can comprise the at least one item of location information, since for example a geometry of the illumination, for example a diameter or equivalent diameter of the light spot on the sensor area, can be dependent on a distance between the object and the detector and/or the optional transfer device of the detector, for example at least one detector lens. By way of example, a variation of the distance between the object and a lens of the optional transfer device can lead to a defocusing of the illumination on the sensor region, accompanied by a change in the geometry of the illumination, for example a widening of a light spot, which can result in a correspondingly altered sensor signal. Even without a transfer device, by way of example, from a known beam profile from the sensor signal and/or a variation thereof, for example, by means of a known beam profile and/or a known propagation of the electromagnetic rays, it is possible to deduce a defocusing and/or the geometrical information. By way of example, given a known total power of the illumination, it is thus possible to deduce from the sensor signal of the optical sensor a geometry of the illumination and therefrom in turn the geometrical information, in particular at least one item of location information of the object.

Preferably, at least two sensor signals are detected. If the total power of the illumination is not known, for example, then for example at least two sensor signals can be generated, for example at least two sensor signals at different frequencies of a modulation of the illumination, wherein, from the at least two sensor signals, for example by comparison with corresponding calibration curves, it is possible to deduce the total power and/or the geometry of the illumination, and/or therefrom or directly the at least one item of geometrical information, in particular the at least one item of location information, of the object. In any case, the detector can thus be designed to generate, in particular on the basis of the effect described, the at least one item of geometrical information, which preferably goes beyond pure information about the total power of the illumination.

The detector described can advantageously be developed in various ways. Thus, the detector can furthermore have at least one modulation device for modulating the illumination, in particular for periodic modulation, in particular a periodic beam interrupting device. A modulation of the illumination should be understood to mean a process in which a total power of the illumination is varied, preferably periodically, in particular with one or a plurality of modulation frequencies. In particular, a periodic modulation can be effected between a maximum value and a minimum value of the total power of the illumination. The minimum value can be 0, but can also be >0, such that, by way of example, complete modulation does not have to be effected. The modulation can be effected for example in a beam path between the object and the optical sensor, for example by the at least one modulation device being arranged in said beam path. Alternatively or additionally, however, the modulation can also be effected in a beam path between an optional illumination source—described in even greater detail below—for illuminating the object and the object, for example by the at least one modulation device being arranged in said beam path. A combination of these possibilities is also conceivable. The at least one modulation device can comprise for example a beam chopper or some other type of periodic beam interrupting device, for example comprising at least one interrupter blade or interrupter wheel, which preferably rotates at constant speed and which can thus periodically interrupt the illumination. Alternatively or additionally, however, it is also possible to use one or a plurality of different types of modulation devices, for example modulation devices based on an electro-optical effect and/or an acousto-optical effect. Once again alternatively or additionally, the at least one optional illumination source itself can also be designed to generate a modulated illumination, for example by said illumination source itself having a modulated intensity and/or total power, for example a periodically modulated total power, and/or by said illumination source being embodied as a pulsed illumination source, for example as a pulsed laser. Thus, by way of example, the at least one modulation device can also be wholly or partly integrated into the illumination source. Various possibilities are conceivable.

The detector can be designed in particular to detect at least two sensor signals in the case of different modulations, in particular at least two sensor signals at respectively different modulation frequencies. The evaluation device can be designed to generate the geometrical information from the at least two sensor signals. As described above, in this way, by way of example, it is possible to resolve ambiguities and/or it is possible to take account of the fact that, for example, a total power of the illumination is generally unknown.

Further possible embodiments of the detector relate to the embodiment of the at least one optional transfer device. As explained above, said at least one transfer device can have imaging properties or else can be embodied as a pure non-imaging transfer device, which has no influence on a focusing of the illumination. It is particularly preferred, however, if the transfer device has at least one imaging element, for example at least one lens and/or at least one curved mirror, since, in the case of such imaging elements, for example, a geometry of the illumination on the sensor region can be dependent on a relative positioning, for example a distance, between the transfer device and the object. Generally, it is particularly preferred if the transfer device is designed in such a way that the electromagnetic radiation which emerges from the object is transferred completely to the sensor region, for example is focused completely onto the sensor region, in particular the sensor area, in particular if the object is arranged in a visual range of the detector.

As explained above, the optical sensor can furthermore be designed in such a way that the sensor signal, given the same total power of the illumination, is dependent on a modulation frequency of a modulation of the illumination. The detector can be embodied, in particular, as explained above, in such a way that sensor signals at different modulation frequencies are picked up, for example in order to generate one or a plurality of further items of information about the object. As described above, by way of example, a sensor signal at least two different modulation frequencies can in each case be picked up, wherein, by way of example, in this way, a lack of information about a total power of the illumination can be supplemented. By way of example, by comparing the at least two sensor signals picked up at different modulation frequencies with one or a plurality of calibration curves, which can be stored for example in a data storage device of the detector, even in the case of an unknown total power of the illumination, it is possible to deduce a geometry of the illumination, for example a diameter or an equivalent diameter of a light spot on the sensor area. For this purpose, by way of example, it is possible to use the at least one evaluation device described above, for example at least one data processing data, which can be designed to control such picking-up of sensor signals at different frequencies and which can be designed to compare said sensor signals with the at least one calibration curve in order to generate therefrom the geometrical information, for example information about a geometry of the illumination, for example information about a diameter or equivalent diameter of a light spot of the illumination on a sensor area of the optical sensor. Furthermore, as is explained in even greater detail below, the evaluation device can alternatively or additionally be designed to generate at least one item of geometrical information about the object, for example at least one item of location information. This generation of the at least one item of geometrical information, as explained above, can be effected for example taking account of at least one known relationship between a positioning of the object relative to the detector and/or the transfer device or a part thereof and a size of a light spot, for example empirically, semi-empirically or analytically using corresponding imaging equations.

In contrast to known detectors, in which a spatial resolution and/or imaging of objects is also generally tied to the fact that the smallest possible sensor areas are used, for example the smallest possible pixels in the case of CCD chips, the sensor region of the proposed detector can be embodied in a very large fashion, in principle, since for example the geometrical information, in particular the at least one item of location information, about the object can be generated from a known relationship for example between the geometry of the illumination and the sensor signal. Accordingly, the sensor region can have for example a sensor area, for example an optical sensor area, which is at least $0.001$ $mm^2$, in particular at least $0.01$ $mm^2$, preferably at least $0.1$ $mm^2$, more preferably at least $1$ $mm^2$, more preferably at least $5$ $mm^2$, more preferably at least $10$ $mm^2$, in particular at least $100$ $mm^2$ or at least $1000$ $mm^2$ or even at least $10\,000$ $mm^2$. In particular, sensor areas of $100$ $cm^2$ or more can be used. The sensor area can generally be adapted to the application. In particular, the sensor area should be chosen in such a way that, at least if the object is situated within a visual range of the detector, preferably within a predefined viewing angle and/or a predefined distance from the detector, the light spot is always arranged within the sensor area. In this way, it can be ensured that the light spot is not trimmed by the limits of the sensor region, as a result of which signal corruption could occur.

As described above, the sensor region can be in particular a continuous sensor region, in particular a continuous sensor area, which can preferably generate a uniform, in particular a single, sensor signal. Consequently, the sensor signal can be in particular a uniform sensor signal for the entire sensor region, that is to say a sensor signal to which each partial region of the sensor region contributes, for example additively. The sensor signal can generally, as explained above, in particular be selected from the group consisting of a photocurrent and a photovoltage.

The optical sensor can comprise in particular at least one semiconductor detector and/or be at least one semiconductor detector. In particular, the optical sensor can comprise at least one organic semiconductor detector or be at least one organic semiconductor detector, that is to say a semiconductor detector comprising at least one organic semiconducting material and/or at least one organic sensor material, for example at least one organic dye. Preferably, the organic semiconductor detector can comprise at least one organic solar cell and particularly preferably a dye solar cell, in particular a solid dye solar cell. Exemplary embodiments of such preferred solid dye solar cells are explained in even greater detail below.

In particular, the optical sensor can comprise at least one first electrode, at least one n-semiconducting metal oxide, at least one dye, at least one p-semiconducting organic material, preferably at least one solid p-semiconducting organic material, and at least one second electrode. Generally, however, it is pointed out that the described effect in which the sensor signal, given a constant total power, is dependent on a geometry of the illumination of the sensor region is with high probability not restricted to organic solar cells and in particular not to dye solar cells. Without intending to restrict the scope of protection of the invention by this theory, and without the invention being bound to the correctness of this theory, it is supposed that generally photovoltaic elements are suitable as optical sensors in which at least one semiconducting material having trap states is used. Consequently, the optical sensor can comprise at least one n-semiconducting material and/or at least one p-semiconducting material which can have for example a conduction band and a valence band, wherein, in the case of organic materials, conduction band and valence band should correspondingly be replaced by LUMO (lowest unoccupied molecular orbital) and HOMO (highest occupied molecular orbital). Trap states should be understood to mean energetically possible states which are disposed between the conduction band (or LUMO) and the valence band (or HOMO) and which can be occupied by charge carriers. By way of example, it is possible to provide trap states for hole conduction which are disposed at least one distance $\Delta E_h$ above the valence band (or HOMO) and/or trap states for electron conduction which are disposed at least one distance $\Delta E_e$ below the conduction band (or LUMO). Such traps can be achieved for example by impurities and/or defects, which can optionally also be introduced in a targeted manner, or can be present intrinsically. By way of example, in the case of a low intensity, that is to say for example in the case of a light spot having a large diameter, only a low current can flow, since firstly the trap states are occupied before holes in the conduction band or electrons in the valence band contribute to a photocurrent. It is only starting from a higher intensity, that is to say for example starting from a more intense focusing of the light spot in the sensor region, that a considerable photocurrent can then flow. The described frequency dependence can be explained for example by the fact that charge carriers leave the traps again after a residence duration $\tau$, such that the described effect occurs only in the case of modulated illumination with a high modulation frequency. By way of example, the detector can be designed to bring about a modulation of the illumination of the sensor region with a frequency of at least 1 Hz, preferably at least 10 Hz, in particular at least 100 Hz and particularly preferably at least 1 kHz. The trap states can be present for example with a density of $10^{-5}$ to $10^{-1}$, relative to the n-semiconducting material and/or the p-semiconducting material and/or the dye. The energy differences $\Delta E$ with respect to the conduction band and with respect to the valence band can be in particular 0.05-0.3 eV.

The detector has, as described above, at least one evaluation device. In particular, the at least one evaluation device can also be designed to completely or partly control or drive the detector, for example by the evaluation device being designed to control one or a plurality of modulation devices of the detector and/or to control at least one illumination source of the detector. The evaluation device can be designed, in particular, to carry out at least one measurement cycle in which one or a plurality of sensor signals are picked up, for example a plurality of sensor signals successively at different modulation frequencies of the illumination.

The evaluation device is designed, as described above, to generate the at least one item of geometrical information from the at least one sensor signal. The at least one item of geometrical information can, in particular, as explained above, comprise at least one item of location information of the object and/or can be at least one item of location information of the object. In this case, an item of location information should generally be understood to mean an item of information which is adapted and/or suited to characterize at least one location and/or at least one orientation of the object or of a part of the object, for example of a region of the object, from which the electromagnetic radiation emerges. Said at least one item of location information can be static, that is to say can comprise for example a single item of location information or a plurality of items of location information which are picked up at the same time, but can, alternatively or additionally, also comprise a plurality of items of location information which are picked up at different times. By way of example, in this way, the at least one item of location information can also comprise at least one item of information about at least one movement, for example a relative movement between the detector or parts thereof and the object or parts thereof. In this case, a relative movement can generally comprise at least one linear movement and/or at least one rotational movement. Items of movement information can for example also be obtained by comparison of at least two items of location information picked up at different times, such that for example at least one item of location information can also comprise at least one item of velocity information and/or at least one item of acceleration information, for example at least one item of information about at least one relative velocity between the object or parts thereof and the detector or parts thereof. In particular, the at least one item of location information can generally be selected from: an item of information about a distance between the object or parts thereof and the detector or parts thereof, in particular an optical path length; an item of information about a distance or an optical distance between the object or parts thereof and the optional transfer device or parts thereof; an item of information about a positioning of the object or parts thereof relative to the detector or parts thereof; an item of information about an orientation of the object and/or parts thereof relative to the detector or parts thereof; an item of information about a relative movement between the object or parts thereof and the detector or parts thereof; an item of information about a two-dimensional or three-dimensional spatial configuration of the object or of parts thereof, in particular a geometry or form of the object. Generally, the at least one item of location information can therefore be selected for example from the group consisting of: an item of information about at least one location of the object or at least one part thereof; information about at least one orientation of the object or a part thereof; an item of information about a geometry or form of the object or of a part thereof, an item of information about a velocity of the object or of a part thereof, an item of information about an acceleration of the object or of a part thereof, an item of information about a presence or absence of the object or of a part thereof in a visual range of the detector.

The at least one item of location information can be specified for example in at least one coordinate system, for example a coordinate system in which the detector or parts thereof rest. Alternatively or additionally, the location information can also simply comprise for example a distance between the detector or parts thereof and the object or parts thereof. Combinations of the possibilities mentioned are also conceivable.

The evaluation device can, as explained above, in particular be designed to determine the geometrical information from at least one predefined relationship between the geometry of the illumination, for example a diameter or equivalent diameter of a luminous spot on the sensor region and/or the sensor area, and a relative positioning of the object with respect to the detector, for example a distance and/or an optical path length between object and detector, preferably taking account of a known power of the illumination and optionally taking account of a modulation frequency with which the illumination is modulated. By way of example, the evaluation device can comprise at least one data storage device in which is stored a predefined relationship between a distance between detector and object and a geometry of the illumination, for example a diameter or equivalent diameter of a luminous spot on the sensor region. Said relationship can be stored for example in discrete fashion or continuously or else in the form of a function. By way of example, said relationship can comprise at least one calibration function. The relationship can for example also be stored in an electronic table, for example a so-called look-up table. If a power of the illumination is not known, then, as explained above, for example the evaluation device can be designed to pick up sensor signals at least two different modulation frequencies of the illumination. Generally, the evaluation device can be designed for example to deduce in one or a plurality of steps, firstly, for example, from the at least one sensor signal, the geometry of the illumination, for example a diameter or equivalent diameter of a luminous spot on the sensor region or the sensor area. Furthermore, the evaluation device can be designed to deduce the at least one item of geometrical information from this determined geometry, preferably taking account of the modulation frequency. These two deductions can also be combined in one step, such that, by way of example, the evaluation device can be designed to directly deduce the geometrical information, in particular the location information, from the at least one sensor signal. Examples of such relationships by means of which the evaluation device can generate the at least one item of geometrical information are explained in even greater detail below, including possible calibration curves. In particular in the case of a relationship between the geometry of the illumination and the geometrical information, in this case it is also possible to use analytical or semi-empirical models, for example imaging equations. Thus, by way of example, the illumination can be effected by means of one or a plurality of Gaussian beams, wherein for example the at least one item of geometrical information can be generated by the beam geometry and the Gaussian beam parameters of the illumination, for example by means of corresponding optical matrix calculations. By way of example, imaging parameters of the optional transfer device can be known, for example one or a plurality of focal lengths of one or a plurality of lenses and/or curved mirrors of the transfer device, such that, by way of example, a relationship between a positioning of the object relative to the transfer device and a geometry of the illumination of the sensor region, for example a diameter or equivalent diameter of the luminous spot, can be calculated. By way of example, Gaussian matrix optics and/or some other form of an imaging equation can be used for this purpose.

As explained above, the detector can furthermore comprise at least one illumination source for generating electromagnetic rays. The illumination source can be designed in particular to bring about the illumination of the sensor region. Thus, the illumination source can be designed for example to generate a primary radiation with which the object or a part of the object is irradiated, whereupon the electromagnetic radiation emerges from the object and is transferred to the optical sensor and the sensor region thereof, for example by means of the at least one optional transfer device. As explained above, the electromagnetic radiation by means of which the sensor region is illuminated can comprise for example the primary radiation in reflected or scattered form. Alternatively or additionally, however, for example an influencing of the primary radiation can also be effected, for example a spectral shift and/or a process in which the primary radiation emitted by the illumination source excites the object or a part thereof to emit the electromagnetic radiation, for example by excitation of luminescence.

The illumination source can be embodied in various ways. Thus, the illumination source can be for example part of the detector in a detector housing. Alternatively or additionally, however, the at least one illumination source can also be arranged outside a detector housing, for example as a separate light source. The illumination source can be arranged separately from the object and illuminate the object from a distance. Alternatively or additionally, the illumination source can also be connected to the object or even be part of the object, such that, by way of example, the electromagnetic radiation emerging from the object can also be generated directly by the illumination source. By way of example, at least one illumination source can be arranged on and/or in the object and directly generate the electromagnetic radiation by means of which the sensor region is illuminated. By way of example, at least one infrared emitter and/or at least one emitter for visible light and/or at least one emitter for ultraviolet light can be arranged on the object. By way of example, at least one light emitting diode and/or at least one laser diode can be arranged on and/or in the object. The illumination source can comprise in particular one or a plurality of the following illumination sources: a laser, in particular a laser diode, although in principle, alternatively or additionally, other types of lasers can also be used; a light emitting diode; an incandescent lamp; an organic light source, in particular an organic light emitting diode. Alternatively or additionally, other illumination sources can also be used. It is particularly preferred if the illumination source is designed to generate electromagnetic beams having a Gaussian beam profile, as is at least approximately the case for example in many lasers. However, other embodiments are also possible, in principle.

Furthermore, it should be noted that the optional transfer device described above can be embodied independently of the optional at least one illumination source. Alternatively or additionally, however, the at least one transfer device can also already be wholly or partly integrated into the illumination source or be wholly or partly identical to said illumination source. Thus, the illumination source itself can already be designed to feed the electromagnetic radiation to the sensor region, for example by a corresponding orientation toward the sensor region and/or by a focusing and/or a corresponding beam profile. By way of example, the illumination source can comprise at least one laser which can already generate at least one laser beam having a known beam profile, for example a Gaussian beam profile, such that, by way of example, it is possible to dispense with beam shaping by one or a plurality of lens systems, since, by way of example, from corresponding equations a propagation of Gaussian beams, from a known beam geometry upon identification of a geometry of the illumination on the sensor region, for example a diameter or equivalent diameter of a luminous spot on the sensor region, a distance between the illumination source and the detector and/or the object and the detector can be deduced. Alternatively or additionally, however, the transfer device can comprise one or a plurality of additional imaging elements, for example one or a plurality of lenses and/or objectives. Alternatively or additionally, by way of example, one or a plurality of deflection elements can be included, for example one or a plurality of mirrors and/or one or a plurality of prisms.

Generally, therefore, as already mentioned above, the illumination source can in particular be selected in particular from an illumination source which is at least partly connected to the object and/or is at least partly identical to the object, and an illumination source which is designed to at least partly illuminate the object. Various other embodiments are possible and are described in even greater detail below by way of example.

The detector can therefore comprise at least one illumination source. The illumination source can be designed in particular to illuminate the object with at least one primary radiation. Said at least one primary radiation can comprise electromagnetic radiation, for example light, but can, alternatively or additionally, also comprise at least one radiation of a different type, for example a particle radiation. The electromagnetic radiation which emerges from the object and which is fed to the optical sensor and illuminates the sensor region in the process can, as already described in part above, comprise in particular a reflected radiation, wherein the reflected radiation can comprise at least part of the primary radiation after reflection at the object. Alternatively or additionally, the electromagnetic radiation emerging from the object can also comprise at least one scattered radiation, wherein the scattered radiation comprises at least one part of the primary radiation after scattering at the object. As explained above, this scattering can be effected without spectral properties being influenced or else with spectral properties being influenced. Once again alternatively or additionally, the electromagnetic radiation emerging from the object can also comprise at least one luminescent radiation which is excited by the primary radiation. Said luminescent radiation can comprise for example a fluorescent radiation and/or a phosphorus radiation. Other possibilities for the embodiment of the electromagnetic radiation which emerges from the object, or combinations of the stated and/or other possibilities, are also conceivable.

A further aspect of the present invention proposes a distance measuring device, in particular for use in a motor vehicle. In this case, a distance measuring device should be understood to mean a device which is designed to generate at least one item of location information of at least one object, for example relative to the distance measuring device itself. As explained above, said at least one item of location information can comprise for example a simple distance between the distance measuring device and the object, but can also generally comprise at least one item of information about a positioning of the object relative to the distance measuring device, for example a spatial positioning in at least one coordinate system and/or an orientation of the object in at least one coordinate system. For further embodiments of the at least one item of location information, reference can be made to the above description.

The proposed distance measuring device accordingly comprises at least one detector in accordance with one or a plurality of the embodiments described above, wherein the detector is designed to determine at least one item of geometrical information of at least one object, wherein the geometrical information comprises at least one item of location information of the object, in particular a distance between a motor vehicle and at least one object and preferably a distance between the motor vehicle and at least one object selected from the group consisting of a further motor vehicle, an obstacle, a cyclist and a pedestrian. In particular, the detector can be completely or partly integrated in one or a plurality of motor vehicles and can be designed to determine a distance between a motor vehicle and at least one object, for example a distance between two motor vehicles and/or a distance between the motor vehicle and at least one object selected from the group consisting of a further motor vehicle, an obstacle, a cyclist, a pedestrian or some other kind of traffic participant. The detector can be for example completely integrated into the motor vehicle, but can also be arranged for example in a manner distributed over a plurality of motor vehicles. By way of example, as is explained in even greater detail below by way of example, the distance measuring device can comprise at least one detector and at least one illumination source, wherein, by way of example, the at least one illumination source is arranged on a rear side of a first motor vehicle, and the detector is arranged on a front side of at least one second motor vehicle, such that, by way of example, a distance between a front side of the second motor vehicle and a rear side of the first motor vehicle can be determined. Alternatively or additionally, at least one illumination source and at least one detector can also be integrated into one and the same motor vehicle, for example on a front side and/or a rear side of the motor vehicle. Thus, by way of example, the illumination source can be designed to illuminate a motor vehicle ahead and/or a following motor vehicle with primary radiation, and the detector can be designed to detect the electromagnetic radiation emerging from said motor vehicle, as described above, and to generate the location information therefrom.

A further aspect of the present invention proposes an imaging device for imaging at least one sample. In this case, an imaging device should generally be understood to mean a device which can generate a one-dimensional, a two-dimensional or a three-dimensional image of the sample or of a part of said sample.

In particular, the imaging device can be completely or partly used as a microscope. Preferably, the image device is designed for confocal imaging, that is to say has a confocal construction, or is designed as a confocal microscope. Other embodiments of the imaging device are also possible in principle, however, and are described in even greater detail below by way of example.

The imaging device has at least one detector in accordance with one or more of the embodiments described above. The imaging device is furthermore designed to image a plurality of partial regions of the sample successively or simultaneously onto the at least one sensor region of the detector. In this case, by way of example, a partial region of the sample can be a one-dimensional, two-dimensional or three-dimensional region of the sample which is delimited for example by a resolution limit of the imaging device and from which electromagnetic radiation emerges, which, on the sensor region of the detector, leads to an illumination, for example a common luminous spot, in particular on a sensor area. The plurality of partial regions can be imaged successively and/or simultaneously onto the at least one sensor region. In this context, imaging should be understood to mean that electromagnetic radiation of the sample emerging from the respective partial region is fed to the optical sensor, for example by means of the at least one optional transfer device of the detector.

With regard to the possible embodiments of the optional transfer device, reference can be made to the above description. In particular, the transfer device can have imaging properties and can comprise for example at least one imaging element, for example at least one lens and/or at least one curved mirror. In particular, the imaging device can be designed to image sequentially, for example by means of a scanning method, in particular using at least one row scan and/or line scan, the plurality of partial regions sequentially onto the sensor region. However, other embodiments are also possible, in principle, for example embodiments in which a plurality of partial regions are simultaneously imaged onto the at least one sensor region, for example by at least one sensor region being assigned to each partial region. By way of example, it is possible to use a detector having a plurality of sensor regions, for example in accordance with one or more of the embodiments described above.

The imaging device is designed to generate, during this imaging of the partial regions of the sample, sensor signals assigned to the partial regions. By way of example, a sensor signal can be assigned to each partial region. The sensor signals can accordingly be generated simultaneously or else in a temporally staggered manner. By way of example, during a row scan or line scan, it is possible to generate a sequence of sensor signals which correspond to the partial regions of the sample, which are strung together in a line, for example. The imaging device is designed to generate from the sensor signals items of geometrical information of the respective partial regions, wherein the items of geometrical information comprise items of location information.

With regard to the embodiment of the items of location information and the various possibilities for generating these items of location information, reference can be made to the above description. The electromagnetic rays emerging from the sample can once again be generated by the sample itself, for example in the form of a luminescent radiation. Alternatively or additionally, the imaging device or the at least one detector can also once again comprise at least one illumination source for illuminating the sample. For further possible embodiments of the imaging device, in particular for use in microscopy, reference can be made to the exemplary embodiments below.

A further aspect of the present invention proposes a human-machine interface for exchanging at least one item of information between a user and a machine. A human-machine interface should generally be understood to mean a device by means of which such information can be exchanged. The machine can comprise in particular a data processing device. The at least one item of information can generally comprise for example data and/or control commands. Thus, the human-machine interface can be designed in particular for the inputting of control commands by the user.

The human-machine interface has at least one detector in accordance with one or a plurality of the embodiments described above. The human-machine interface is designed to generate at least one item of geometrical information, in particular at least one item of location information, of the user by means of the detector. By way of example, said at least one item of geometrical information can be or comprise an item of location information about a body part of the user, for example an item of location information about a hand posture and/or a posture of some other body part of the user.

In this case, the term user should be interpreted broadly and can for example also encompass one or a plurality of articles directly influenced by the user. Thus, the user can for example also wear one or a plurality of gloves and/or other garments, wherein the geometrical information is at least one item of geometrical information of this at least one garment. By way of example, such garments can be embodied as reflective to a primary radiation emerging from at least one illumination source, for example by the use of one or a plurality of reflectors. Once again alternatively or additionally, the user can for example spatially move one or a plurality of articles whose geometrical information can be detected, which is likewise also intended to be subsumable under generation of at least one item of geometrical information of the user. By way of example, the user can move at least one reflective rod and/or some other type of article, for example by means of said user's hand.

With regard to the embodiment of the at least one item of geometrical information, in particular the at least one item of location information, reference can likewise once again be made to the above description. The at least one item of geometrical information can be static, that is to say can for example once again comprise a snapshot, but can also for example once again comprise a series of sequential items of geometrical information and/or at least one movement. By way of example, at least two items of geometrical information picked up at different times can be compared, such that, by way of example, the at least one item of geometrical information can also comprise at least one item of information about a velocity and/or an acceleration of a movement. Accordingly, the at least one item of geometrical information can for example comprise at least one item of information about at least one body posture and/or about at least one movement of the user.

The human-machine interface is designed to assign to the at least one item of geometrical information at least one item of information, in particular at least one control command. As explained above, the term information should in this case be interpreted broadly and can comprise for example data and/or control commands. By way of example, the human-machine interface can be designed to assign the at least one item of information to the at least one item of geometrical information, for example by means of a corresponding assignment algorithm and/or a stored assignment specification. By way of example, a unique assignment between a set of items of geometrical information and corresponding items of information can be stored. In this way, for example by means of a corresponding body posture and/or movement of the user, an inputting of at least one item of information can be effected.

Such human-machine interfaces can generally be used in the machine control or else for example in virtual reality. By way of example, robot controllers, vehicle controllers or similar controllers can be made possible by means of the human-machine interface having the one or the plurality of detectors. However, the use of such a human-machine interface in consumer electronics is particularly preferred. Accordingly, a further aspect of the present invention proposes an entertainment device for carrying out at least one entertainment function, in particular a game. The entertainment function can comprise in particular at least one game function. By way of example, one or a plurality of games can be stored which can be influencable by a user, who in this context is also called a player hereinafter. By way of example, the entertainment device can comprise at least one display device, for example at least one screen and/or at least one projector and/or at least one set of display spectacles.

The entertainment device furthermore comprises at least one human-machine interface in accordance with one or more of the embodiments described above. The entertainment device is designed to enable at least one item of information of a player to be input by means of the human-machine interface. By way of example, the player, as described above, can adopt or alter one or a plurality of body postures for this purpose. This includes the possibility of the player for example using corresponding articles for this purpose, for example garments such as e.g. gloves, for example garments which are equipped with one or a plurality of reflectors for reflecting the electromagnetic radiation of the detector. The at least one item of information can comprise for example, as explained above, one or a plurality of control commands. By way of example, in this way, changes in direction can be performed, inputs can be confirmed, a selection can be made from a menu, specific game options can be initiated, movements can be influenced in a virtual space or similar instances of influencing or altering the entertainment function can be performed.

A further aspect of the present invention proposes using the detector in a security device. As described above, by means of the detector, in particular the at least one evaluation device, it is possible to generate at least one item of geometrical information which preferably goes beyond a pure item of information about the total power of the illumination. Said at least one item of geometrical information can, inter alia, also be or comprise an item of information about the fact that an illumination has taken place or is taking place with a specific geometry, in particular an inhomogeneous illumination of the sensor region, in particular a focused illumination, for example an illumination in which at least one light spot is produced on a sensor area. The proposed security device is therefore based for example on the insight that, by means of the proposed detector, it is possible to identify if intensive electromagnetic radiation, for example a focused light beam and in particular a laser beam, impinges on an article comprising the detector. By way of example, in this way it can be identified that a read-out of optically readable data of an optical data storage device has been effected, for example of a CD-ROM, of a bar code or of some other type of data storage device.

Accordingly, a security device for carrying out at least one security application is proposed. A security device should generally be understood to mean a device which fulfils at least one security function, for example a function which recognizes an access to data and can optionally implement one or a plurality of corresponding measures according to the situation. A security function can generally be a function which recognizes an access to an article or data and optionally prevents it or at least makes it more difficult. The at least one security application can accordingly comprise in particular at least one application in the field of data protection. In particular, the at least one security application can be an application in which an access, in particular an unauthorized access, to data of an optical data storage device is recognized and/or avoided. The optical data storage device can comprise, in principle, any desired type of optical data storage device, for example one or a plurality of the optical data storage devices mentioned above.

The security device furthermore comprises at least one detector in accordance with one or more of the above-described claims relating to a detector. In this respect, it should be pointed out that, in accordance with the above description, the detector can optionally comprise the at least one transfer device. In the security device, such a transfer device is not absolutely necessary, since, by way of example, as described above, the electromagnetic radiation can also be focused by a laser and/or an external imaging device, for example at least one external lens.

Accordingly, the security device or the detector of said security device can also be embodied without such a transfer device, or the illumination source or parts thereof can be regarded as a transfer device or parts thereof. On the other hand, the transfer device can also be wholly or partly integrated into an illumination source, such that the security device can also be embodied in a multipartite fashion. By way of example, the transfer device, as described above, can be wholly or partly integrated into an illumination source, which can likewise be regarded as a constituent part of the security device, but which need not be formed integrally with the other parts of the security device, for example with the optical sensor of the detector of the security device.

The security device is furthermore designed to recognize, by means of the detector, impingement of focused electromagnetic rays onto the security device, in particular impingement of one or a plurality of laser beams, in particular focused laser beams. By way of example, the security device can comprise the at least one evaluation device for this purpose, as described above. By way of example, this recognition can be effected by virtue of the fact that the at least one sensor signal of the at least one detector is compared with at least one threshold value. While non-focused light can generate for example a sensor signal below said threshold value, for example focused light having the same total power which impinges on the sensor region can generate a sensor signal which reaches or exceeds the at least one threshold value. By way of example, a photocurrent or an absolute value of the photocurrent can be compared with said at least one threshold value. In this way, it is possible for example to recognize if at least one reading beam, for example a weak laser beam, is radiated in so as to read out optically readable data. Even if said reading beam is chosen, in terms of its total power, to be so weak that overall there impinges on the sensor region a total power which does not exceed for example the total power of ambient light, for example assuming an ambient light intensity of 1 to $1'10^5$ W/m$^2$, such a reading beam can be recognized by means of the at least one detector according to the invention. Focused electromagnetic rays can be understood to mean electromagnetic rays by means of which only a partial region of the sensor region of the detector is irradiated with a boosted intensity, for example only a light spot of less than 10 mm$^2$, in particular of less than 1 mm$^2$ and particularly preferably of less than 0.1 mm$^2$, although the focusing can be dependent on the application. For the definition of a light spot which can be for example a round, oval or else differently shaped light spot, reference can be made to the above description.

The security device can furthermore be designed, if impingement of such focused electromagnetic rays is recognized, to perform at least one security function or further security functions. By way of example, the security device, in particular the evaluation device, can be designed to generate at least one warning signal. Said at least one warning signal can comprise for example at least one signal, in particular selected from the group consisting of an acoustic signal, an electrical signal, an optical signal and a haptic signal. Alternatively or additionally, the warning signal can also comprise at least one variation of at least one state of at least one data storage device of the security device. By way of example, it is possible to use at least one data storage device with at least one read-out bit, wherein the at least one read-out bit can be changed over from a state "not read out" to a state "read out" by means of the at least one warning signal. Alternatively or additionally, however, the warning signal can also be designed for example to bring about, after recognition of impingement of focused electromagnetic rays, destruction of the security device and/or of the data storage device, such that only a single use is possible. The warning signal can for example also be output to a user and/or some other device.

The security device mentioned can be designed or applied in various ways. By way of example, the security device can be embodied as a security label, for example as a security label having at least one optical data storage device and the at least one detector. By way of example, in this way it is possible to prevent multiple uses of access authorizations, for example tickets for events, for example by virtue of a first read-out being identified and/or by virtue of especially a focus light beam being radiated onto the detector. Alternatively or additionally, however, the security device can also be integrated for example into an optical data storage device, such that it is possible to embody an optical data storage device with a security device of this type. The at least one security device can for example be embodied in such a way that the at least one sensor region of the at least one detector is arranged in direct spatial proximity to at least one optically readable data storage device, for example at least one data field of at least one optical ROM, and/or in direct proximity to a bar code and/or a holographic data storage device and/or as a constituent part thereof. In this way, it can be ensured, for example, that a reading beam by means of which data are read out optically from the data storage device inevitably also impinges on the sensor region of the detector. By way of example, a spatial distance between the sensor region and the data storage device region can be not more than 5 mm, in particular not more than 1 mm and particularly preferably not more than 0.1 mm.

A further aspect of the present invention proposes a method for optically detecting at least one object. The method can be effected in particular using a detector in accordance with one or more of the embodiments described above, such that, with regard to optional embodiments of the method, reference can be made to the above description of the detector. In the method, at least one optical sensor is used, wherein the optical sensor has at least one sensor region. Electromagnetic radiation emerging from the object is fed to the sensor, wherein the sensor region is illuminated. The optical sensor generates at least one sensor signal in a manner dependent on the illumination of the sensor region, wherein the sensor signal, given the same total power of the illumination, is dependent on a geometry of the illumination.

For further possible embodiments of the method, reference can be made to the above description. In particular, from the sensor signal it is possible to generate at least one item of geometrical information of the object, preferably at least one item of location information of the object, which preferably goes beyond a pure item of information about the total power of the illumination. For possible embodiments of this geometrical information, reference can be made to the above description. In particular, this geometrical information can comprise at least one item of location information of the object. With regard to possible embodiments of this location information, reference can likewise be made to the above description. The geometrical information can be determined in particular using at least one predefined relationship between the geometry of the illumination and a location of the object, preferably taking account of a known power of the illumination and/or taking account of a modulation frequency with which the illumination is modulated. In particular, therefore, the method can be embodied in such a way that the illumination is modulated, in particular is modulated periodically, with a modulation frequency which can be constant or else variable.

A further aspect of the present invention proposes a use of a detector in accordance with one or more of the embodiments described above for a purpose of use, which is selected from the group consisting of: distance measurement, in particular in traffic technology; imaging, in particular in microscopy; an entertainment application; a human-machine interface application; a security application. However, other uses of the detector are also possible, in principle.

A further aspect of the present invention proposes the use of an organic solar cell, in particular a dye solar cell and preferable a solid dye solar cell, as optical sensor, for example in a detector in accordance with one or more of the embodiments described above. In the use, at least one sensor signal is generated, wherein the sensor signal, given the same total power of an illumination of at least one sensor region of the optical sensor, is dependent on a geometry of the illumination on the organic solar cell, in particular a sensor area of the organic solar cell, wherein at least one item of geometrical information of at least one object is generated from the sensor signal in the use. For further possible embodiments of this use, reference can be made to the above description.

The above-described detector, the method, the distance measuring device, the imaging device, the human-machine interface, the entertainment device and the security device and also the proposed uses have considerable advantages over the prior art. Thus, in particular the outlay for object detection can be distinctly reduced by means of the proposed detector and by means of the proposed method. For distance measurements for example or other types of object detection, by way of example, technically complex propagation time measurements in which pulse propagation times of laser pulses are detected, for example, can be at least substantially avoided. In contrast to conventional imaging methods, it is possible in a simple manner, for example with erroneous assumptions being avoided, to generate items of geometrical information, in particular items of location information, about a detected object, without for example detectors having a high spatial resolution, for example a high number of pixels, being absolutely necessary for this purpose. By way of example, it is possible to use a detector having a comparatively large sensor area, for example in accordance with the embodiment described above, on which a light spot is produced by electromagnetic radiation emerging from the object. The sensor signal can be, in particular, independent of the position of said light spot on the sensor region, for example the sensor area, as long as said light spot is arranged completely within the sensor region. However, the detector can be designed to deduce from the focusing of the electromagnetic rays, for example from a diameter or equivalent diameter of the light spot on the sensor area, the at least one item of geometrical information, for example the distance between the object and the detector. Such an application can be realized technically in an extremely simple manner. Furthermore, it is possible to use cost-effective optical sensors, in particular large-area optical sensors, which can be producible for example using one or a plurality of organic materials. In particular, it is possible to use solar cells, for example organic solar cells and in particular dye solar cells, which are produced as mass-produced products in photovoltaics. In this way, for the detector proposed, a multiplicity of new fields of application open up which were withheld from previous detectors in many cases on account of their high costs, such as, for example, applications in disposable articles or data storage devices.

As explained above, the optical sensor can comprise in particular an organic semiconductor detector, particularly preferably a dye solar cell. In particular, the optical sensor can comprise at least one first electrode, at least one n-semiconducting metal oxide, at least one dye, at least one p-semiconducting organic material and at least one second electrode, preferably in the stated order. The stated elements can be present as layers in a layer construction, for example. The layer construction can be applied for example to a substrate, preferably a transparent substrate, for example a glass substrate.

Preferred embodiments of the abovementioned elements of the preferred optical sensor are described below by way of example, wherein these embodiments can be used in any desired combination. However, numerous other configurations are also possible, in principle, wherein reference can be made for example to US 2007/0176165 A1, U.S. Pat. No. 6,995,445 B2, DE 2501124 A1, DE 3225372 A1 and WO 2009/013282 A1 cited above.

First Electrode and N-Semiconductive Metal Oxide

The n-semiconductive metal oxide used in the dye solar cell may be a single metal oxide or a mixture of different oxides. It is also possible to use mixed oxides. The n-semiconductive metal oxide may especially be porous and/or be used in the form of a nanoparticulate oxide, nanoparticles in this context being understood to mean particles which have an average particle size of less than 0.1 micrometer. A nanoparticulate oxide is typically applied to a conductive substrate (i.e. a carrier with a conductive layer as the first electrode) by a sintering process as a thin porous film with large surface area.

The substrate may be rigid or else flexible. Suitable substrates (also referred to hereinafter as carriers) are, as well as metal foils, in particular plastic sheets or films and especially glass sheets or glass films. Particularly suitable electrode materials, especially for the first electrode according to the above-described, preferred structure, are conductive materials, for example transparent conductive oxides (TCOs), for example fluorine- and/or indium-doped tin oxide (FTO or ITO) and/or aluminum-doped zinc oxide (AZO), carbon nanotubes or metal films. Alternatively or additionally, it would, however, also be possible to use thin metal films which still have a sufficient transparency. The substrate can be covered or coated with these conductive materials. Since generally only a single substrate is required in the structure proposed, the formation of flexible cells is also possible. This enables a multitude of end uses which would be achievable only with difficulty, if at all, with rigid substrates, for example use in bank cards, garments, etc.

The first electrode, especially the TCO layer, may additionally be covered or coated with a solid metal oxide buffer layer (for example of thickness 10 to 200 nm), in order to prevent direct contact of the p-type semiconductor with the TCO layer (see Peng et al., Coord. Chem. Rev. 248, 1479 (2004)). The inventive use of solid p-semiconducting electrolytes, in the case of which contact of the electrolyte with the first electrode is greatly reduced compared to liquid or gel-form electrolytes, however, makes this buffer layer unnecessary in many cases, such that it is possible in many cases to dispense with this layer, which also has a current-limiting effect and can also worsen the contact of the n-semiconducting metal oxide with the first electrode. This enhances the efficiency of the components. On the other hand, such a buffer layer can in turn be utilized in a controlled manner in order to match the current component of the dye solar cell to the current component of the organic solar cell. In addition, in the case of cells in which the buffer layer has been dispensed with, especially in solid cells, problems frequently occur with unwanted recombinations of charge carriers. In this respect, buffer layers are advantageous in many cases specifically in solid cells.

As is well known, thin layers or films of metal oxides are generally inexpensive solid semiconductor materials (n-type semiconductors), but the absorption thereof, due to large bandgaps, is typically not within the visible region of the electromagnetic spectrum, but rather usually in the ultraviolet spectral region. For use in solar cells, the metal oxides therefore generally, as is the case in the dye solar cells, have to be combined with a dye as a photosensitizer, which absorbs in the wavelength range of sunlight, i.e. at 300 to 2000 nm, and, in the electronically excited state, injects electrons into the conduction band of the semiconductor. With the aid of a solid p-type semiconductor used additionally in the cell as an electrolyte, which is in turn reduced at the counterelectrode, electrons can be recycled to the sensitizer, such that it is regenerated.

Of particular interest for use in organic solar cells are the semiconductors zinc oxide, tin dioxide, titanium dioxide or mixtures of these metal oxides. The metal oxides can be used in the form of nanocrystalline porous layers. These layers have a large surface area which is coated with the dye as a sensitizer, such that a high absorption of sunlight is achieved. Metal oxide layers which are structured, for example nanorods, give advantages such as higher electron mobilities or improved pore filling by the dye.

The metal oxide semiconductors can be used alone or in the form of mixtures. It is also possible to coat a metal oxide with one or more other metal oxides. In addition, the metal oxides may also be applied as a coating to another semiconductor, for example GaP, ZnP or ZnS.

Particularly preferred semiconductors are zinc oxide and titanium dioxide in the anatase polymorph, which is preferably used in nanocrystalline form.

In addition, the sensitizers can advantageously be combined with all n-type semiconductors which typically find use in these solar cells. Preferred examples include metal oxides used in ceramics, such as titanium dioxide, zinc oxide, tin(IV) oxide, tungsten(VI) oxide, tantalum(V) oxide, niobium(V) oxide, cesium oxide, strontium titanate, zinc stannate, complex oxides of the perovskite type, for example barium titanate, and binary and ternary iron oxides, which may also be present in nanocrystalline or amorphous form.

Due to the strong absorption that customary organic dyes and phthalocyanines and porphyrins have, even thin layers or films of the n-semiconducting metal oxide are sufficient to absorb the required amount of dye. Thin metal oxide films in turn have the advantage that the probability of unwanted recombination processes falls and that the internal resistance of the dye subcell is reduced. For the n-semiconducting metal oxide, it is possible with preference to use layer thicknesses of 100 nm up to 20 micrometers, more preferably in the range between 500 nm and approx. 3 micrometers.

Dye

In the context of the present invention, as usual in particular for DSCs, the terms "dye", "sensitizer dye" and "sensitizer" are used essentially synonymously without any restriction of possible configurations. Numerous dyes which are usable in the context of the present invention are known from the prior art, and so, for possible material examples, reference may also be made to the above description of the prior art regarding dye solar cells. All dyes listed and claimed may in principle also be present as pigments. Dye-sensitized solar cells based on titanium dioxide as a semiconductor material are described, for example, in U.S. Pat. No. 4,927,721, Nature 353, p. 737-740 (1991) and U.S. Pat. No. 5,350,644, and also Nature 395, p. 583-585 (1998) and EP-A-1 176 646. The dyes described in these documents can in principle also be used advantageously in the context of the present invention. These dye solar cells preferably comprise monomolecular films of transition metal complexes, especially ruthenium complexes, which are bonded to the titanium dioxide layer via acid groups as sensitizers.

Not least for reasons of cost, sensitizers which have been proposed repeatedly include metal-free organic dyes, which are likewise also usable in the context of the present invention. High efficiencies of more than 4%, especially in solid dye solar cells, can be achieved, for example, with indoline dyes (see, for example, Schmidt-Mende et al., Adv. Mater. 2005, 17, 813). U.S. Pat. No. 6,359,211 describes the use, also implementable in the context of the present invention, of cyanine, oxazine, thiazine and acridine dyes which have carboxyl groups bonded via an alkylene radical for fixing to the titanium dioxide semiconductor.

Organic dyes now achieve efficiencies of almost 12.1% in liquid cells (see, for example, P. Wang et al, ACS. Nano 2010).

Pyridinium-containing dyes have also been reported, can be used in the context of the present invention and exhibit promising efficiencies.

Particularly preferred sensitizer dyes in the dye solar cell proposed are the perylene derivatives, terrylene derivatives and quaterrylene derivatives described in DE 10 2005 053 995 A1 or WO 2007/054470 A1. The use of these dyes, which is also possible in the context of the present invention, leads to photovoltaic elements with high efficiencies and simultaneously high stabilities.

The rylenes exhibit strong absorption in the wavelength range of sunlight and can, depending on the length of the conjugated system, cover a range from about 400 nm (perylene derivatives I from DE 10 2005 053 995 A1) up to about 900 nm (quaterrylene derivatives I from DE 10 2005 053 995 A1). Rylene derivatives I based on terrylene absorb, according to the composition thereof, in the solid state adsorbed onto titanium dioxide, within a range from about 400 to 800 nm. In order to achieve very substantial utilization of the incident sunlight from the visible into the near infrared region, it is advantageous to use mixtures of different rylene derivatives I. Occasionally, it may also be advisable also to use different rylene homologs.

The rylene derivatives I can be fixed easily and in a permanent manner to the n-semiconducting metal oxide film. The bonding is effected via the anhydride function (x1) or the carboxyl groups —COOH or —COO— formed in situ, or via the acid groups A present in the imide or condensate radicals ((x2) or (x3)). The rylene derivatives I described in DE 10 2005 053 995 A1 have good suitability for use in dye-sensitized solar cells in the context of the present invention.

It is particularly preferred when the dyes, at one end of the molecule, have an anchor group which enables the fixing thereof to the n-type semiconductor film. At the other end of the molecule, the dyes preferably comprise electron donors Y which facilitate the regeneration of the dye after the electron release to the n-type semiconductor, and also prevent recombination with electrons already released to the semiconductor.

For further details regarding the possible selection of a suitable dye, it is possible, for example, again to refer to DE 10 2005 053 995 A1. By way of example, it is possible especially to use ruthenium complexes, porphyrins, other organic sensitizers, and preferably rylenes.

The dyes can be fixed onto or into the n-semiconducting metal oxide films in a simple manner. For example, the n-semiconducting metal oxide films can be contacted in the freshly sintered (still warm) state over a sufficient period (for example about 0.5 to 24 h) with a solution or suspension of the dye in a suitable organic solvent. This can be accomplished, for example, by immersing the metal oxide-coated substrate into the solution of the dye.

If combinations of different dyes are to be used, they may, for example, be applied successively from one or more solutions or suspensions which comprise one or more of the dyes. It is also possible to use two dyes which are separated by a layer of, for example, CuSCN (on this subject see, for example, Tennakone, K. J., Phys. Chem. B. 2003, 107, 13758). The most convenient method can be determined comparatively easily in the individual case.

In the selection of the dye and of the size of the oxide particles of the n-semiconducting metal oxide, the organic solar cell should be configured such that a maximum amount of light is absorbed. The oxide layers should be structured such that the solid p-type semiconductor can efficiently fill the pores. For instance, smaller particles have greater surface areas and are therefore capable of adsorbing a greater amount of dyes. On the other hand, larger particles generally have larger pores which enable better penetration through the p-conductor.

P-Semiconducting Organic Material

As described above, the optical sensor can comprise in particular at least one p-semiconducting organic material, preferably at least one solid p-semiconducting material, which is also designated hereinafter as p-type semiconductor or p-type conductor. Hereinafter a description is given of a series of preferred examples of such organic p-type semiconductors which can be used individually or else in any desired combination, for example in a combination of a plurality of layers with a respective p-type semiconductor, and/or in a combination of a plurality of p-type semiconductors in one layer.

In order to prevent recombination of the electrons in the n-semiconducting metal oxide with the solid p-conductor, it is possible to use, between the n-semiconducting metal oxide and the p-type semiconductor, at least one passivating layer which has a passivating material. This layer should be very thin and should as far as possible cover only the as yet uncovered sites of the n-semiconducting metal oxide. The passivation material may, under some circumstances, also be applied to the metal oxide before the dye. Preferred passivation materials are especially one or more of the following substances: $Al_2O_3$; silanes, for example $CH_3SiCl_3$; $Al^{3+}$; 4-tert-butylpyridine (TBP); MgO; GBA (4-guanidinobutyric acid) and similar derivatives; alkyl acids; hexadecylmalonic acid (HDMA).

As described above, in the context of the organic solar cell, preferably one or more solid organic p-type semiconductors are used—alone or else in combination with one or more further p-type semiconductors which are organic or inorganic in nature. In the context of the present invention, a p-type semiconductor is generally understood to mean a material, especially an organic material, which is capable of conducting holes, that is to say positive charge carriers. More particularly, it may be an organic material with an extensive π-electron system which can be oxidized stably at least once, for example to form what is called a free-radical cation. For example, the p-type semiconductor may comprise at least one organic matrix material which has the properties mentioned. Furthermore, the p-type semiconductor can optionally comprise one or a plurality of dopants which intensify the p-semiconducting properties. A significant parameter influencing the selection of the p-type semiconductor is the hole mobility, since this partly determines the hole diffusion length (cf. Kumara, G., Langmuir, 2002, 18, 10493-10495). A comparison of charge carrier mobilities in different spiro compounds can be found, for example, in T. Saragi, Adv. Funct. Mater. 2006, 16, 966-974.

Preferably, in the context of the present invention, organic semiconductors are used (i.e. low molecular weight, oligomeric or polymeric semiconductors or mixtures of such semiconductors). Particular preference is given to p-type semiconductors which can be processed from a liquid phase. Examples here are p-type semiconductors based on polymers such as polythiophene and polyarylamines, or on amorphous, reversibly oxidizable, nonpolymeric organic compounds, such as the spirobifluorenes mentioned at the outset (cf., for example, US 2006/0049397 and the spiro compounds disclosed therein as p-type semiconductors, which are also usable in the context of the present invention). Preference is given to using low molecular weight organic semiconductors. In addition, reference may also be made to the remarks regarding the p-semiconducting materials and dopants from the above description of the prior art.

The p-type semiconductor is preferably producible or produced by applying at least one p-conducting organic material to at least one carrier element, wherein the application is effected for example by deposition from a liquid phase comprising the at least one p-conducting organic material. The deposition can in this case once again be effected, in principle, by any desired deposition process, for example by spin-coating, knife-coating, printing or combinations of the stated and/or other deposition methods.

The organic p-type semiconductor may especially comprise at least one spiro compound and/or especially be selected from: a spiro compound, especially spiro-MeOTAD; a compound with the structural formula:

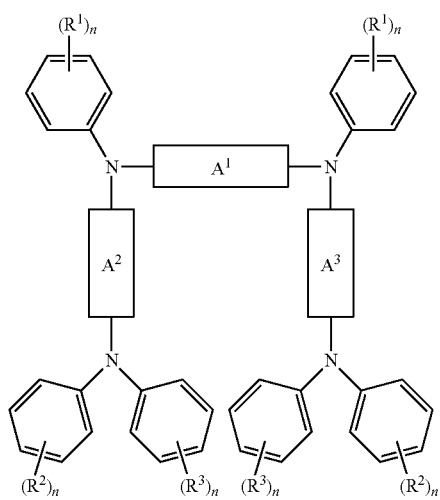

(I)

in which $A^1, A^2, A^3$ are each independently optionally substituted aryl groups or heteroaryl groups, $R^1, R^2, R^3$ are each independently selected from the group consisting of the substituents —R, —OR, —NR$_2$, -A$^4$-OR and -A4-NR$_2$, where R is selected from the group consisting of alkyl, aryl and heteroaryl, and where $A^4$ is an aryl group or heteroaryl group, and where n at each instance in formula I is independently a value of 0, 1, 2 or 3, with the proviso that the sum of the individual n values is at least 2 and at least two of the $R^1$, $R^2$ and $R^3$ radicals are —OR and/or —NR$_2$.

Preferably, $A^2$ and $A^3$ are the same; accordingly, the compound of the formula (I) preferably has the following structure (Ia)

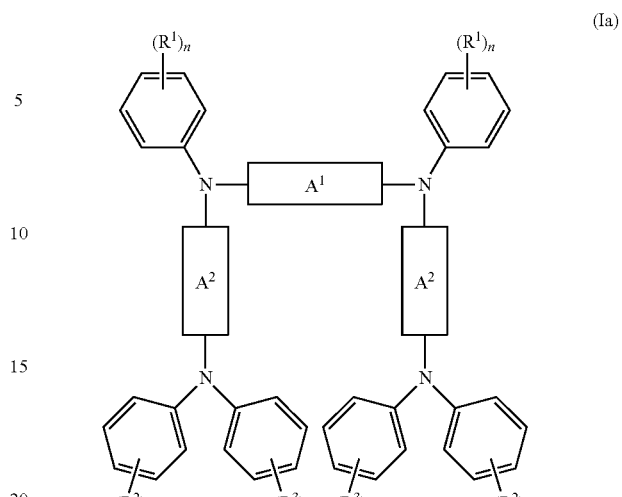

(Ia)

More particularly, as explained above, the p-type semiconductor may thus have at least one low molecular weight organic p-type semiconductor. A low molecular weight material is generally understood to mean a material which is present in monomeric, nonpolymerized or nonoligomerized form. The term "low molecular weight" as used in the present context preferably means that the p-type semiconductor has molecular weights in the range from 100 to 25 000 g/mol. Preferably, the low molecular weight substances have molecular weights of 500 to 2000 g/mol.

In general, in the context of the present invention, p-semiconducting properties are understood to mean the property of materials, especially of organic molecules, to form holes and to transport these holes and/or to pass them on to adjacent molecules. More particularly, stable oxidation of these molecules should be possible. In addition, the low molecular weight organic p-type semiconductors mentioned may especially have an extensive π-electron system. More particularly, the at least one low molecular weight p-type semiconductor may be processable from a solution. The low molecular weight p-type semiconductor may especially comprise at least one triphenylamine. It is particularly preferred when the low molecular weight organic p-type semiconductor comprises at least one spiro compound. A spiro compound is understood to mean polycyclic organic compounds whose rings are joined only at one atom, which is also referred to as the spiro atom. More particularly, the spiro atom may be spa-hybridized, such that the constituents of the spiro compound connected to one another via the spiro atom are, for example, arranged in different planes with respect to one another.

More preferably, the spiro compound has a structure of the following formula:

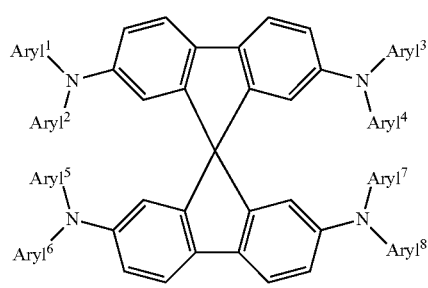

where the aryl¹, aryl², aryl³, aryl⁴, aryl⁵, aryl⁶, aryl⁷ and aryl⁸ radicals are each independently selected from substituted aryl radicals and heteroaryl radicals, especially from substituted phenyl radicals, where the aryl radicals and heteroaryl radicals, preferably the phenyl radicals, are each independently substituted, preferably in each case by one or more substituents selected from the group consisting of —O-alkyl, —OH, —F, —Cl, —Br and —I, where alkyl is preferably methyl, ethyl, propyl or isopropyl. More preferably, the phenyl radicals are each independently substituted, in each case by one or more substituents selected from the group consisting of —O-Me, —OH, —F, —Cl, —Br and —I.

Further preferably, the spiro compound is a compound of the following formula:

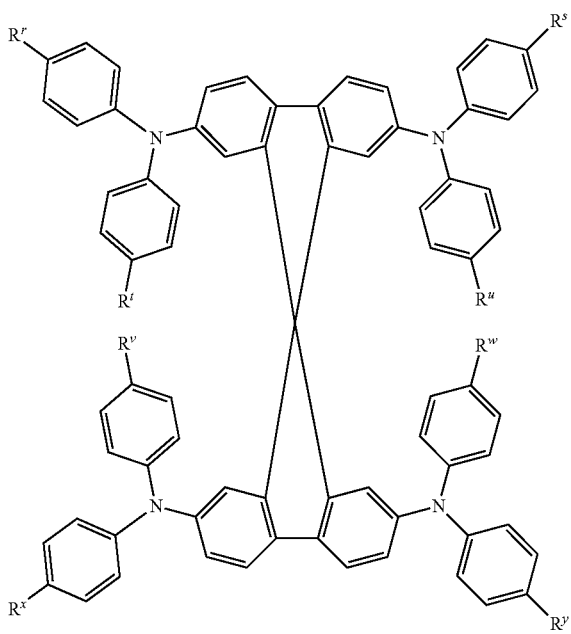

where $R^r$, $R^s$, $R^t$, $R^u$, $R^v$, $R^w$, $R^x$ and $R^y$ are each independently selected from the group consisting of —O-alkyl, —OH, —F, —Cl, —Br and —I, where alkyl is preferably methyl, ethyl, propyl or isopropyl. More preferably, $R^r$, $R^s$, $R^t$, $R^u$, $R^v$, $R^w$, $R^x$ and $R^y$ are each independently selected from the group consisting of —O-Me, —OH, —F, —Cl, —Br and —I.

More particularly, the p-type semiconductor may comprise spiro-MeOTAD or consist of spiro-MeOTAD, i.e. a compound of the formula below, commercially available, for example, from Merck KGaA, Darmstadt, Germany:

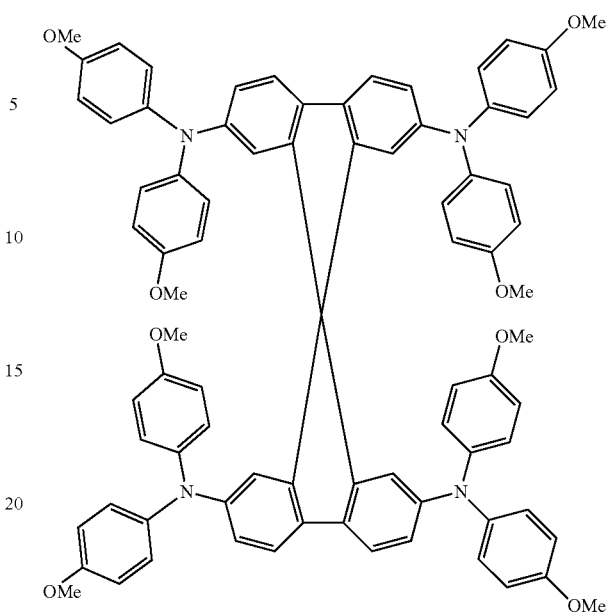

Alternatively or additionally, it is also possible to use other p-semiconducting compounds, especially low molecular weight and/or oligomeric and/or polymeric p-semiconducting compounds.

In an alternative embodiment, the low molecular weight organic p-type semiconductor comprises one or more compounds of the abovementioned general formula I, for which reference may be made, for example, to PCT application number PCT/EP2010/051826, which will be published after the priority date of the present application. The p-type semiconductor may comprise the at least one compound of the abovementioned general formula I additionally or alternatively to the spiro compound described above.

The term "alkyl" or "alkyl group" or "alkyl radical" as used in the context of the present invention is understood to mean substituted or unsubstituted $C_1$-$C_{20}$-alkyl radicals in general. Preference is given to $C_1$- to $C_{10}$-alkyl radicals, particular preference to $C_1$- to $C_8$-alkyl radicals. The alkyl radicals may be either straight-chain or branched. In addition, the alkyl radicals may be substituted by one or more substituents selected from the group consisting of $C_1$-$C_{20}$-alkoxy, halogen, preferably F, and $C_6$-$C_{30}$-aryl which may in turn be substituted or unsubstituted. Examples of suitable alkyl groups are methyl, ethyl, propyl, butyl, pentyl, hexyl, heptyl and octyl, and also isopropyl, isobutyl, isopentyl, sec-butyl, tert-butyl, neopentyl, 3,3-dimethylbutyl, 2-ethylhexyl, and also derivatives of the alkyl groups mentioned substituted by $C_6$-$C_{30}$-aryl, $C_1$-$C_{20}$-alkoxy and/or halogen, especially F, for example $CF_3$.

The term "aryl" or "aryl group" or "aryl radical" as used in the context of the present invention is understood to mean optionally substituted $C_6$-$C_{30}$-aryl radicals which are derived from monocyclic, bicyclic, tricyclic or else multicyclic aromatic rings, where the aromatic rings do not comprise any ring heteroatoms. The aryl radical preferably comprises 5- and/or 6-membered aromatic rings. When the aryls are not monocyclic systems, in the case of the term "aryl" for the second ring, the saturated form (perhydro form) or the partly unsaturated form (for example the dihydro form or tetrahydro form), provided the particular forms are known and stable, is also possible. The term "aryl" in the context of the present invention thus comprises, for example, also bicyclic or tricyclic radicals in which either both or all three radicals are aromatic, and also bicyclic or tricyclic radicals in which only one ring is aromatic, and also tricyclic radicals in which two rings are aromatic. Examples of aryl are: phenyl, naphthyl, indanyl, 1,2-dihydronaphthenyl, 1,4-dihydronaphthenyl, fluorenyl, indenyl, anthracenyl, phenanthrenyl or 1,2,3,4-tetrahydronaphthyl. Particular preference is given to $C_6$-$C_{10}$-aryl radicals, for example phenyl or naphthyl, very particular preference to $C_6$-aryl radicals, for example phenyl. In addition, the term "aryl" also comprises ring systems comprising at least two monocyclic, bicyclic or multicyclic aromatic rings joined to one another via single or double bonds. One example is that of biphenyl groups.

The term "heteroaryl" or "heteroaryl group" or "heteroaryl radical" as used in the context of the present invention is understood to mean optionally substituted 5- or 6-membered aromatic rings and multicyclic rings, for example bicyclic and tricyclic compounds having at least one heteroatom in at least one ring. The heteroaryls in the context of the invention preferably comprise 5 to 30 ring atoms. They may be monocyclic, bicyclic or tricyclic, and some can be derived from the aforementioned aryl by replacing at least one carbon atom in the aryl base skeleton with a heteroatom. Preferred heteroatoms are N, O and S. The hetaryl radicals more preferably have 5 to 13 ring atoms. The base skeleton of the heteroaryl radicals is especially preferably selected from systems such as pyridine and five-membered heteroaromatics such as thiophene, pyrrole, imidazole or furan. These base skeletons may optionally be fused to one or two six-membered aromatic radicals. In addition, the term "heteroaryl" also comprises ring systems comprising at least two monocyclic, bicyclic or multicyclic aromatic rings joined to one another via single or double bonds, where at least one ring comprises a heteroatom. When the heteroaryls are not monocyclic systems, in the case of the term "heteroaryl" for at least one ring, the saturated form (perhydro form) or the partly unsaturated form (for example the dihydro form or tetrahydro form), provided the particular forms are known and stable, is also possible. The term "heteroaryl" in the context of the present invention thus comprises, for example, also bicyclic or tricyclic radicals in which either both or all three radicals are aromatic, and also bicyclic or tricyclic radicals in which only one ring is aromatic, and also tricyclic radicals in which two rings are aromatic, where at least one of the rings, i.e. at least one aromatic or one nonaromatic ring has a heteroatom. Suitable fused heteroaromatics are, for example, carbazolyl, benzimidazolyl, benzofuryl, dibenzofuryl or dibenzothiophenyl. The base skeleton may be substituted at one, more than one or all substitutable positions, suitable substituents being the same as have already been specified under the definition of $C_6$-$C_{30}$-aryl. However, the hetaryl radicals are preferably unsubstituted. Suitable hetaryl radicals are, for example, pyridin-2-yl, pyridin-3-yl, pyridin-4-yl, thiophen-2-yl, thiophen-3-yl, pyrrol-2-yl, pyrrol-3-yl, furan-2-yl, furan-3-yl and imidazol-2-yl and the corresponding benzofused radicals, especially carbazolyl, benzimidazolyl, benzofuryl, dibenzofuryl or dibenzothiophenyl.

In the context of the invention the term "optionally substituted" refers to radicals in which at least one hydrogen radical of an alkyl group, aryl group or heteroaryl group has been replaced by a substituent. With regard to the type of this substituent, preference is given to alkyl radicals, for example methyl, ethyl, propyl, butyl, pentyl, hexyl, heptyl and octyl, and also isopropyl, isobutyl, isopentyl, sec-butyl, tert-butyl, neopentyl, 3,3-dimethylbutyl and 2-ethylhexyl, aryl radicals, for example $C_6$-$C_{10}$-aryl radicals, especially phenyl or naphthyl, most preferably $C_6$-aryl radicals, for example phenyl, and hetaryl radicals, for example pyridin-2-yl, pyridin-3-yl, pyridin-4-yl, thiophen-2-yl, thiophen-3-yl, pyrrol-2-yl, pyrrol-3-yl, furan-2-yl, furan-3-yl and imidazol-2-yl, and also the corresponding benzofused radicals, especially carbazolyl, benzimidazolyl, benzofuryl, dibenzofuryl or dibenzothiophenyl. Further examples include the following substituents: alkenyl, alkynyl, halogen, hydroxyl.

The degree of substitution here may vary from monosubstitution up to the maximum number of possible substituents.

Preferred compounds of the formula I for use in accordance with the invention are notable in that at least two of the $R^1$, $R^2$ and $R^3$ radicals are para-OR and/or —$NR_2$ substituents. The at least two radicals here may be only —OR radicals, only —$NR_2$ radicals, or at least one —OR and at least one —$NR_2$ radical.

Particularly preferred compounds of the formula I for use in accordance with the invention are notable in that at least four of the $R^1$, $R^2$ and $R^3$ radicals are para-OR and/or —$NR_2$ substituents. The at least four radicals here may be only —OR radicals, only —$NR_2$ radicals or a mixture of —OR and —$NR_2$ radicals.

Very particularly preferred compounds of the formula I for use in accordance with the invention are notable in that all of the $R^1$, $R^2$ and $R^3$ radicals are para-OR and/or —$NR_2$ substituents. They may be only —OR radicals, only —$NR_2$ radicals or a mixture of —OR and —$NR_2$ radicals.

In all cases, the two R in the —$NR_2$ radicals may be different from one another, but they are preferably the same.

Preferably, $A^1$, $A^2$ and $A^3$ are each independently selected from the group consisting of

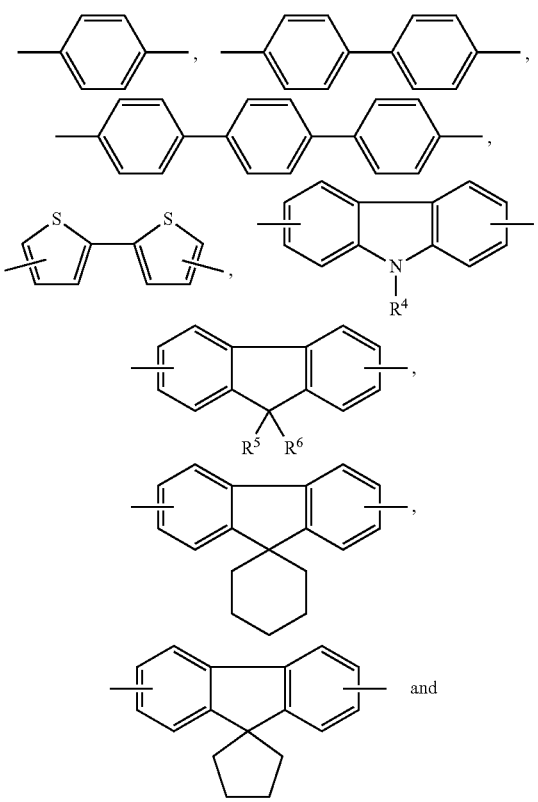

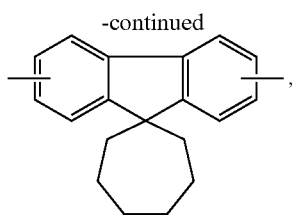

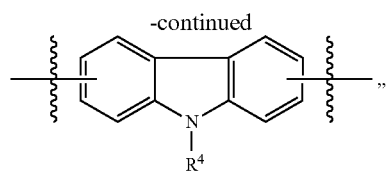

more preferably

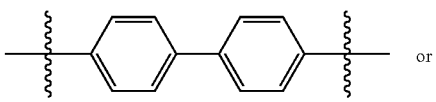 or in which m is an integer from 1 to 18, $R^4$ is alkyl, aryl or heteroaryl, where $R^4$ is preferably an aryl radical, more preferably a phenyl radical, $R^5$, $R^6$ are each independently H, alkyl, aryl or heteroaryl, where the aromatic and heteroaromatic rings of the structures shown may optionally have further substitution. The degree of substitution of the aromatic and heteroaromatic rings here may vary from monosubstitution up to the maximum number of possible substituents.

Preferred substituents in the case of further substitution of the aromatic and heteroaromatic rings include the substituents already mentioned above for the one, two or three optionally substituted aromatic or heteroaromatic groups.

Preferably, the aromatic and heteroaromatic rings of the structures shown do not have further substitution.

More preferably, $A^1$, $A^2$ and $A^3$ are each independently

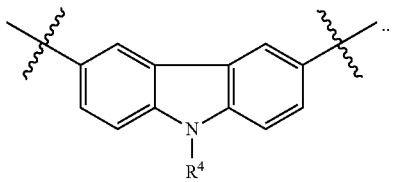

More preferably, the at least one compound of the formula (I) has one of the following structures:

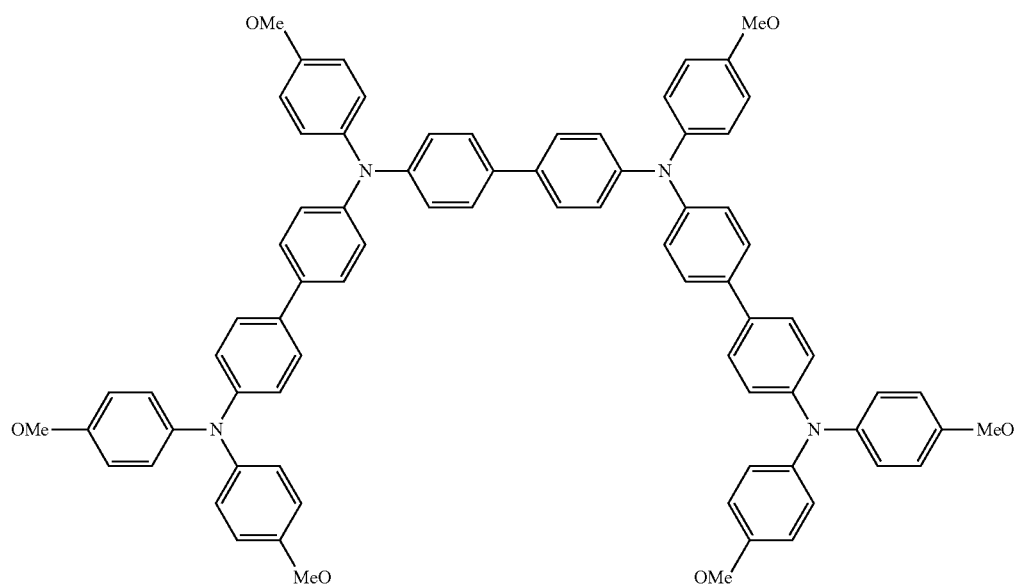

ID367

-continued

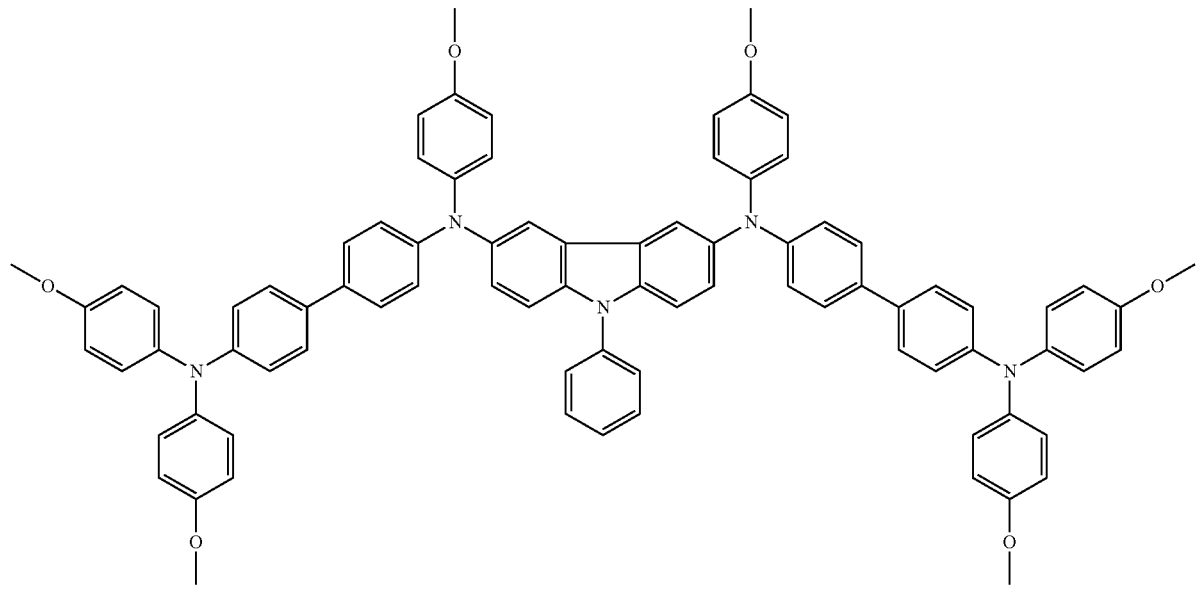
ID522

In an alternative embodiment, the organic p-type semiconductor comprises a compound of the type ID322 having the following structure:

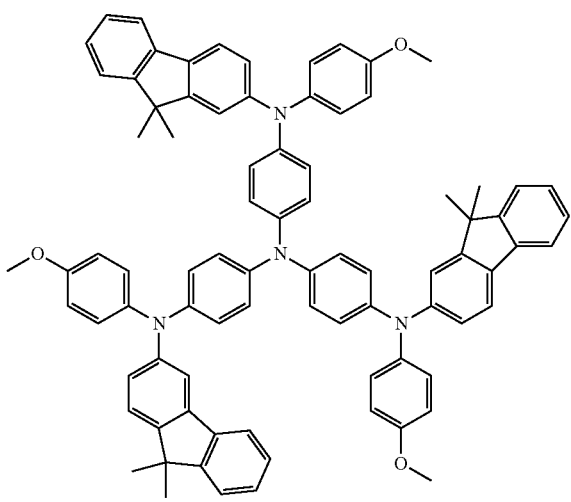 [SMILES: COc1ccc(N(c2ccc(N(c3ccc(N(c4ccc(OC)cc4)c4ccc5c(c4)C(C)(C)c4ccccc4-5)cc3)c3ccc(N(c4ccc(OC)cc4)c4ccc5c(c4)C(C)(C)c4ccccc4-5)cc3)cc2)c2ccc3c(c2)-c2ccccc2C3(C)C)cc1]

The compounds for use in accordance with the invention can be prepared by customary methods of organic synthesis known to those skilled in the art. References to relevant (patent) literature can additionally be found in the synthesis examples adduced below.

Second Electrode

The second electrode may be a bottom electrode facing the substrate or else a top electrode facing away from the substrate. The second electrode used can be especially metal electrodes which may have one or more metals in pure form or as a mixture/alloy, such as especially aluminum or silver. The use of inorganic/organic mixed electrodes or multilayer electrodes is also possible, for example the use of LiF/Al electrodes.

In addition, it is also possible to use electrode designs in which the quantum efficiency of the components is increased by virtue of the photons being forced, by means of appropriate reflections, to pass through the absorbing layers at least twice. Such layer structures are also referred to as "concentrators" and are likewise described, for example, in WO 02/101838 (especially pages 23-24).

The organic solar cell can furthermore comprise at least one encapsulation, wherein the encapsulation is designed to shield the organic solar cell, in particular the electrodes and/or the p-type semiconductor, from a surrounding atmosphere.

Overall, in the context of the present invention, the following embodiments are regarded as particularly preferred:

Embodiment 1

A detector for optically detecting at least one object, comprising at least one optical sensor, wherein the optical sensor has at least one sensor region, in particular at least one sensor region comprising at least one sensor area wherein the optical sensor is designed to generate at least one sensor signal in a manner dependent on an illumination of the sensor region, wherein the sensor signal, given the same total power of the illumination is dependent on a geometry of the illumination, in particular on a beam cross section of the illumination on the sensor area, wherein the detector furthermore has at least one evaluation device, wherein the evaluation device is designed to generate at least one item of geometrical information from the sensor signal, in particular at least one item of geometrical information about the illumination and/or the object.

Embodiment 2

The detector according to the preceding embodiment, wherein the detector furthermore has at least one modulation device for modulating the illumination.

Embodiment 3

The detector according to the preceding embodiment, wherein the detector is designed to detect at least two sensor signals in the case of different modulations, in particular at least two sensor signals at respectively different modulation frequencies, wherein the evaluation device is designed to generate the geometrical information from the at least two sensor signals.

Embodiment 4

The detector according to any of the preceding embodiments, wherein the optical sensor is furthermore designed in such a way that the sensor signal, given the same total power of the illumination, is dependent on a modulation frequency of a modulation of the illumination.

Embodiment 5

The detector according to any of the preceding embodiments, wherein the sensor region is exactly one continuous sensor region, wherein the sensor signal is a uniform sensor signal for the entire sensor region.

Embodiment 6

The detector according to any of the preceding embodiments, wherein the sensor signal is selected from the group consisting of a photocurrent and a photovoltage.

Embodiment 7

The detector according to any of the preceding embodiments, wherein the optical sensor comprises at least one semiconductor detector, in particular an organic semiconductor detector comprising at least one organic material, preferably an organic solar cell and particularly preferably a dye solar cell, in particular a solid dye solar cell.

Embodiment 8

The detector according to the preceding embodiment, wherein the optical sensor comprises at least one first electrode, at least one n-semiconducting metal oxide, at least one dye, at least one p-semiconducting organic material, preferably a solid p-semiconducting organic material, and at least one second electrode.

Embodiment 9

The detector according to any of the preceding embodiments, wherein the geometric information comprises at least one item of location information of the object.

Embodiment 10

The detector according to the preceding embodiment, wherein the evaluation device is designed to determine the geometrical information from at least one predefined relationship between the geometry of the illumination and a relative positioning of the object with respect to the detector, preferably taking account of a known power of the illumination and optionally taking account of a modulation frequency with which the illumination is modulated.

Embodiment 11

The detector according to any of the preceding embodiments, furthermore comprising at least one transfer device, wherein the transfer device is designed to feed electromagnetic radiation emerging from the object to the optical sensor and thereby to illuminate the sensor region.

Embodiment 12

The detector according to any of the preceding embodiments, furthermore comprises at least one illumination source.

Embodiment 13

The detector according to the preceding embodiment, wherein the illumination source is selected from: an illumination source, which is at least partly connected to the object and/or is at least partly identical to the object; an illumination source which is designed to at least partly illuminate the object with a primary radiation.

Embodiment 14

A distance measuring device, in particular for use in a motor vehicle, comprising at least one detector according to any of the preceding embodiments, wherein the detector is designed to determine at least one item of geometrical information of at least one object, wherein the geometrical information comprises at least one item of location information of the object, in particular a distance between a motor vehicle and at least one object and preferably a distance between the motor vehicle and at least one object selected from the group consisting of a further motor vehicle, an obstacle, a cyclist and a pedestrian.

Embodiment 15

An imaging device for imaging at least one sample, wherein the imaging device comprises at least one detector according to any of the preceding embodiments relating to a detector, wherein the imaging device is designed to image a plurality of partial regions of the sample onto the sensor region and to thereby generate sensor signals assigned to the partial regions, wherein the imaging device is designed to generate items of geometrical information of the respective partial regions from the sensor signals, wherein the items of geometrical information comprise items of location information.

Embodiment 16

A human-machine interface for exchanging at least one item of information between a user and a machine, in particular for inputting control commands, wherein the human-machine interface comprises at least one detector according to any of the preceding claims relating to a detector wherein the human-machine interface is designed to generate at least one item of geometrical information of the user (218) by means of the detector wherein the human-machine interface is designed to assign to the geometrical information at least one item of information, in particular at least one control command.

Embodiment 17

An entertainment device for carrying out at least one entertainment function, in particular a game, wherein the entertainment device comprises at least one human-machine interface according to the preceding embodiment, wherein the entertainment device is designed to enable at least one item of information to be input by a player by means of the human-machine interface, wherein the entertainment device is designed to vary the entertainment function in accordance with the information.

Embodiment 18

A security device for carrying out at least one security application in particular for identifying and/or avoiding an access to data of an optical data storage device, wherein the security device comprises at least one detector according to any of the preceding embodiments relating to a detector, wherein the security device is designed to identify, by means of the detector, impingement of focused electromagnetic radiation, in particular laser beams, on the security device and preferably to generate at least one warning signal.

Embodiment 19

A method for optically detecting at least one object, in particular using a detector according to any of the preceding embodiments relating to a detector, wherein at least one optical sensor is used, wherein the optical sensor has at least one sensor region, wherein electromagnetic radiation emerging from the object is fed to the optical sensor and thereby the sensor region is illuminated, wherein the optical sensor generates at least one sensor signal in a manner dependent on the illumination of the sensor region, wherein the sensor signal, given the same total power of the illumination, is dependent on a geometry of the illumination.

Embodiment 20

The method according to the preceding embodiment, wherein at least one item of geometrical information of the object is generated from the sensor signal, in particular at least one item of location information of the object.

Embodiment 21

The use of a detector according to any of the preceding embodiments relating to a detector for a purpose of use, selected from the group consisting of: distance measurement, in particular in traffic technology; imaging, in particular in microscopy; an entertainment application; a security application; a human-machine interface application.

Embodiment 22

The use of an organic solar cell, in particular a dye solar cell, preferably a solid dye solar cell, as optical sensor, wherein at least one sensor signal is generated in the use, wherein the sensor signal, given the same total power of an illumination is dependent on a geometry of the illumination on the organic solar cell, wherein at least one item of geometrical information of at least one object is generated from the sensor signal in the use.

BRIEF DESCRIPTION OF THE FIGURES

Further optional details and features of the invention are evident from the description of preferred exemplary embodiments which follows in conjunction with the dependent claims. In this context, the particular features may be implemented alone or with several in combination. The invention is not restricted to the exemplary embodiments. The exemplary embodiments are shown schematically in the figures. Identical reference numerals in the individual figures refer to identical elements or elements with identical function, or elements which correspond to one another with regard to their functions.

Specifically, in the figures.

EXEMPLARY EMBODIMENTS

Detector

Figure 1:
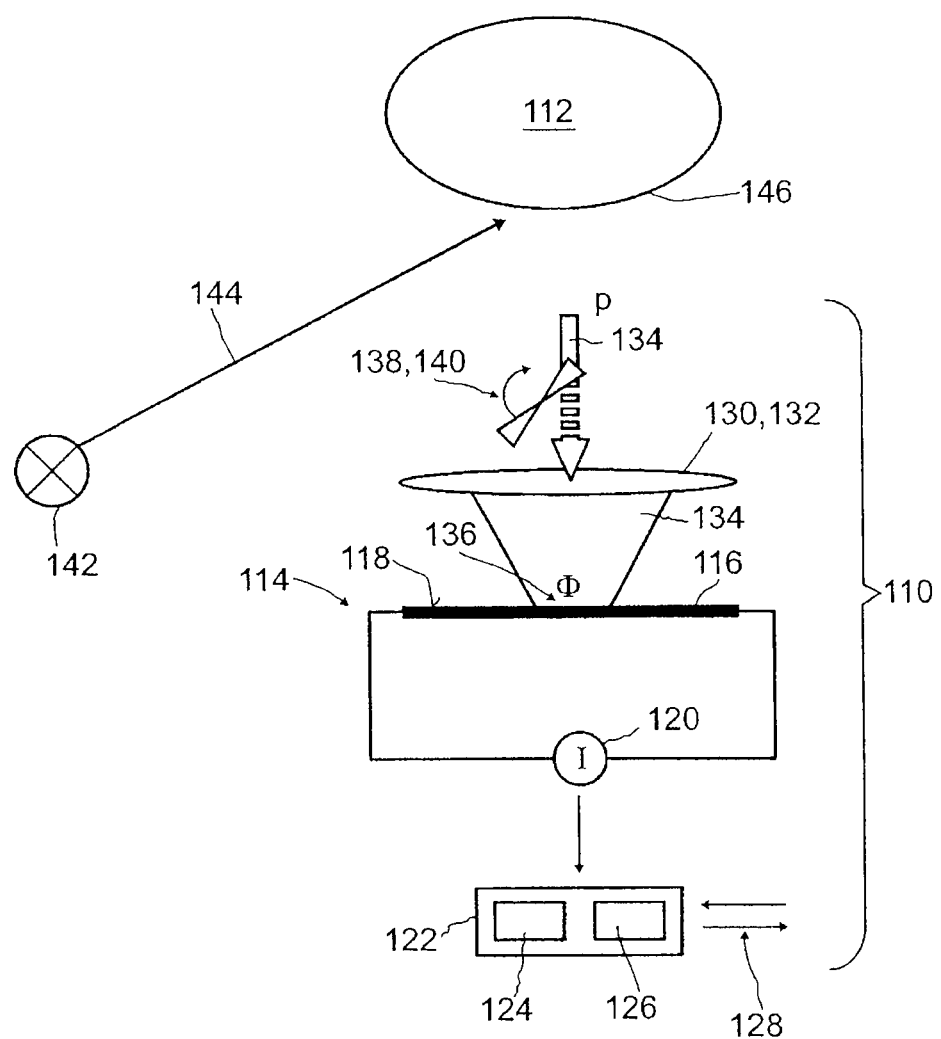
FIG. 1 shows an exemplary embodiment of a detector according to the invention for optically detecting at least one object.

FIG. 1 illustrates, in a highly schematic illustration, an exemplary embodiment of a detector 110 according to the invention for optically detecting at least one object 112. The detector 110 comprises an optical sensor 114, having a sensor region 116, for example having a sensor area 118. The sensor is designed to generate at least one sensor signal which can comprise for example a photocurrent I. By way of example, the optical sensor 114 can comprise at least one measuring device 120 by means of which at least one physical property of the optical sensor 114 can be detected, for example by at least one photocurrent and/or at least one photovoltage being measured.

Furthermore, the detector 110 in accordance with the exemplary embodiment illustrated in FIG. 1 comprises an evaluation device 122, which, by way of example, can be connected to the optical sensor 114 and/or else can be wholly or partly integrated into the optical sensor 114, or vice-versa. Said evaluation device 122 can be designed, for example, to pick up the at least one sensor signal of the optical sensor 114 directly or indirectly. The evaluation device 122 can comprise for example at least one data processing device 124 and/or at least one data storage device 126. Furthermore, the evaluation device 122 can have for example a unidirectional or bidirectional interface 128, for example in order to be able to exchange data and/or control commands unidirectionally or bidirectionally with other devices.

Furthermore, in the exemplary embodiment illustrated in FIG. 1, the detector 110 optionally comprises at least one transfer device 130, for example having at least one lens 132 and/or other imaging or non-imaging elements. The optional transfer device 130 is designed to feed electromagnetic radiation 134 emerging from the object 112 to the optical sensor 114 and to illuminate the sensor region 116 in the process. By way of example, a light spot 136 having a diameter or equivalent diameter can arise on the sensor area 118 in this way. Said light spot 136 can have an area A, for example, wherein the total power of the electromagnetic radiation 134 is designated by p in FIG. 1, and the flux p/A is designated by $\phi$. It is pointed out that the optional transfer device 130 in FIG. 1 is only indicated schematically. Said transfer device can also be embodied in various other ways.

Furthermore, in the exemplary embodiment in accordance with FIG. 1, the detector 110 optionally comprises at least one modulation device 138 for modulating the electromagnetic rays 134. In particular, said modulation device 138 can comprise at least one beam interrupter 140, for example a so-called chopper wheel.

Furthermore, the detector 110 can optionally comprise at least one illumination source 142. Said illumination source 142 can be designed to irradiate the object 112 or a partial region of the object 112 with a primary radiation 144. By way of example, said primary radiation 144 can be reflected and/or scattered at the object 112. During this reflection and/or scattering, which can be supported for example by at least one optional reflective surface 146 of the object 112, the electromagnetic radiation 134 is optionally generated, which is then fed to the optical sensor 114, for example by means of the transfer device 130. As an alternative or in addition to reflection and/or scattering, however, the primary radiation 144 can also excite the object 112 or a part thereof to emit the electromagnetic radiation 134, for example in the form of an excitation of fluorescence and/or excitation of phosphorescence. In this case, the object 112 can comprise for example at least one fluorescent material and/or at least one phosphorescent material.

Optical Sensor

Figure 2:
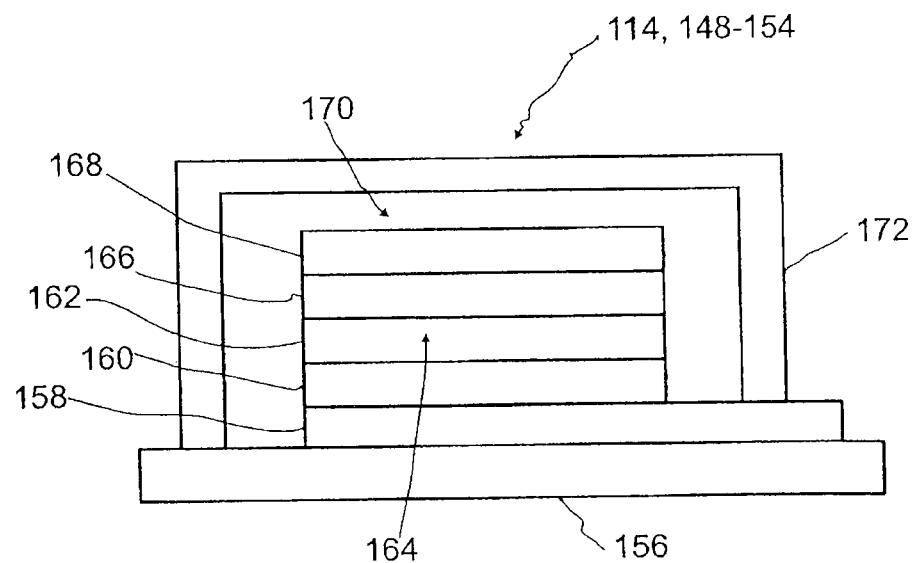
FIG. 2 shows an exemplary embodiment of an optical sensor for use in a detector according to the invention.

As explained above, it is particularly preferred if the optical sensor 114 comprises at least one semiconductor detector 148, in particular an organic semiconductor detector 150, preferably an organic solar cell 152 and particularly preferably a dye solar cell 154. An exemplary embodiment of such optical sensors 114 is shown in FIG. 2 in a schematic sectional illustration through one possible layer structure. The dye solar cell 154 illustrated there can comprise for example a substrate 156, for example a glass substrate. However, other substrates 156 can also be used, as described above, for example a plastic substrate or else multilayer or laminate substrates. In the exemplary embodiment illustrated, at least one first electrode 158, which can also be designated as a working electrode and which can preferably be embodied in a transparent fashion, as described above, is applied on said substrate 156. At least one blocking layer 160 (also designated hereinafter as buffer layer) of an optional metal oxide can in turn optionally be applied on said first electrode 158, said layer preferably being nonporous and/or nonparticulate. An n-semiconducting metal oxide 162 is applied in turn on said layer, said metal oxide being sensitized with a dye 164. As explained above, this sensitization can be effected by applying a separate layer of the dye 164 and/or by complete or partial impregnation, wetting or mixing of the, preferably porous and/or particulate, n-semiconducting metal oxide 162 with the dye 164.

An organic p-type semiconductor 166 is applied to the dye 164. Said organic p-type semiconductor 166 is preferably solid in the finished state of the dye solar cell 154, that is to say embodied as a solid organic p-type semiconductor 166. A plurality of layers of this solid organic p-type semiconductor 166 can also be provided. A second electrode 168, which is also designated as a counterelectrode, is applied on the p-type semiconductor 166.

The layers illustrated in FIG. 2 together form a layer structure 170, which is preferably shielded from a surrounding atmosphere by an encapsulation 172, for example in order to shield the layer structure 170 from a surrounding atmosphere, for example in order to completely or partly protect the layer structure 170 from oxygen and/or moisture. One or both of the electrodes 158, 168 or connection contacts of said electrodes 158, 168 can be led out from the encapsulation 172, in order to be able to provide one or a plurality of contact-connection areas outside the encapsulation 172.

Figure 3:
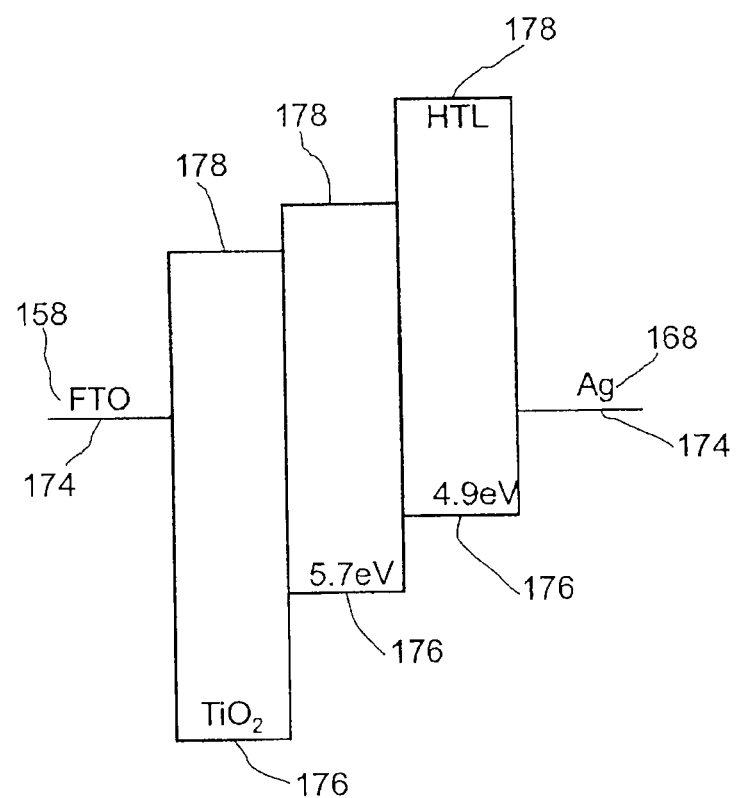
FIG. 3 shows an exemplary embodiment of possible energy levels of a layer structure of an optical sensor in accordance with FIG. 2.

FIG. 3 shows, in a highly schematic manner, one possible energy level diagram of the dye solar cell 154, for example according to FIG. 2. The illustration shows the Fermi levels 174 of the first electrode 158 and of the second electrode 168, and the HOMOs (Highest Occupied Molecular Orbitals) 176 and the LUMOs (Lowest Unoccupied Molecular Orbitals) 178 of the layers 160, 162 (which can comprise the same material, for example $TiO_2$) of the dye 164 (indicated by way of example, with a HOMO level of 5.7 eV) and of the p-type semiconductor 166 (also designated as HTL, Hole Transport Layer). FTO (fluorine-doped tin oxide) and silver are specified by way of example as materials for the first electrode 158 and the second electrode 168. It is pointed out that other electrode materials can also be used and that, for example, the order of the first electrode and the second electrode can also be reversed and that, for example, it is also possible to use a nontransparent substrate 156 in combination with a transparent second electrode 168 and optionally a transparent encapsulation 172, or an inverse layer structure. The organic semiconductor detector 150 can furthermore optionally comprise further elements that are not illustrated in FIGS. 2 and 3.

Production of a Dye Solar Cell

As an example of production of an organic solar cell 152, production of a dye solar cell 154 with a solid p-type semiconductor 166 is described below by way of example.

As the base material and substrate 156, glass plates which had been coated with fluorine-doped tin oxide (FTO) as the first electrode (working electrode) 158 and were of dimensions 25 mm×25 mm×3 mm (Hartford Glass) were used, which were treated successively in an ultrasound bath with glass cleaner (RBS 35), demineralized water and acetone, for 5 min in each case, then boiled in isopropanol for 10 min and dried in a nitrogen stream.

To produce an optional solid $TiO_2$ buffer layer 160, a spray pyrolysis process was used. Thereon, as an n-semiconducting metal oxide 162, a $TiO_2$ paste (Dyesol) which comprises $TiO_2$ particles with a diameter of 25 nm in a terpineol/ethylcellulose dispersion was spun on with a spin-coater at 4500 rpm and dried at 90° C. for 30 min. After heating to 450° C. for 45 min and a sintering step at 450° C. for 30 minutes, a $TiO_2$ layer thickness of approximately 1.8 µm was obtained.

After removal from the drying cabinet, the sample was cooled to 80° C. and immersed into a 5 mM solution of an additive ID662 (obtainable according to example H below, for example) for 12 h and subsequently into a 0.5 mM solution of a dye 164 in dichloromethane for 1 h. The dye 164 used was the dye ID504 (obtainable according to example G below, for example), but a large number of other dyes can be used and the choice of dye generally has only little influence on the effect described above. In particular, the dye can be adapted to the respective purpose of use and the wavelengths of the electromagnetic radiation 134 used.

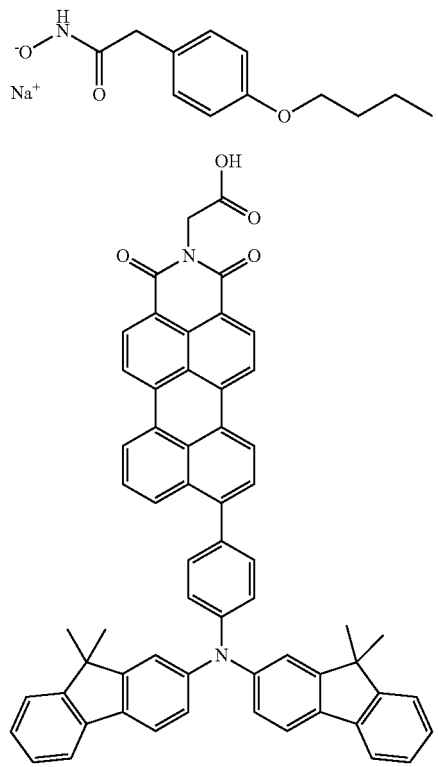

After removal from the solution, the sample was subsequently rinsed with the same solvent and dried in a nitrogen stream. The samples obtained in this way were subsequently dried at 40° C. under reduced pressure.

Next, a p-type semiconductor 166 solution was spun on. For this purpose, a solution of 0.163 M spiro-MeOTAD (Merck) and 20 mM LiN(SO$_2$CF$_3$)$_2$ (Aldrich) in chlorobenzene was made up. 125 µl of this solution were applied to the sample and allowed to act for 60 s. Thereafter, the supernatant solution was spun off at 2000 rpm for 30 s.

Finally, a metal back electrode was applied as a second electrode 168 by thermal metal vaporization under reduced pressure. The metal used was Ag, which was vaporized at a rate of 3 Å/s at a pressure of approx. $2*10^{-6}$ mbar, so as to give a layer thickness of about 200 nm.

Figure 4:
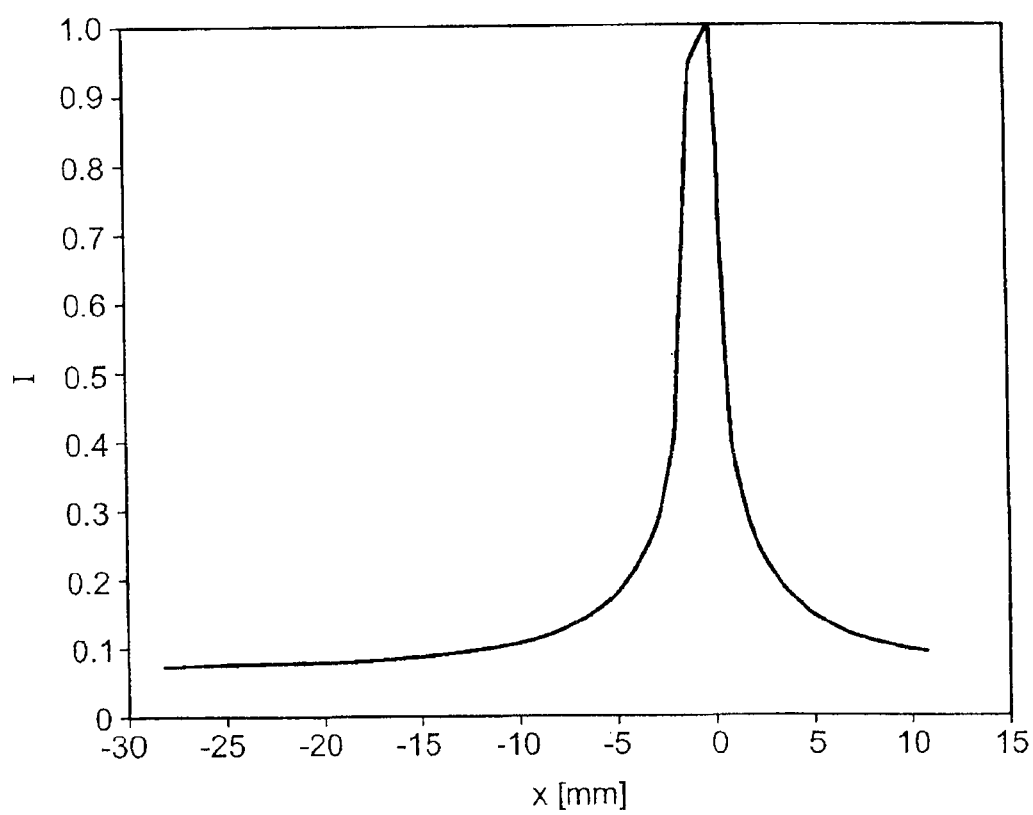
FIG. 4 shows an exemplary embodiment of a signal dependence of an optical sensor according to the present invention on a beam geometry.

Dependence of the Sensor Signal on the Geometry of the Illumination and the Modulation Frequency With such dye solar cells 154 as optical sensor 114, firstly the method of operation of the detector 110 illustrated in FIG. 1 will be described. FIG. 4 shows an example of a measurement of a photocurrent I (normalized to the maximum value) as a function of a position x (indicated in millimeters) of a lens 132, wherein the lens 132 focuses electromagnetic radiation 134 onto a sensor area 118 of the dye solar cell 154. The sensor area 118 can be for example a surface of the substrate 156 of the layer structure in FIG. 2, said surface facing away from the first electrode 158. Alternatively, however, the sensor area 118 can also be arranged in a layer plane of the organic layer structure, for example in the region of the dye 164. The exact position of said sensor area 118 within the organic semiconductor detector 150 is greatly dependent on the individual physical processes and is generally not of importance for the exact functioning of the detector 110. Alternatively, the entire organic layer structure or a part thereof can be regarded as a sensor region 116.

During the measurement in FIG. 4, the lens 132 is displaced relative to the optical sensor 114 in FIG. 1 in a direction perpendicular to the sensor area 118. As a result, the diameter or equivalent diameter of the light spot 136 on the sensor area 118 changes. By way of example, a lens having a focal length of 50 mm can be used, given a beam diameter of 25 mm, for example, which leads to a size of the light spot 136 of less than 2 mm, for example. A location of the lens 132 at which optimum focusing occurs is arbitrarily indicated as location x=0 in FIG. 4. As an alternative or in addition to a displacement of the lens 132 or alteration of the optional transfer device 130, other measures could also be implemented in order to vary a focusing of the electromagnetic radiation 134 on the sensor area 118 or a diameter or equivalent diameter or some other geometry of the electromagnetic radiation 134 in the sensor region 116 and in particular on the sensor area 118.

It can clearly be discerned in FIG. 1 that the signal of the optical sensor 114, in this case the photocurrent, is greatly dependent on the geometry of the illumination. Outside a maximum at x=0, the photocurrent falls to less than 10% of its maximum value.

Figure 5:
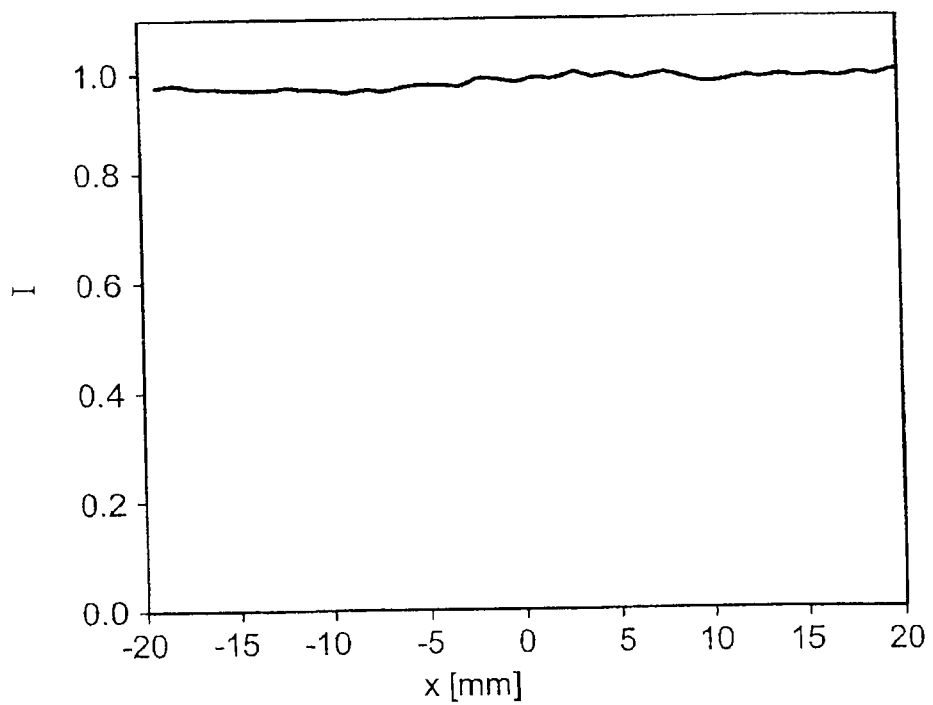
FIGS. 5 and 6 show measurements for demonstrating a geometry independence of the sensor signals of conventional semiconductor sensors.
Figure 6:
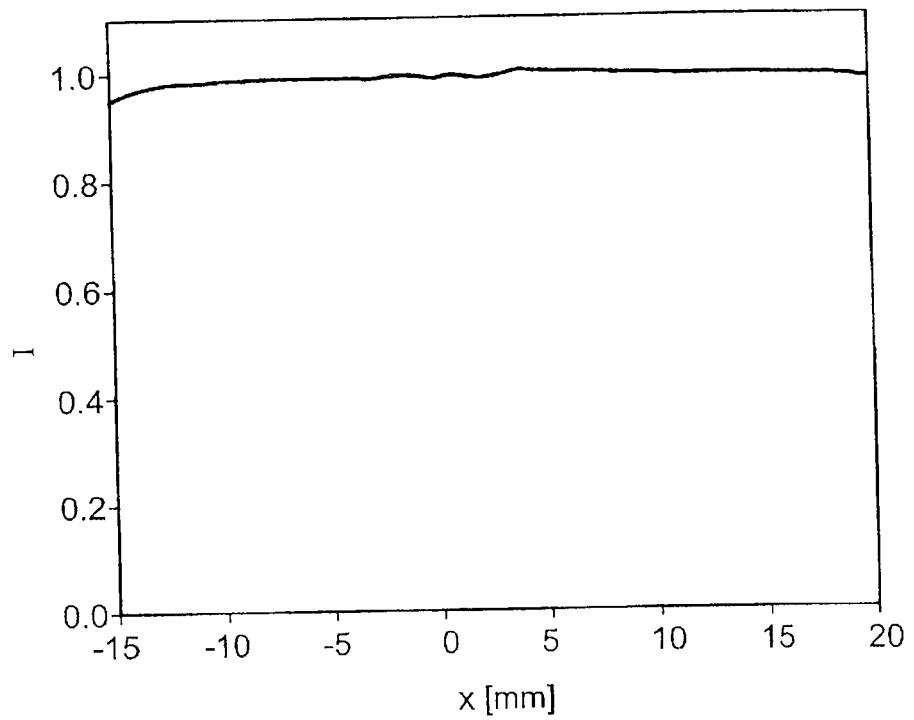

In comparison therewith, FIGS. 5 and 6 illustrate corresponding measurements on silicon diodes (FIG. 5) and germanium diodes (FIG. 6). In this case, diodes of the Hamamatsu S2386-8k type were used as silicon diodes, and diodes of the Hamamatsu J16-5SP-R03M type were used as germanium diodes. It can clearly be discerned that the signal of such semiconductor diodes, apart from marginal effects in FIG. 6, which may be attributable to a boundary of the sensor area, and apart from noise effects, which are below 10%, does not have the above-described geometry dependence of the sensor signals on the illumination of the sensor region 116. In other words, in the case of the optical sensors 114 of a conventional type that are used in FIGS. 5 and 6, the sensor signal, given the same total power, is substantially independent of a geometry of the illumination of the sensor region 116 or the sensor area 118, wherein, by way of example, fluctuations of less than 10%, preferably of less than 5%, can still be accepted and should not yet be regarded as the effect according to the invention. In contrast thereto, the measurement by means of the detector 110 according to the invention and the optical sensor 114 in accordance with FIG. 2, for example, shows a pronounced geometry-dependent effect in the sensor signal.

Figure 7:
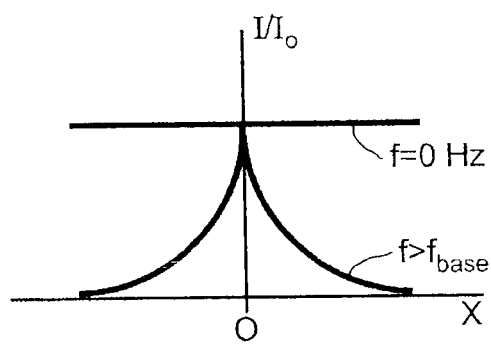
FIG. 7 shows a typical frequency dependence of the signal of optical sensors for use in a detector according to the present invention.

This effect is generally dependent on a modulation frequency of the illumination of the optical sensor 114. The measurements in FIGS. 4-6 were carried out using a modulation device 138 by means of which the electromagnetic radiation 134 was modulated before impinging on the sensor region 116 with a frequency of typically 30 Hz to 100 Hz. The modulation device 138 used was an electronic modulation device in the form of a pulsed current source having a duty cycle of 1:1. This is illustrated once again schematically in FIG. 7 for measurements analogous to the measurement in accordance with FIG. 4. Here the sensor signal I/I$_0$, that is to say the sensor signal normalized to its maximum value I$_0$, is plotted as a function of the spatial coordinate x of the lens 132 used for the focusing, but this can be exchanged, in principle, for any other parameter that characterizes the geometry of the illumination on the sensor region 116 or the sensor area 118. The illustration schematically shows a curve of the sensor signal at a modulation frequency f=0 Hz and a modulation frequency f that is greater than a limiting frequency $f_{Base}$ dependent on the type of optical sensor 114.

Figure 8:
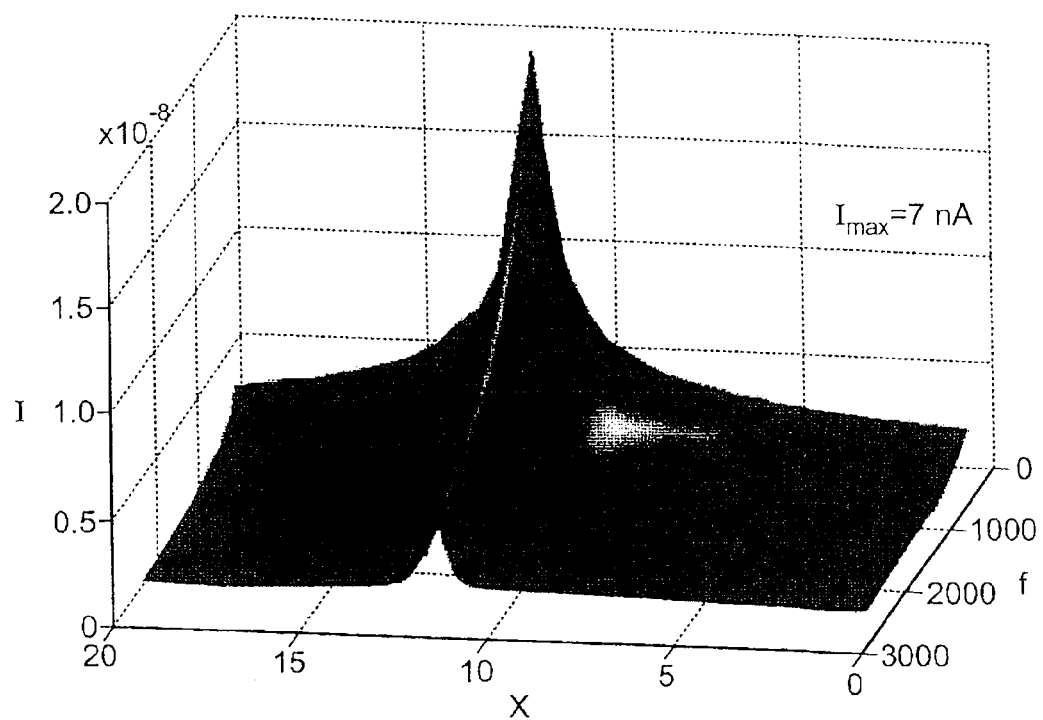
FIG. 8 shows a joint illustration of the dependence of a sensor signal of the detector according to the present invention on a modulation frequency f and a beam geometry.

From the spatial coordinate x it is possible, by using imaging equations or else by simple observation, for example, to deduce the geometry of the illumination. On the other hand it is possible, for example given fixed positioning of the lens 132 or fixed embodiment of the transfer device 130, to deduce for example at least one spatial coordinate of the object 112 from the sensor signal and/or from the geometry of the illumination. For this purpose, calibration curves can be recorded and/or calculated, which can be stored for example in the evaluation device 122 and/or the data storage device 126. FIG. 8 shows one possible example of such calibration curves in a three-dimensional illustration. Here the photocurrent I is plotted as a function of the spatial coordinate x of the lens 132 and as a function of the modulation frequency f, specified in hertz. During this measurement, a photocurrent of 7 nA occurred as maximum photocurrent. In this case, the location of the maximum is chosen arbitrarily, and so in this case, without restricting the usability of the results, the location x=0 does not specify the location of the maximum. The curves clearly show that the sensor signal I is a distinct function of the spatial coordinate x, and hence the geometry of the illumination of the sensor region 116, and the frequency f.

In a manner similar to that illustrated in FIG. 8, a multiplicity of other calibration curves can be recorded. By way of example, it is possible to record calibration curves in which, instead of the spatial coordinate x, a coordinate is directly specified which characterizes at least one item of geometrical information of the object 112. Given a known modulation frequency f and measured intensity I, there is then only an ambiguity with regard to the fact of on which side of the maximum the measurement result lies. This ambiguity can be resolved for example by prior knowledge of on which side of the maximum the measurement must lie, or by a plurality of measurements. The evaluation device 122 can be designed to resolve this ambiguity, for example by programming.

Distance Measuring Device

Figure 9:
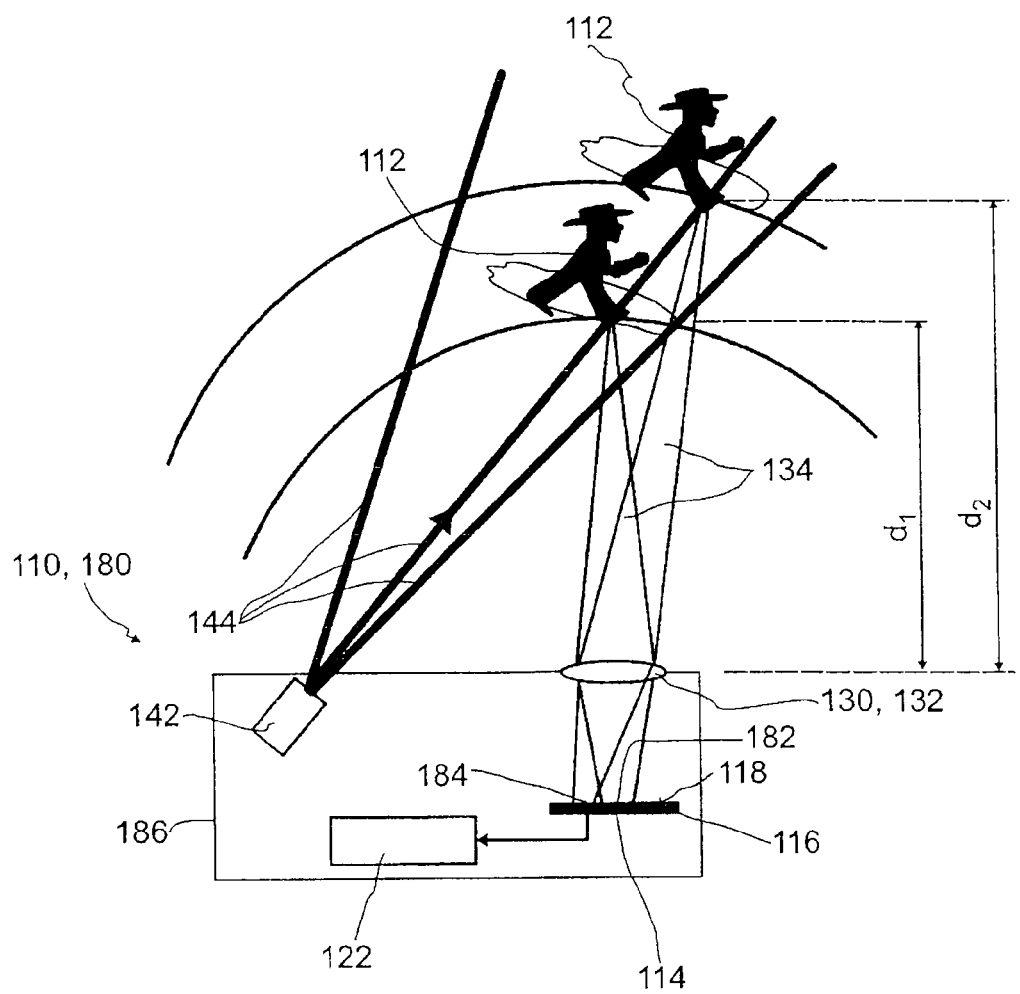
FIG. 9 shows a schematic exemplary embodiment of a distance measuring device according to the invention.

FIG. 9 shows a highly schematic example of a distance measuring device 180, which in principle, can be embodied analogously to the detector 110 in accordance with FIG. 1 and/or can comprise such a detector 110. In this case, the at least one item of geometrical information generated by means of the detector is embodied as location information or comprises at least one item of location information, and/or the distance measuring device 180 is designed to generate the at least one item of location information from the at least one item of geometrical information. The distance measuring device 180 therefore serves to generate at least one item of location information about at least one object 112, which is illustrated symbolically as a pedestrian in FIG. 9. By way of example, this location information can comprise at least one distance $d_1$ or $d_2$ between the object 112 and the detector 110 or a part of the detector 110, for example a distance between the object 112 and a lens 132 of the detector 110.

The structure of the detector 110 in FIG. 9 can correspond, in principle, to the structure in accordance with FIG. 1. An optional modulation device 138, which can be arranged for example between object 112 and lens 132 and/or between lens 132 and optical sensor 114 and/or which can be integrated into the at least one illumination source 142, is not illustrated in FIG. 9.

FIG. 9 illustrates by way of example two objects 112 at different distances $d_1$, $d_2$. These cause for example on the sensor region 116, and in particular the sensor area 118, different light spots 182, 184, with different geometries. Sensor signals which are picked up by the optical sensor 114 in accordance with the geometry of said light spots 182, 184 are correspondingly different. The evaluation device 122 can be designed, for example using calibration curves in accordance with FIG. 5 and/or other types of calibration curves, to generate from said sensor signals an item of geometrical information, in particular at least one item of location information, of the object 112, for example an item of information about the distance $d_1$ or $d_2$ between the objects 112 and the detector 110.

The detector 110 or distance measuring device 180 can be embodied for example in integral fashion or else in a multipartite fashion and can comprise for example at least one housing 186 into which, by way of example, the optical sensor 114 and/or the evaluation device 122 and optionally the at least one illumination source 142 can be integrated. Alternatively or additionally, however, it is also possible to provide multipartite embodiments, for example by one or a plurality of illumination sources 142 being arranged separately, for example in a separate housing. Overall, the distance measuring device 180 in accordance with FIG. 9 can have for example the form of a simple, camera-like arrangement and can for example also be embodied as a handheld device, that is to say as a device which can be carried by a user or can be taken along solely on the basis of muscle power. Various other configurations are possible.

The distance measuring device 180 in accordance with FIG. 9 can optionally comprise exactly one optical sensor 114. Alternatively, the distance measuring device 180 can also be embodied as a camera, for example by a plurality of optical sensors 114 and/or one or a plurality of optical sensors 114 having a plurality of sensor regions 116 being used, for example in a two-dimensional matrix arrangement and/or a three-dimensional matrix arrangement. One advantage of such cameras resides, in comparison with conventional recording techniques, in a shorter recording time, for example with a pixel clock of 10 MHz, corresponding to a time of 0.1 ms for 1000 pixels. Recording times for two-dimensional and three-dimensional recordings can generally be made equally short. In contrast thereto, conventional cameras, in order to generate three-dimensional images, generally have to record n images, which necessitates recording times in the Hz-kHz range. Furthermore, conventional cameras of the type mentioned are generally of comparatively low luminosity.

Figure 10:
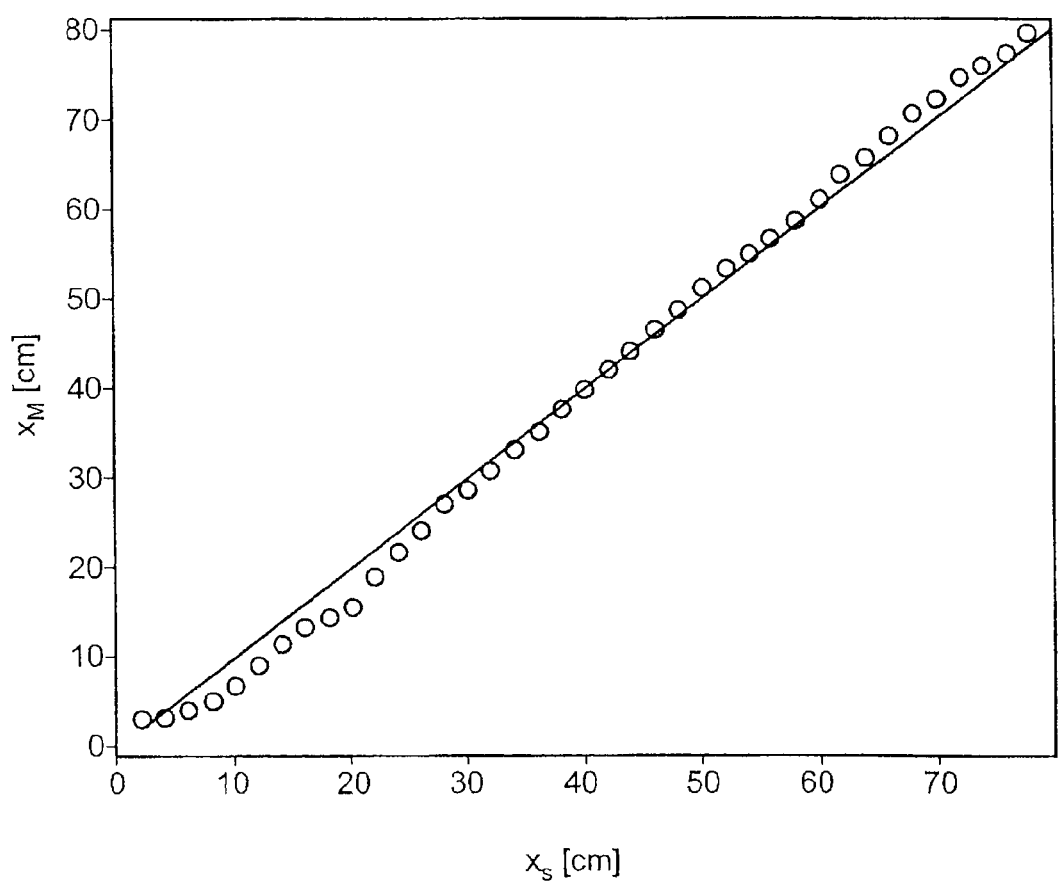
FIG. 10 shows a result of a distance measurement using a distance measuring device according to the invention.

Evidence of the functioning of the arrangement illustrated in FIG. 9 is shown in FIG. 10. Here a distance $x_M$ (corresponding, for example, to the spatial coordinates $d_1$ and $d_2$ in FIG. 9), specified in cm or 10 mm, measured by means of the distance measuring device 180 in accordance with FIG. 9 is plotted as a function of the actual distance $x_S$, likewise specified in cm or 10 mm. The measurements were carried out using a transfer device 130 in the form of an objective having an achromatic lens, an illumination source 142 in the form of a frequency-doubled neodymium laser and a dye solar cell 154 in accordance with the above description having a sensor area 118 of approximately 4 mm$^2$.

The measurements clearly show that, for example here in the case of distances of less than 1 m, the distance measurements by means of the distance measuring device 180 according to the invention correspond excellently to the actual distances. The distance measurement is readily also adaptable to other distances, for example by adapting the transfer device 130 and/or the illumination source 142 and/or the optical sensor 114. By way of example, microscopic distances can be identified by corresponding focusing of the primary radiation 144 and/or by corresponding embodiment of the optional transfer device 130. Greater distances than the distances shown in FIG. 10 can likewise be identified for example by using laser beams and/or corresponding optics in the transfer device 130. However, the measurement in FIG. 10 clearly shows that the measurement principle proposed can be realized.

This measurement principle of a distance measuring device 180 can be used very diversely, for example for determining at least one spatial coordinate of at least one object 112, of a plurality of objects, or for spatially detecting an entire environment, for example in a scanning method in which, within a visual range of the detector 110, one or a plurality of objects, a plurality of points of at least one object or contours of one or a plurality of objects are detected successively or simultaneously. In this respect, the distance measuring device 180 in the embodiment illustrated or another embodiment according to the invention can be used and embodied very diversely and can be used for example generally for one-dimensional, for two-dimensional or for three-dimensional detection of surroundings.

Figure 11:
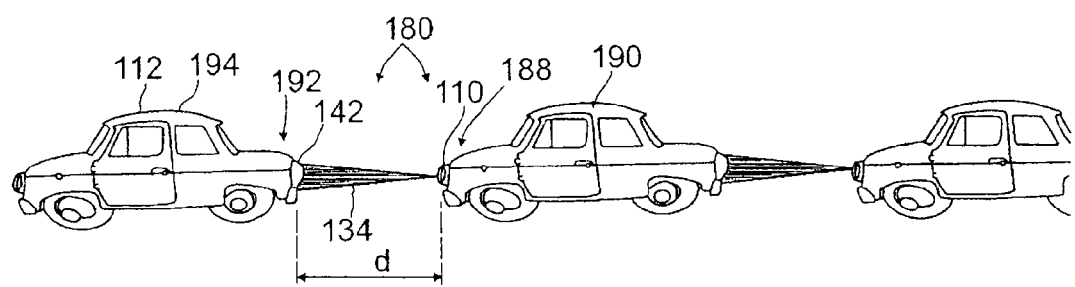
FIG. 11 shows a use of a distance measuring device according to the invention in motor vehicles.

FIG. 11 shows how a distance measuring device 180 of the type proposed can be used for example in motor vehicle technology, for example for detecting the surroundings. By way of example, a detector 110 or a part thereof can be arranged on a front side 188 of a first motor vehicle 190. An illumination source 142, for example in the form of an infrared transmitter, which directly emits the electromagnetic radiation 134 in the direction of the detector 110, can be arranged on a rear side 192 of a second motor vehicle 194, which in this case can function as the object 112. Said illumination source 142 can therefore be regarded as a constituent part of the detector 110 or else as a separate component. Alternatively or additionally, the at least one illumination source 142 or a part thereof could, however, also be arranged in the first motor vehicle 190 and emit primary radiation in the direction of the second motor vehicle 194, where it is for example reflected and/or scattered and/or excites luminescence, such that electromagnetic radiation 134 in turn propagates back to the first motor vehicle 190 and the detector 110. Various embodiments are possible.

Generally, the illumination can be embodied in such a way that a geometry of an illumination of a sensor region 116 of the detector 110 changes with a distance d between the motor vehicles 190, 194. This can be effected for example once again by means of a corresponding embodiment of the illumination source 142 and/or an optional transfer device 130 of the detector 110. Consequently, a sensor signal of the detector 110 also changes, from which the distance d and/or some other geometrical information can in turn be deduced. This deduction can be effected for example once again by using one or a plurality of calibration functions, in particular once again by means of an evaluation device 122. The latter can be embodied separately, but can also be integrated for example wholly or partly into a device already present in the motor vehicle, for example an engine controller.

By way of example, a plurality of motor vehicles 190, 194 can each be equipped with such distance measuring devices 180. The at least one item of geometrical information, in particular the at least one item of location information, about the motor vehicle ahead and/or the following motor vehicle can for example be brought to the attention of a driver and/or used to generate warning signals and/or to intervene automatically in a driving behavior of the motor vehicle.

The structure shown in FIG. 11 can be modified in diverse ways in the context of the present invention. Thus, by way of example, the at least one illumination source 142 can also be integrated directly into the detector 110, such that, by way of example, as described above, the detector 110 can emit primary radiation 144 in the direction of, for example, another motor vehicle, in particular a motor vehicle ahead. Said radiation can then be for example reflected and/or scattered and/or used for excitation there and can be directed as electromagnetic radiation 134 back to the detector 110 again. Thus, by way of example, motor vehicles could also be equipped with one or a plurality of reflectors which can foster this reflection process. Furthermore, generally the at least one detector can be embodied for carrying out monitoring of the surroundings of a motor vehicle, for example by a viewing direction of the detector 110 and/or a radiation direction of the primary radiation 144 being made variable. Various other embodiments are conceivable.

In contrast for example to conventional triangulation methods, propagation time methods, image evaluation methods or similar methods for identifying distances, the detector 110 according to the invention and the distance measuring device 180 according to the invention afford the advantage of a simpler structure, in particular without the need for digital data analysis, a faster reaction and a more cost-effective embodiment.

Imaging Device

FIGS. 12A-14 show that the detector 110 according to the invention can advantageously also be used in an imaging device 196 for imaging at least one sample 198. In this case, the sample 198 serves as the object 112. The measurement principle of the imaging device 196 can, in principle, be analogous, similar or even identical to the principle of the distance measuring device 180 described above, although (which is also possible, in principle, in the context of the distance measuring device 180) a plurality of points and/or regions of the at least one object 112 or of the sample 198 can be detected.

Figure 12A:
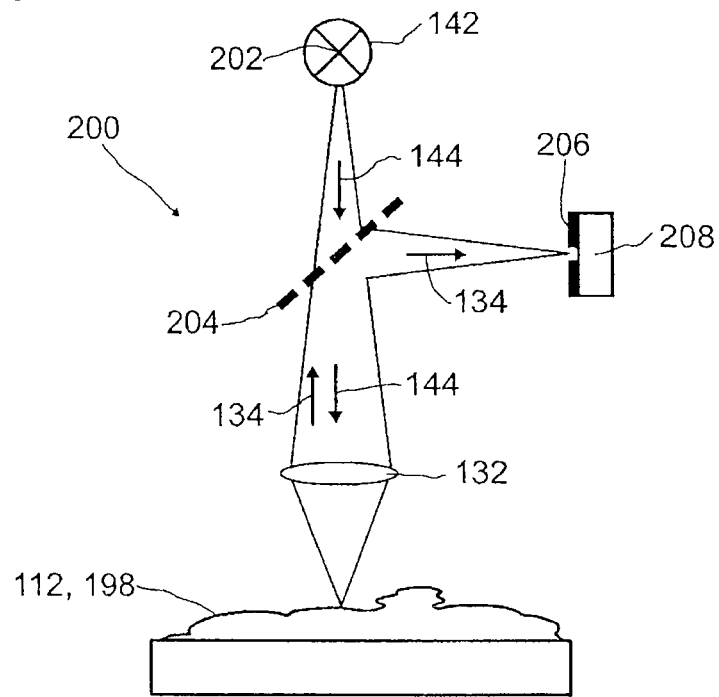
FIGS. 12A and 12B show a comparison of a conventional imaging device (FIG. 12A) having a confocal beam path with an imaging device according to the invention (FIG. 12B)

FIG. 12A shows an imaging device 196 corresponding to the prior art in the form of a conventional confocal microscope having a confocal beam path. The confocal microscope has an illumination source 142, for example a laser, the focus of which is designated symbolically by the reference numeral 202 in FIG. 12A. Primary radiation 144 emerging from said illumination source 142 is directed by a beam splitter 204, for example a partly transmissive mirror and/or a beam splitter cube, onto the sample 198 and is focused for example by means of a lens 132 and/or an objective. Electromagnetic radiation 134 emerging from the sample 198 is directed by means of the beam splitter 204 onto a diaphragm 206, which is confocal with respect to the focus 202, and a sensor 208 lying behind said diaphragm. What is achieved by the confocal structure is that only light from the region of the image of the focus 202 can pass through the diaphragm 206 by means of the lens 132 in the sample 198 and can be detected by the sensor 208, for example a conventional semiconductor sensor. Light from other regions is at least substantially masked out by the diaphragm 206.

Figure 12B:
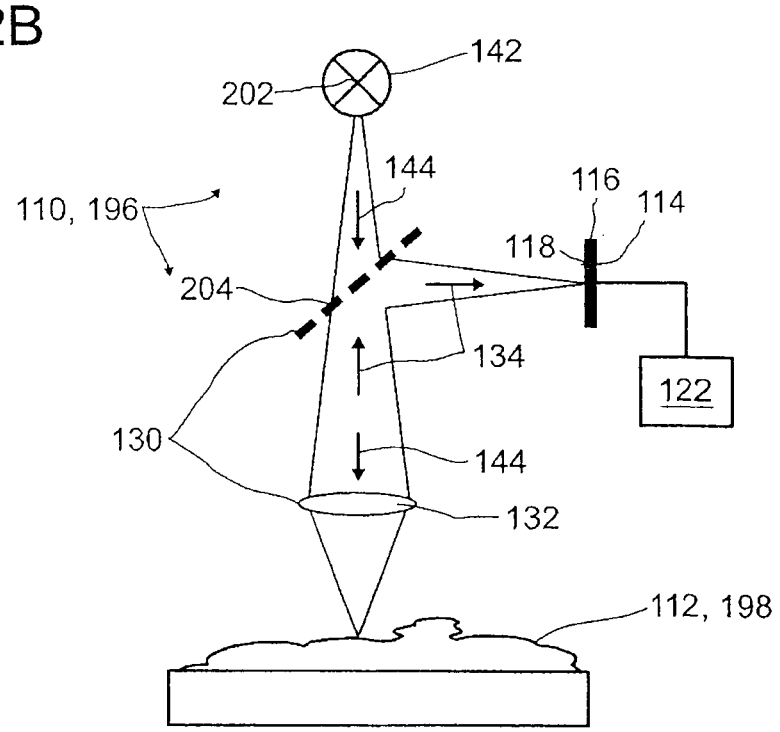

By contrast, FIG. 12B illustrates an exemplary embodiment of an imaging device 196 according to the invention. The structure can for example substantially correspond to the structure in accordance with FIG. 12A, but the diaphragm 206 can be obviated in that the sensor 208 can be replaced by an optical sensor 114 having the inventive properties of sensitivity relative to a geometry of the illumination of the sensor region 116.

From at least one known relationship between the sensor signal and at least one item of geometrical information (optionally by means of at least one intermediate step of determining a geometry of the illumination from the sensor signal and at least one optional intermediate step of determining the geometrical information from the geometry of the illumination), it is then possible to deduce from what depth of the sample 198 the electromagnetic radiation 134 originates. This can for example be effected once again by means of the evaluation device 122.

In this way, by way of example, an item of location information about the location of the origin of the electromagnetic radiation 134 can be generated, such that the sample 198 can be scanned, for example, and an item of information about a surface of the sample is in each case obtained, for example. Alternatively or additionally, it is also possible to obtain items of information from deeper regions of the sample 198. The optional transfer device 130 can comprise for example at least one scanning device, for example one or a plurality of movable mirrors, such that, for example, a line scan or else an area scan can be carried out on the sample 198. Such scanning devices are known for example from the field of confocal microscopy.

Furthermore, the optional transfer device 130 in the structure shown in FIG. 12B or else in other embodiments of devices and detectors 110 according to the invention can also comprise one or a plurality of wavelength-selective elements, for example wavelength-selective filters and/or wavelength-selective deflection elements such as, for example, one or a plurality of dichroic mirrors.

One advantage of the imaging device 196 illustrated in FIG. 12B in comparison with the conventional imaging device in accordance with FIG. 12A consists generally in a higher z-resolution, that is to say a higher resolution in the direction perpendicular to the sample 198, in a higher light intensity, since the need to use a diaphragm 206 is obviated, a higher insensitivity toward a transverse offset of an optical axis and the diaphragm 206, and a high intensity at an optimum z-resolution. Furthermore, the structure of the imaging device 196 according to the invention can be greatly simplified in comparison with conventional imaging devices 196, since generally, for example, by means of the detector 110, it is possible to generate not only an item of information about a total power of the electromagnetic radiation 134, but at least one item of geometrical information, for example at least one item of location information.

Figure 13:
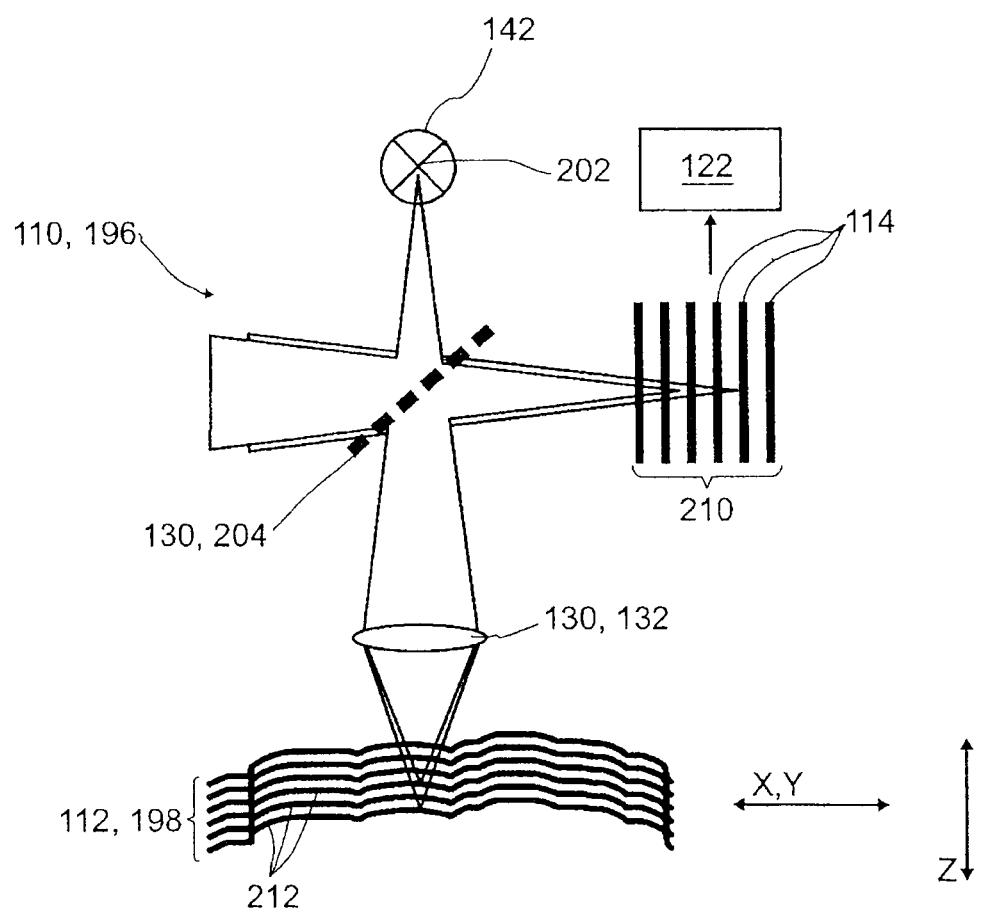
FIGS. 13 and 14 show further possible embodiments of imaging devices according to the invention.
Figure 14:
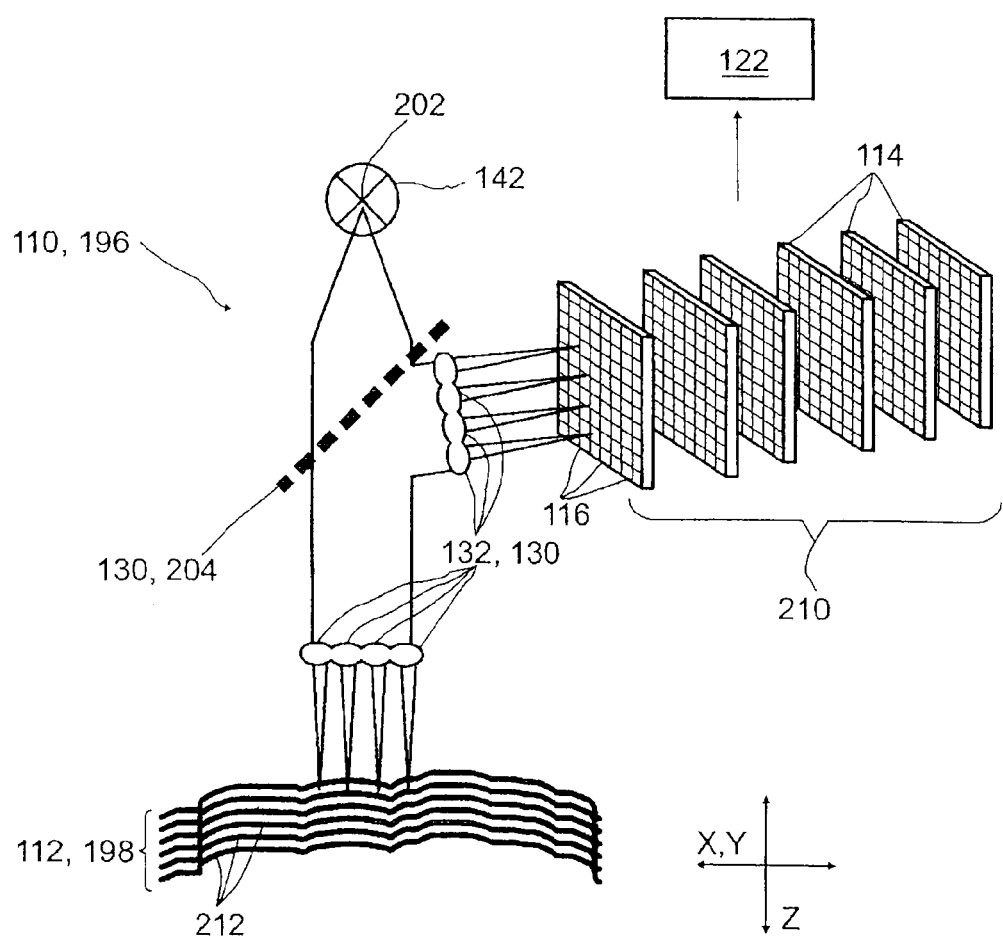

FIGS. 13 and 14 show modifications of the structure of the imaging device shown in FIG. 12B, once again in a highly schematic illustration. Thus, FIG. 13 shows a structure in which the detector 110 comprises a stack 210 of optical sensors 114. By way of example, the optical sensors 114 can be embodied such that they are fully or partly transparent. By means of these different sensors 114, which for example can in each case be aligned with the focus from a specific layer 212 or depth of the sample 198 or can be designed to receive signals corresponding to the electromagnetic radiation 134 emerging from said layer 212, a depth resolution in the z-direction perpendicular to the sample 198 can be automatically effected, without the optional transfer device 130 having to be designed for a movement in the z-direction. However, a scanning device parallel to the sample 198, which is designated by x, y in FIGS. 13 and 14, can nevertheless still be provided, for example for carrying out a line or area scan.

FIG. 14 shows a development of the exemplary embodiment in accordance with FIG. 13. This exemplary embodiment shows that in the detector 110 generally and in particular preferably in an imaging device 196, according to the invention, one or a plurality of sensors 114 can be provided, which can in each case have a plurality of sensor regions 116, for example in a matrix arrangement. This is merely indicated schematically in FIG. 14. For each of said sensor regions 116, by way of example, an evaluation method in accordance with the above description can be carried out, for example in order to generate at least one item of geometrical information, in particular at least one item of location information, about the at least one object 112 or a partial region of the object 112, for example that partial region from which the electromagnetic radiation 134 that impinges on the respective sensor region 116 originates. In order to ensure the spatial resolution, the optional transfer device 130 can have for example a plurality of lenses 132. By way of example, the transfer device 130, as illustrated in FIG. 14, can have at least one lens array in order, for example, in a targeted manner, to assign lateral regions of a layer of the sample 212 in each case to a sensor region 116 of an optical sensor 114. In this way, a lateral spatial resolution in the x, y direction parallel to the layers 212 can simultaneously be effected by evaluation of the sensor signals of the individual sensor regions 116 of the sensor array, and depth information can be effected by evaluation of the optical sensors 114 arranged one behind another. In this case, a three-dimensional region of the sample 198 can be imaged simultaneously.

Human-Machine Interface and Entertainment Device

Figure 15:
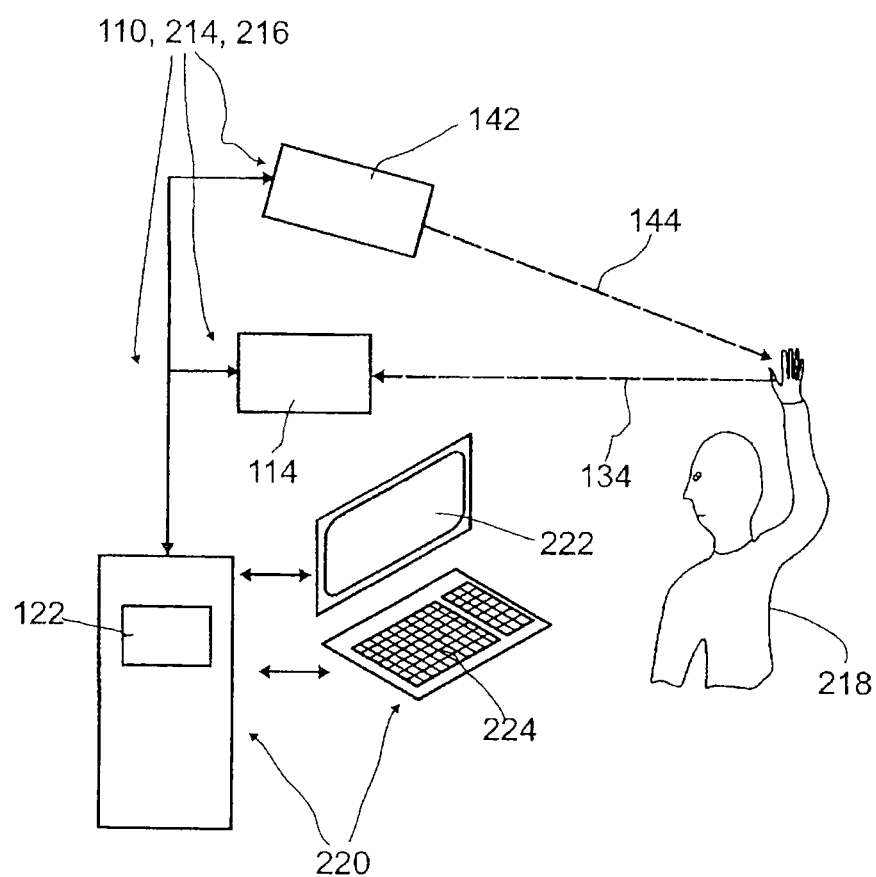
FIG. 15 shows an exemplary embodiment of a human-machine interface and of an entertainment device according to the present invention.

FIG. 15 shows an exemplary embodiment of a human-machine interface 214 according to the invention, which can simultaneously also be embodied as an exemplary embodiment of an entertainment device 216 or can be a constituent part of such an entertainment device 216.

By way of example, at least one detector 110 according to the present invention can once again be provided, for example in accordance with one or more of the embodiments described above, with one or a plurality of optical sensors 114. Further elements of the detector 110 can be provided, which are not illustrated in FIG. 15, such as, for example, elements of an optional transfer device 130. Furthermore, one or a plurality of illumination sources 142 can be provided. Generally, with regard to possible embodiments of the detector 110, reference can be made for example to the description above.

The human-machine interface 214 can be designed to make it possible to exchange at least one item of information between a user 218 of a machine 220, which is merely indicated in FIG. 15, and the machine 220, for example to exchange control commands. The machine 220 can comprise, in principle, any desired device having at least one function which can be controlled and/or influenced in some way. At least one optional evaluation device 122 of the at least one detector 110 or a part thereof can, as indicated in FIG. 15, be wholly or partly integrated into said machine 220, but can, in principle, also be formed separately from the machine 220.

The human-machine interface can be designed for example to generate, by means of the detector 112, at least one item of geometrical information, in particular at least one item of location information, of the user and to assign to the geometrical information at least one item of information, in particular at least one control command. For this purpose, by way of example, by means of the detector 110, a movement and/or a change in posture of the user 218 can be identified, for example, as indicated in FIG. 15, a hand movement and/or a specific hand posture. If, by way of example, such a hand movement and/or hand posture of a specific type is identified, for example by evaluation of one or a plurality of items of geometrical information, in particular items of location information, of the user 218, then it is possible to recognize, for example by comparison with a corresponding command list, that the user 218 would like to effect a specific input, for example would like to give the machine 220 a control command. As an alternative or in addition to direct geometrical information about the actual user 218, it is also possible, for example, to generate at least one item of geometrical information about a garment of the user 218 and/or an article moved by the user 218.

The machine 220 can furthermore comprise one or a plurality of further human-machine interfaces, which need not necessarily be embodied according to the invention, for example, as indicated in FIG. 15, at least one display 222 and/or at least one keyboard 224. The machine 220 can be, in principle, any desired type of machine or combination of machines.

In the context of an entertainment device 216, said machine 220 can be designed for example to carry out at least one entertainment function, for example at least one game, in particular with at least one graphical display on the display 222 and optionally a corresponding audio output. The user 218 can input at least one item of information for example via the human-machine interface, wherein the entertainment device is designed to alter the entertainment function in accordance with the information. By way of example, specific movements of virtual articles, for example of virtual persons in a game and/or movements of virtual vehicles in a game, can be controlled by means of corresponding movements of the user 218, which are in turn recognized by the detector 110. Other types of control of at least one entertainment function by the user 218 by means of the at least one detector 110 are also possible.

Security Device

Figure 16:
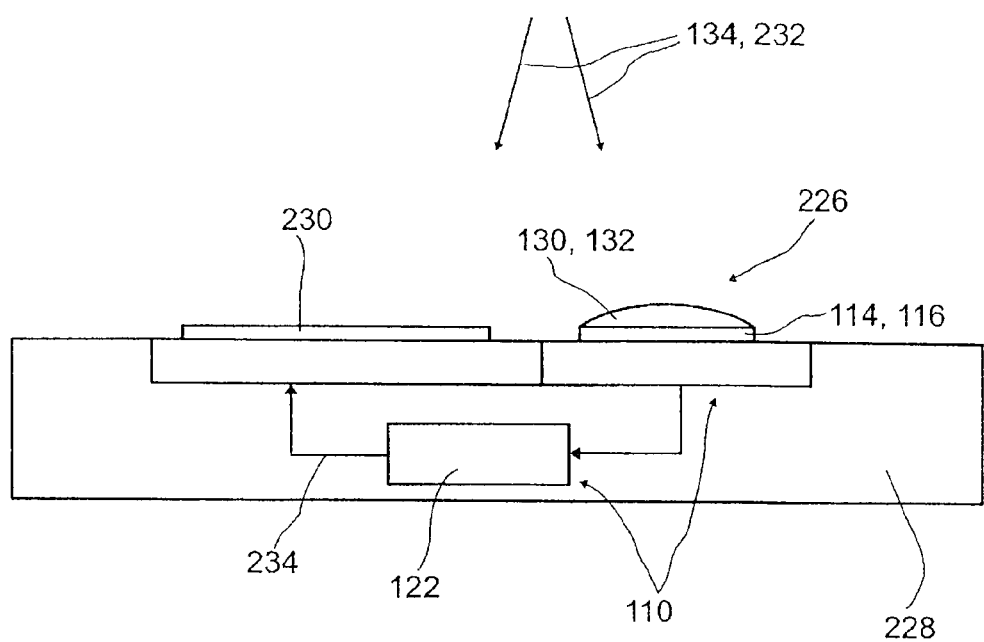
FIG. 16 shows an exemplary embodiment of a security device according to the invention.

FIG. 16 shows an exemplary embodiment of a security device 226 according to the invention. Said security device 226 can be integrated for example into a memory device 228 having at least one optical data storage device 230. The security device 226 once again comprises at least one detector 110, for example of the type described above. The detector 110 once again comprises at least one optical sensor 114 and optionally at least one transfer device 130, for example at least one lens 132, for example in the form of a printed lens and/or a printed lens array. As explained above, however, the detector 110 of the security device 226 can also be embodied without a transfer device 130. Furthermore, the detector 110 once again comprises at least one evaluation device 122 for evaluating signals of the optical sensor 114.

The security device 226 is designed to carry out at least one security application. In particular, it can be designed to identify and/or avoid access to data of the optical data storage device 230. In general, one or a plurality of reading beams 232 are used for reading out the data of the optical data storage device 230. By way of example, this can involve focused reading beams in order to read individual information modules of the optical data storage device 230, the lateral resolution of which is typically in the range of a few hundred nanometers to a few tens or a few hundreds of micrometers. The security device 226 can be arranged so close to the optical data storage device 230 and/or be completely or partly integrated into the optical data storage device 230 such that the reading beam 232 or the reading beams 232 also impinge on the security device 226.

In contrast to impingement of diffuse light on the optical sensor 114 and the sensor region 116 thereof, which would lead to a comparatively low sensor signal, the impingement of focused light, for example of a focused reading beam 232, in particular of a focused laser beam, generally leads to a strongly boosted sensor signal, which can be identified by the evaluation device 122. This effect generally occurs—on account of the above-described geometry dependence of the sensor signal—even when the reading beam 232 has a very weak total power which does not exceed a total power of ambient light impinging on the sensor region 116.

Accordingly, the evaluation device 122 and/or other components of the memory device 228 or some other device which comprises the security device 226 can implement corresponding measures if a reading beam 232 is identified. In particular, the evaluation device 122 can output, via at least one interface 234, at least one warning signal which indicates, for example, that an attempt at reading by means of focused reading beams 232 has been effected. In accordance with this identification and the warning signal, a memory bit can be altered, for example, which indicates that the optical data storage device 230 has already been read once. Alternatively or additionally, other measures can be implemented, for example outputting of a corresponding warning to a user and/or administrator and/or destruction of the optical data storage device 230, such that an optical data storage device 230 that can only be read once can be generated.

The security device 226 described can be integrated into various types of devices. Thus, it is possible, for example, to equip optical data storage devices 230 in the form of optical ROMs according to the invention. Optical data storage devices 230 in the form, for example, of holographic data storage devices and/or in the form of bar codes can also be embodied accordingly. In this way, it is possible for example to ensure, for example by the destruction of the optical data storage device 230 after the latter has been read once, that the optical data storage device 230 and/or the memory device 228, for example an entry card and/or a ticket, can only be used once. Various other embodiments of the security device are conceivable.

SYNTHESIS EXAMPLES

Syntheses of various compounds which can be used in dye solar cells 154 in the context of the present invention, in particular as p-type semiconductors 166, are listed by way of example hereinafter. Possible syntheses of compounds of the formula (I) are described, for example:

(A) General Synthesis Schemes for Preparation of Compounds of the Formula I (a) Synthesis Route I:

(a 1) Synthesis Step I-R1:

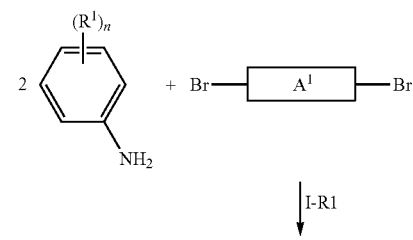

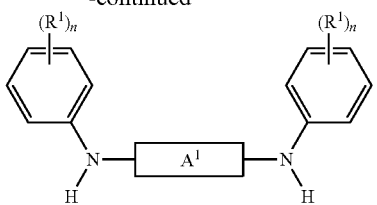

The synthesis in synthesis step I-R1 was based on the references cited below:
a) Liu, Yunqi; Ma, Hong; Jen, Alex K-Y.; CHCOFS; Chem. Commun.; 24; 1998; 2747-2748,
b) Goodson, Felix E.; Hauck, Sheila; Hartwig, John F.; J. Am. Chem. Soc.; 121; 33; 1999; 7527-7539,
c) Shen, Jiun Yi; Lee, Chung Ying; Huang, Tai-Hsiang; Lin, Jiann T.; Tao, Yu-Tai; Chien, Chin-Hsiung; Tsai, Chiitang; J. Mater. Chem.; 15; 25; 2005; 2455-2463,
d) Huang, Ping-Hsin; Shen, Jiun-Yi; Pu, Shin-Chien; Wen, Yuh-Sheng; Lin, Jiann T.; Chou, Pi-Tai; Yeh, Ming-Chang P.; J. Mater. Chem.; 16; 9; 2006; 850-857,
e) Hirata, Narukuni; Kroeze, Jessica E.; Park, Taiho; Jones, David; Haque, Saif A.; Holmes, Andrew B.; Durrant, James R.; Chem. Commun.; 5; 2006; 535-537.

(a2) Synthesis Step I-R2:

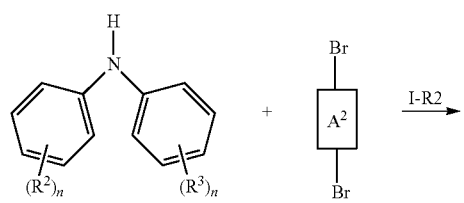

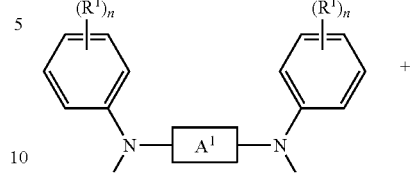

The synthesis in synthesis step I-R2 was based on the references cited below:
a) Huang, Qinglan; Evmenenko, Guennadi; Dutta, Pulak; Marks, Tobin J.; J. Am. Chem. Soc.; 125; 48; 2003; 14704-14705,
b) Bacher, Erwin; Bayerl, Michael; Rudati, Paula; Reckefuss, Nina; Mueller, C. David; Meerholz, Klaus; Nuyken, Oskar; Macromolecules; EN; 38; 5; 2005; 1640-1647,
c) Li, Zhong Hui; Wong, Man Shing; Tao, Ye; D'Iorio, Marie; J. Org. Chem.; EN; 69; 3; 2004; 921-927.

(a3) Synthesis Step I-R3:

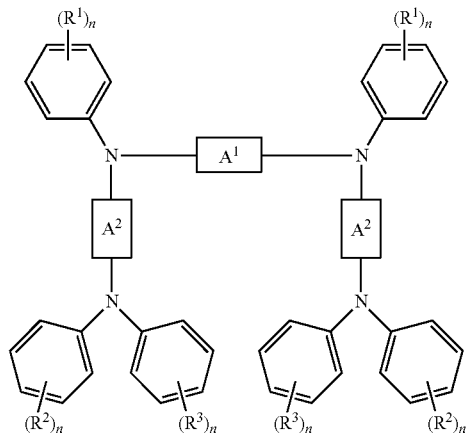

The synthesis in synthesis step I-R3 was based on the reference cited below:
J. Grazulevicius; J. of Photochem. and Photobio., A: Chemistry 2004 162(2-3), 249-252.

The compounds of the formula I can be prepared via the sequence of synthesis steps shown above in synthesis route I. In steps (I-R1) to (I-R3), the reactants can be coupled, for example, by Ullmann reaction with copper as a catalyst or under palladium catalysis.

(b) Synthesis Route II:
(b1) Synthesis Step II-R1:

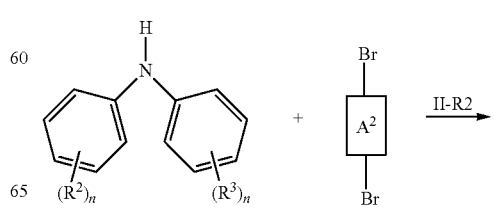

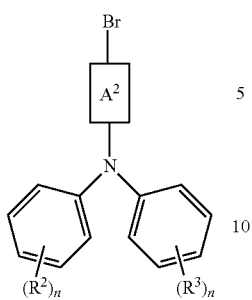

The synthesis in synthesis step II-R1 was based on the references cited under I-R2.

(b2) Synthesis Step II-R2:

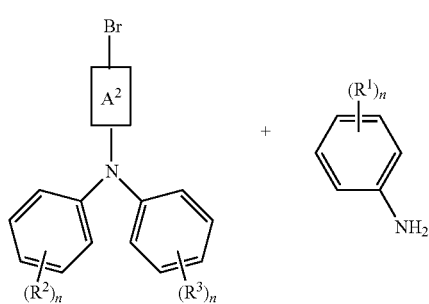

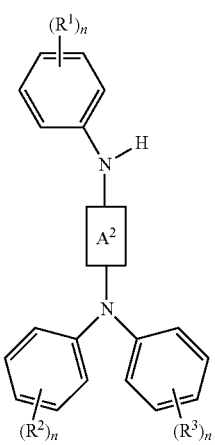

The synthesis in synthesis step II-R2 was based on the references cited below:

a) Bacher, Erwin; Bayerl, Michael; Rudati, Paula; Reckefuss, Nina; Müller, C. David; Meerholz, Klaus; Nuyken, Oskar; Macromolecules; 38; 5; 2005; 1640-1647, b) Goodson, Felix E.; Hauck, Sheila; Hartwig, John F.; J. Am. Chem. Soc.; 121; 33; 1999; 7527-7539; Hauck, Sheila I.; Lakshmi, K. V.; Hartwig, John F.; Org. Lett.; 1; 13; 1999; 2057-2060.

(b3) Synthesis Step II-R3:

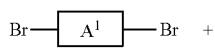

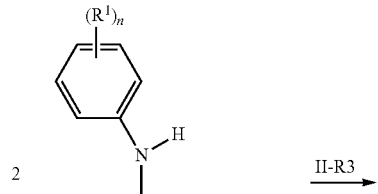

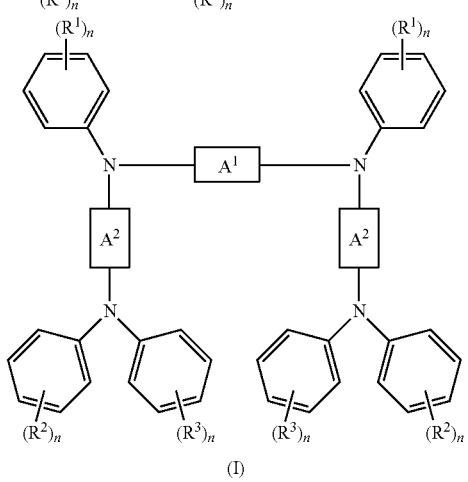

The compounds of the formula I can be prepared via the sequence of synthesis steps shown above in synthesis route II. In steps (II-R1) to (II-R3), the reactants can be coupled, as also in synthesis route I, for example, by Ullmann reaction with copper as a catalyst or under palladium catalysis.

(c) Preparation of the Starting Amines:

When the diarylamines in synthesis steps I-R2 and II-R1 of synthesis routes I and II are not commercially available, they can be prepared, for example, by Ullmann reaction with copper as a catalyst or under palladium catalysis, according to the following reaction:

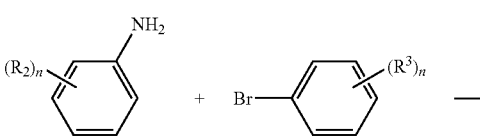

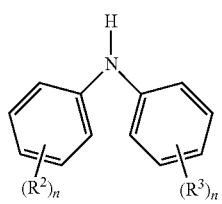

The synthesis was based on the review articles listed below:

Palladium-Catalyzed C—N Coupling Reactions:
a) Yang, Buchwald; J. Organomet. Chem. 1999, 576 (1-2), 125-146,
b) Wolfe, Marcoux, Buchwald; Acc. Chem. Res. 1998, 31, 805-818,
c) Hartwig; Angew. Chem. Int. Ed. Engl. 1998, 37, 2046-2067.

Copper-Catalyzed C—N Coupling Reactions:
a) Goodbrand, Hu; Org. Chem. 1999, 64, 670-674,
b) Lindley; Tetrahedron 1984, 40, 1433-1456.

(B) Synthesis Example 1

Synthesis of the Compound ID367 (Synthesis Route I)

(B1): Synthesis Step According to General Synthesis Scheme I-R1:

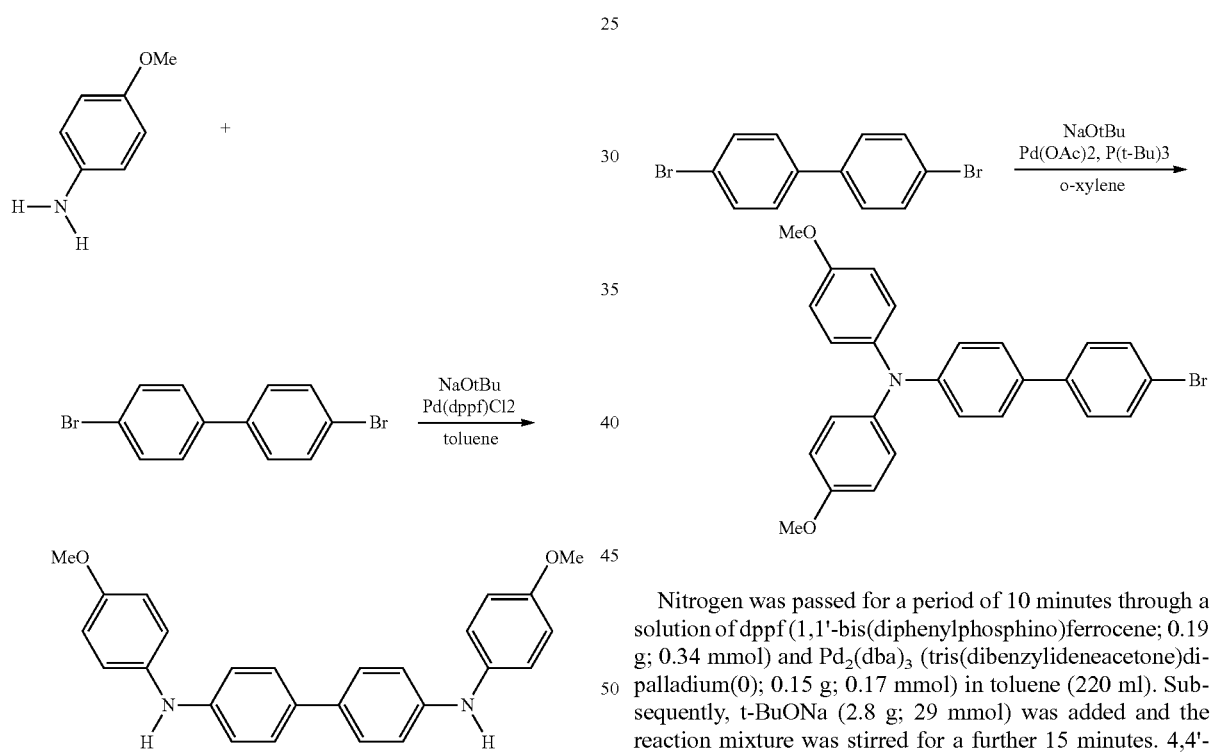

A mixture of 4,4'-dibromobiphenyl (93.6 g; 300 mmol), 4-methoxyaniline (133 g; 1.08 mol), Pd(dppf)Cl$_2$ (Pd(1,1'-bis(diphenylphosphino)ferrocene)Cl$_2$; 21.93 g; 30 mmol) and t-BuONa (sodium tert-butoxide; 109.06 g; 1.136 mol) in toluene (1500 ml) was stirred under a nitrogen atmosphere at 110° C. for 24 hours. After cooling, the mixture was diluted with diethyl ether and filtered through a Celite® pad (from Carl Roth). The filter bed was washed with 1500 ml each of ethyl acetate, methanol and methylene chloride. The product was obtained as a light brown solid (36 g; yield: 30%).

$^1$H NMR (400 MHz, DMSO): δ 7.81 (s, 2H), 7.34-7.32 (m, 4H), 6.99-6.97 (m, 4H), 6.90-6.88 (m, 4H), 6.81-6.79 (m, 4H), 3.64 (s, 6H).

(B2): Synthesis Step According to General Synthesis Scheme I-R2:

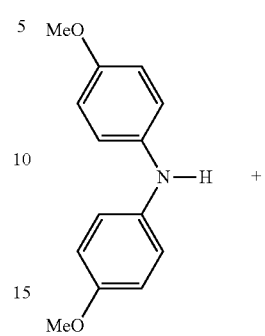

Nitrogen was passed for a period of 10 minutes through a solution of dppf (1,1'-bis(diphenylphosphino)ferrocene; 0.19 g; 0.34 mmol) and Pd$_2$(dba)$_3$ (tris(dibenzylideneacetone)dipalladium(0); 0.15 g; 0.17 mmol) in toluene (220 ml). Subsequently, t-BuONa (2.8 g; 29 mmol) was added and the reaction mixture was stirred for a further 15 minutes. 4,4'-Dibromobiphenyl (25 g; 80 mmol) and 4,4'-dimethoxydiphenylamine (5.52 g; 20 mmol) were then added successively. The reaction mixture was heated at a temperature of 100° C. under a nitrogen atmosphere for 7 hours. After cooling to room temperature, the reaction mixture was quenched with ice-water, and the precipitated solid was filtered off and dissolved in ethyl acetate. The organic layer was washed with water, dried over sodium sulfate and purified by column chromatography (eluent: 5% ethyl acetate/hexane). A pale yellow solid was obtained (7.58 g, yield: 82%).

$^1$H NMR (300 MHz, DMSO-d$_6$): 7.60-7.49 (m, 6H), 7.07-7.04 (m, 4H), 6.94-6.91 (m, 4H), 6.83-6.80 (d, 2H), 3.75 (s, 6H).

(B3): Synthesis Step According to General Synthesis Scheme I-R3:

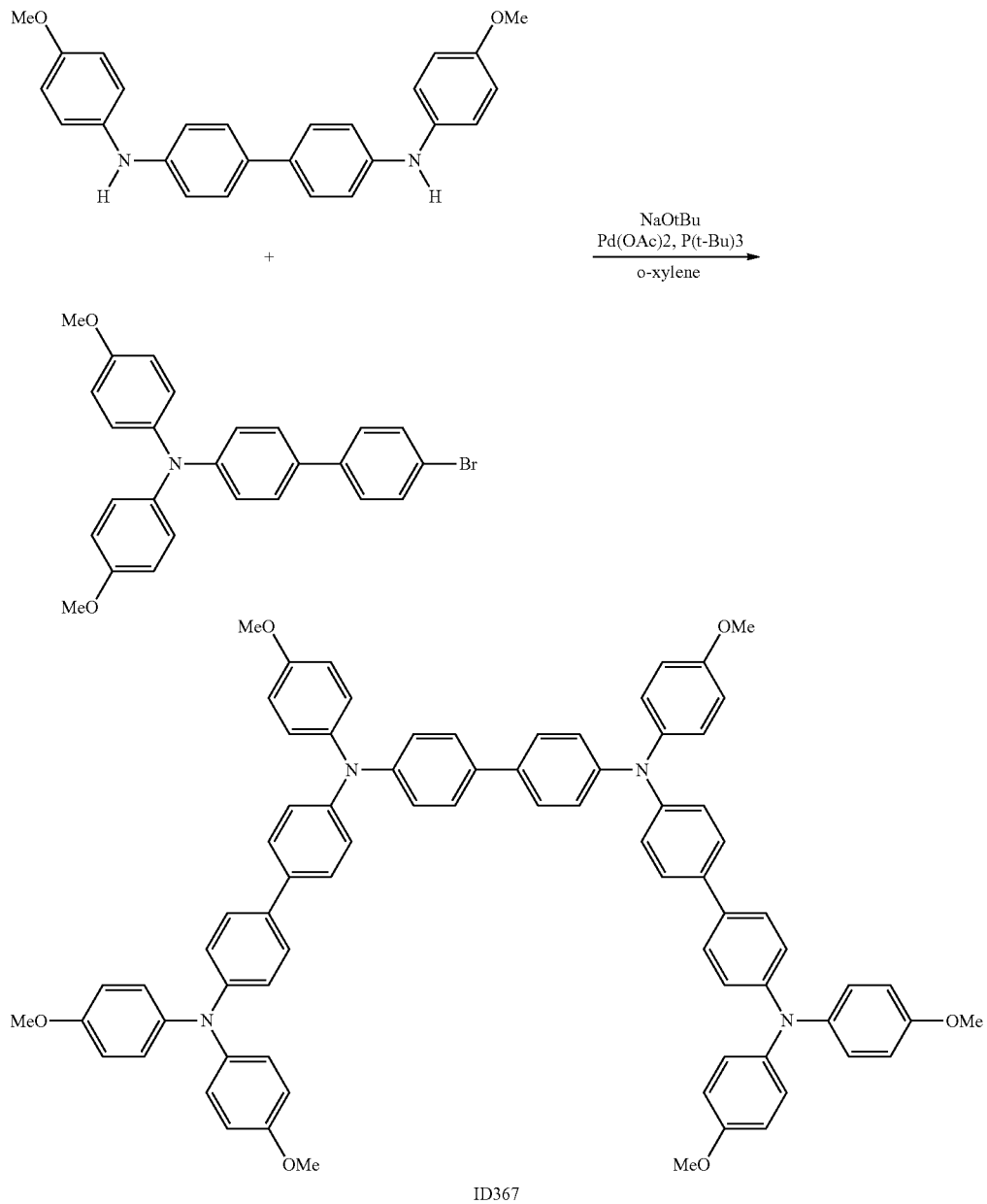

ID367

N[4],N[4']-Bis(4-methoxyphenyl)biphenyl-4,4'-diamine (product from synthesis step I-R1; 0.4 g; 1.0 mmol) and product from synthesis step I-R2 (1.0 g; 2.2 mmol) were added under a nitrogen atmosphere to a solution of t-BuONa (0.32 g; 3.3 mmol) in o-xylene (25 ml). Subsequently, palladium acetate (0.03 g; 0.14 mmol) and a solution of 10% by weight of P(t-Bu)$_3$ (tris-t-butylphosphine) in hexane (0.3 ml; 0.1 mmol) were added to the reaction mixture which was stirred at 125° C. for 7 hours. Thereafter, the reaction mixture was diluted with 150 ml of toluene and filtered through Celite®, and the organic layer was dried over Na$_2$SO$_4$. The solvent was removed and the crude product was reprecipitated three times from a mixture of tetrahydrofuran (THF)/methanol. The solid was purified by column chromatography (eluent: 20% ethyl acetate/hexane), followed by a precipitation with THF/methanol and an activated carbon purification. After removing the solvent, the product was obtained as a pale yellow solid (1.0 g, yield: 86%).

$^1$H NMR (400 MHz, DMSO-d$_6$): 7.52-7.40 (m, 8H), 6.88-7.10 (m, 32H), 6.79-6.81 (d, 4H), 3.75 (s, 6H), 3.73 (s, 12H).

(C) Synthesis Example 2

Synthesis of the Compound ID447 (Synthesis Route II)

(C1) Synthesis Step According to General Synthesis Scheme II-R2:

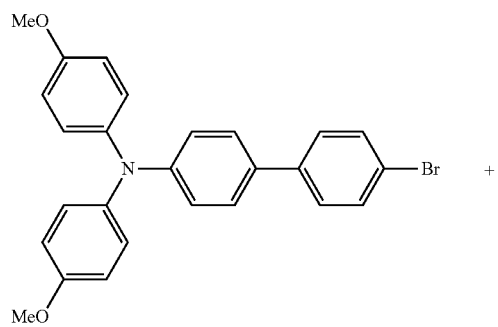

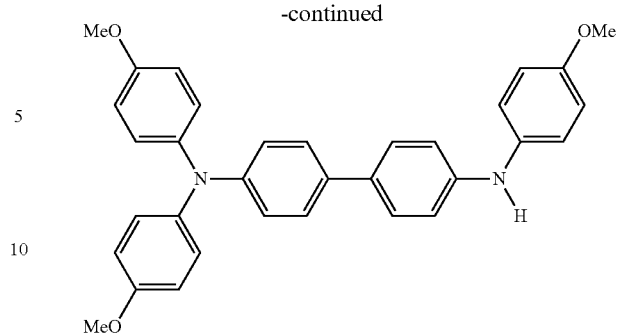

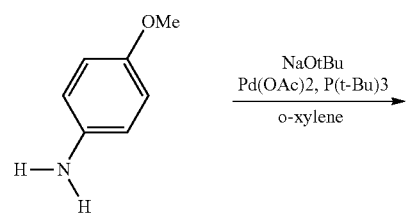

p-Anisidine (5.7 g, 46.1 mmol), t-BuONa (5.5 g, 57.7 mol) and P(t-Bu)$_3$ (0.62 ml, 0.31 mmol) were added to a solution of the product from synthesis step I-R2 (17.7 g, 38.4 mmol) in toluene (150 ml). After nitrogen had been passed through the reaction mixture for 20 minutes, Pd$_2$(dba)$_3$ (0.35 g, 0.38 mmol) was added. The resulting reaction mixture was left to stir under a nitrogen atmosphere at room temperature for 16 hours. Subsequently, it was diluted with ethyl acetate and filtered through Celite®. The filtrate was washed twice with 150 ml each of water and saturated sodium chloride solution. After the organic phase had been dried over Na$_2$SO$_4$ and the solvent had been removed, a black solid was obtained. This solid was purified by column chromatography (eluent: 0-25% ethyl acetate/hexane). This afforded an orange solid (14 g, yield: 75%).

$^1$H NMR (300 MHz, DMSO): 7.91 (s, 1H), 7.43-7.40 (d, 4H), 7.08-6.81 (m, 16H), 3.74 (s, 6H), 3.72 (s, 3H).

(C1) Synthesis Step According to General Synthesis Scheme II-R3.

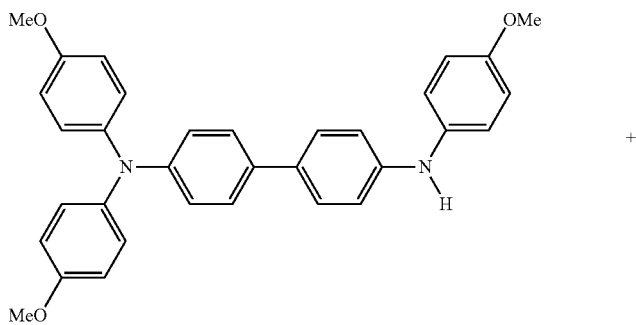

+

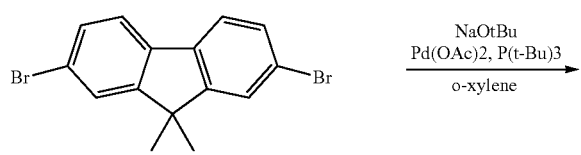

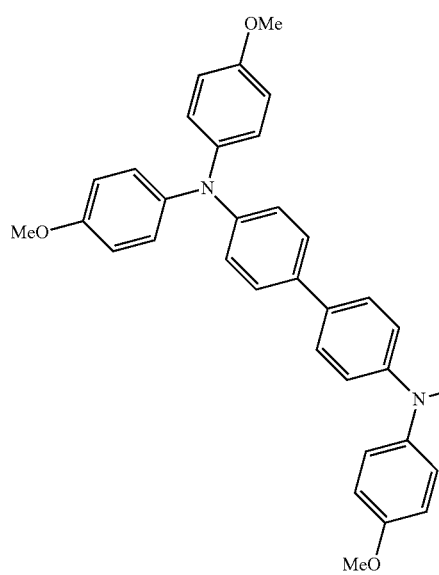
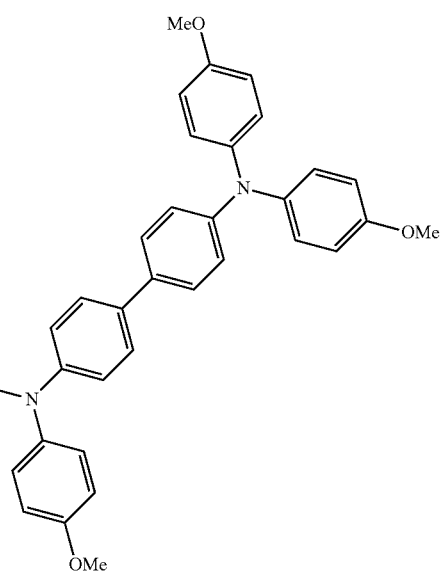

ID447 t-BuONa (686 mg; 7.14 mmol) was heated at 100° C. under reduced pressure, then the reaction flask was purged with nitrogen and allowed to cool to room temperature. 2,7-Dibromo-9,9-dimethylfluorene (420 mg; 1.19 mmol), toluene (40 ml) and Pd[P($^t$Bu)$_3$]$_2$ (20 mg; 0.0714 mmol) were then added, and the reaction mixture was stirred at room temperature for 15 minutes. Subsequently, N,N,N'-p-trimethoxytriphenylbenzidine (1.5 g; 1.27 mmol) was added to the reaction mixture which was stirred at 120° C. for 5 hours. The mixture was filtered through a Celite®/MgSO$_4$ mixture and washed with toluene. The crude product was purified twice by column chromatography (eluent: 30% ethyl acetate/hexane) and, after twice reprecipitating from THF/methanol, a pale yellow solid was obtained (200 mg, yield: 13%).

$^1$H NMR: (400 MHz, DMSO-d$_6$): 7.60-7.37 (m, 8H), 7.02-6.99 (m, 16H), 6.92-6.87 (m, 20H), 6.80-6.77 (d, 2H), 3.73 (s, 6H), 3.71 (s, 12H), 1.25 (s, 6H)

(D) Synthesis Example 3

Synthesis of the Compound ID453 (Synthesis Route I)

(D1) Preparation of the Starting Amine:
Step 1:

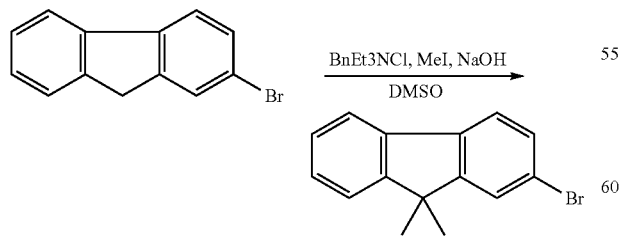

NaOH (78 g; 4 eq) was added to a mixture of 2-bromo-9H-fluorene (120 g; 1 eq) and BnEt$_3$NCl (benzyltriethylammonium chloride; 5.9 g; 0.06 eq) in 580 ml of DMSO (dimethylsulfoxide). The mixture was cooled with ice-water, and methyl iodide (MeI) (160 g; 2.3 eq) was slowly added dropwise. The reaction mixture was left to stir overnight, then poured into water and subsequently extracted three times with ethyl acetate. The combined organic phases were washed with a saturated sodium chloride solution and dried over Na$_2$SO$_4$, and the solvent was removed. The crude product was purified by column chromatography using silica gel (eluent: petroleum ether). After washing with methanol, the product (2-bromo-9,9'-dimethyl-9H-fluorene) was obtained as a white solid (102 g).

$^1$H NMR (400 MHz, CDCl$_3$): δ 1.46 (s, 6H), 7.32 (m, 2H), 7.43 (m, 2H), 7.55 (m, 2H), 7.68 (m, 1H)

Step 2:

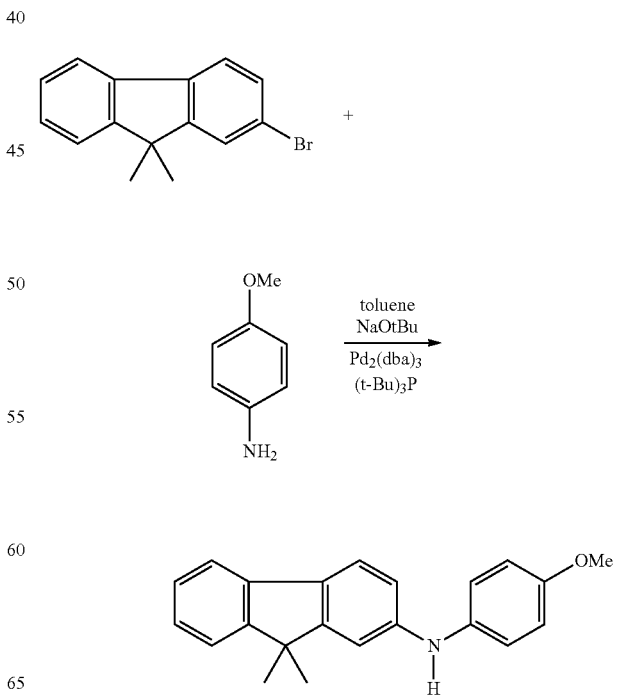

p-Anisidine (1.23 g; 10.0 mmol) and 2-bromo-9,9'-dimethyl-9H-fluorene (3.0 g; 11.0 mmol) were added under a nitrogen atmosphere to a solution of t-BuONa (1.44 g; 15.0 mmol) in 15 ml of toluene (15 ml). $Pd_2(dba)_3$ (92 mg; 0.1 mmol) and a 10% by weight solution of $P(t-Bu)_3$ in hexane (0.24 ml; 0.08 mmol) were added, and the reaction mixture was stirred at room temperature for 5 hours. Subsequently, the mixture was quenched with ice-water, and the precipitated solid was filtered off and dissolved in ethyl acetate. The organic phase was washed with water and dried over $Na_2SO_4$. After purifying the crude product by column chromatography (eluent: 10% ethyl acetate/hexane), a pale yellow solid was obtained (1.5 g, yield: 48%).

$^1$H NMR (300 MHz, $C_6D_6$): 7.59-7.55 (d, 1H), 7.53-7.50 (d, 1H), 7.27-7.22 (t, 2H), 7.19 (s, 1H), 6.99-6.95 (d, 2H), 6.84-6.77 (m, 4H), 4.99 (s, 1H), 3.35 (s, 3H), 1.37 (s, 6H).

(D2) Preparation of the Compound ID453 for Use in Accordance with the Invention (D2.1): Synthesis Step According to General Synthesis Scheme I-R2:

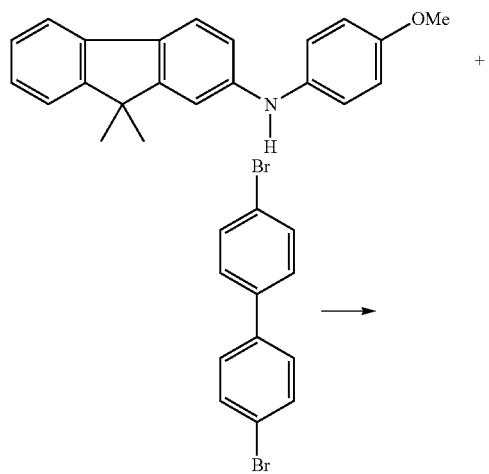

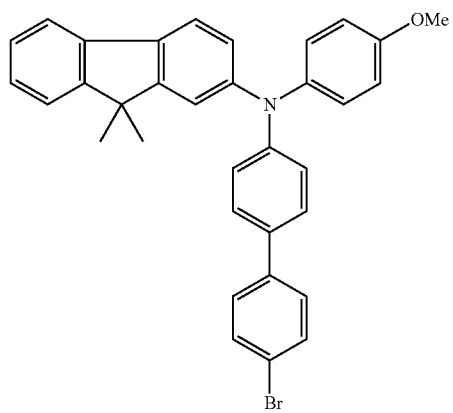

Product from a) (4.70 g; 10.0 mmol) and 4,4'-dibromobiphenyl (7.8 g; 25 mmol) were added to a solution of t-BuONa (1.15 g; 12 mmol) in 50 ml of toluene under nitrogen. $Pd_2(dba)_3$ (0.64 g; 0.7 mmol) and DPPF (0.78 g; 1.4 mmol) were added, and the reaction mixture was left to stir at 100° C. for 7 hours. After the reaction mixture had been quenched with ice-water, the precipitated solid was filtered off and it was dissolved in ethyl acetate. The organic phase was washed with water and dried over $Na_2SO_4$. After purifying the crude product by column chromatography (eluent: 1% ethyl acetate/hexane), a pale yellow solid was obtained (4.5 g, yield: 82%).

$^1$H NMR (400 MHz, DMSO-d6): 7.70-7.72 (d, 2H), 7.54-7.58 (m, 6H), 7.47-7.48 (d, 1H), 7.21-7.32 (m, 3H), 7.09-7.12 (m, 2H), 6.94-6.99 (m, 4H), 3.76 (s, 3H), 1.36 (s, 6H).

(D2.2) Synthesis Step According to General Synthesis Scheme I-R3:

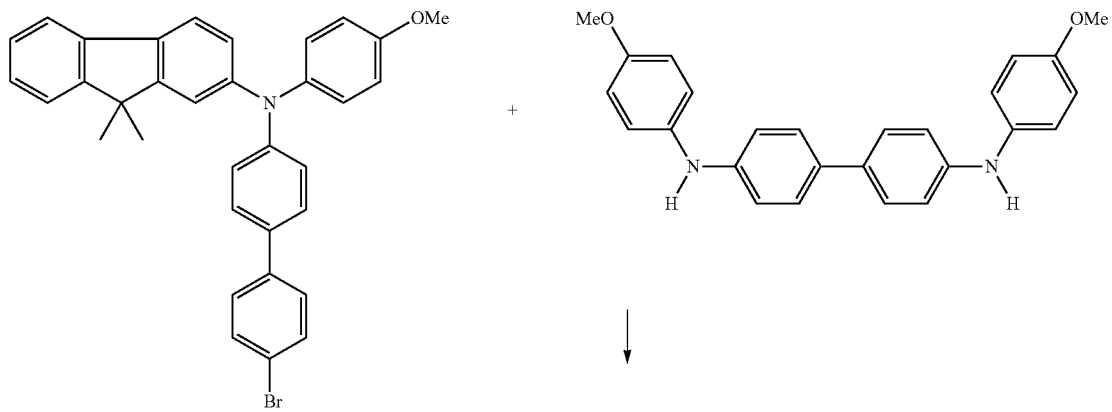

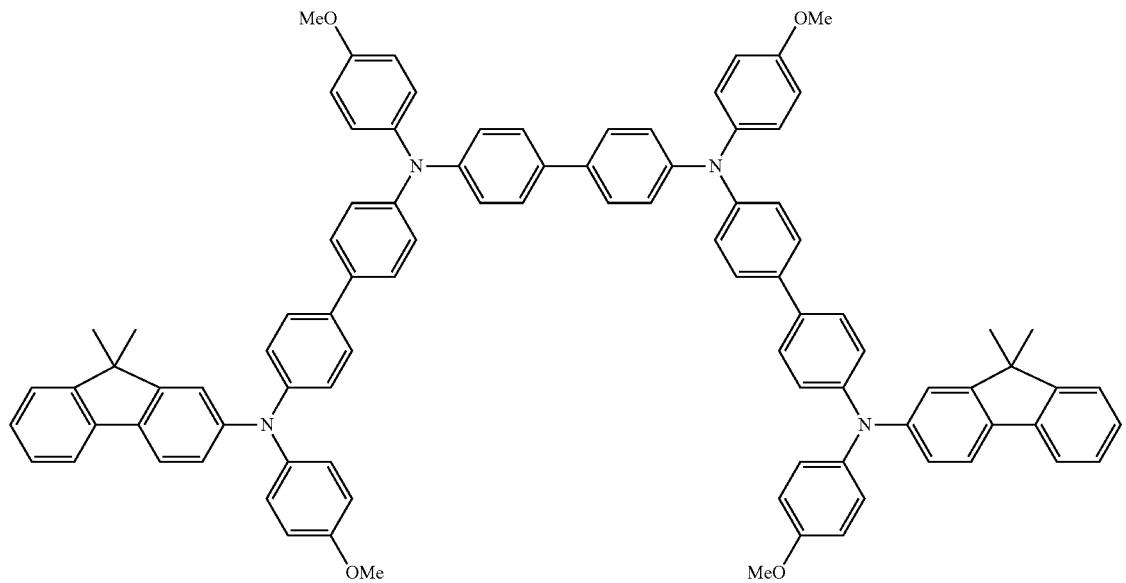

ID453

$N^4,N^{4'}$-Bis(4-methoxyphenyl)biphenyl-4,4'-diamine (0.60 g; 1.5 mmol) and product from the preceding synthesis step I-R2 (1.89 g; 3.5 mmol) were added under nitrogen to a solution of t-BuONa (0.48 g; 5.0 mmol) in 30 ml of o-xylene. Palladium acetate (0.04 g; 0.18 mmol) and P(t-Bu)$_3$ in a 10% by weight solution in hexane (0.62 ml; 0.21 mmol) were added, and the reaction mixture was stirred at 125° C. for 6 hours. Subsequently, the mixture was diluted with 100 ml of toluene and filtered through Celite®. The organic phase was dried over Na$_2$SO$_4$ and the resulting solid was purified by column chromatography (eluent: 10% ethyl acetate/hexane). This was followed by reprecipitation from THF/methanol to obtain a pale yellow solid (1.6 g, yield: 80%).

$^1$H NMR (400 MHz, DMSO-d$_6$): 7.67-7.70 (d, 4H), 7.46-7.53 (m, 14H), 7.21-7.31 (m, 4H), 7.17-7.18 (d, 2H), 7.06-7.11 (m, 8H), 6.91-7.01 (m, 22H), 3.75 (s, 12H), 1.35 (s, 12H).

(E) Further Compounds of the Formula I for Use in Accordance with the Invention

The compounds listed below were obtained analogously to the syntheses described above:

(E1) Synthesis Example 4

Compound ID320

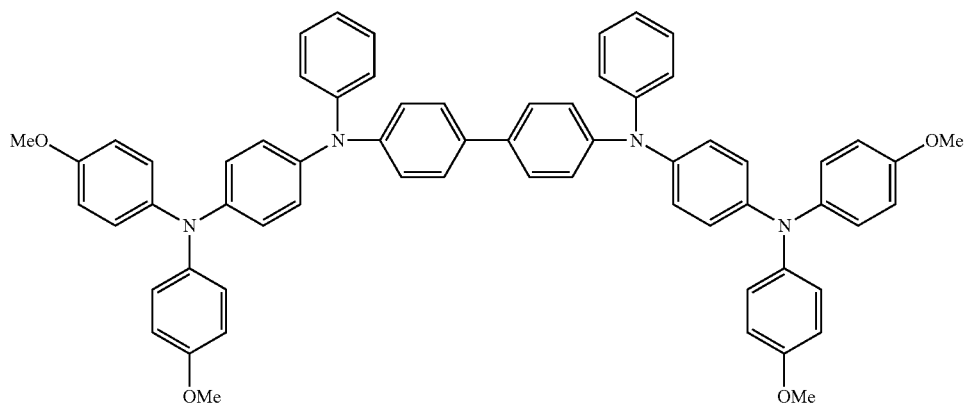 [SMILES: COc1ccc(N(c2ccc(OC)cc2)c2ccc(N(c3ccccc3)c3ccc(-c4ccc(N(c5ccccc5)c5ccc(N(c6ccc(OC)cc6)c6ccc(OC)cc6)cc5)cc4)cc3)cc2)cc1]

¹H NMR (300 MHz, THF-d₈): δ 7.43-7.46 (d, 4H), 7.18-7.23 (t, 4H), 7.00-7.08 (m, 16H), 6.81-6.96 (m, 18H), 3.74 (s, 12H)
(E2) Synthesis Example 5
Compound ID321
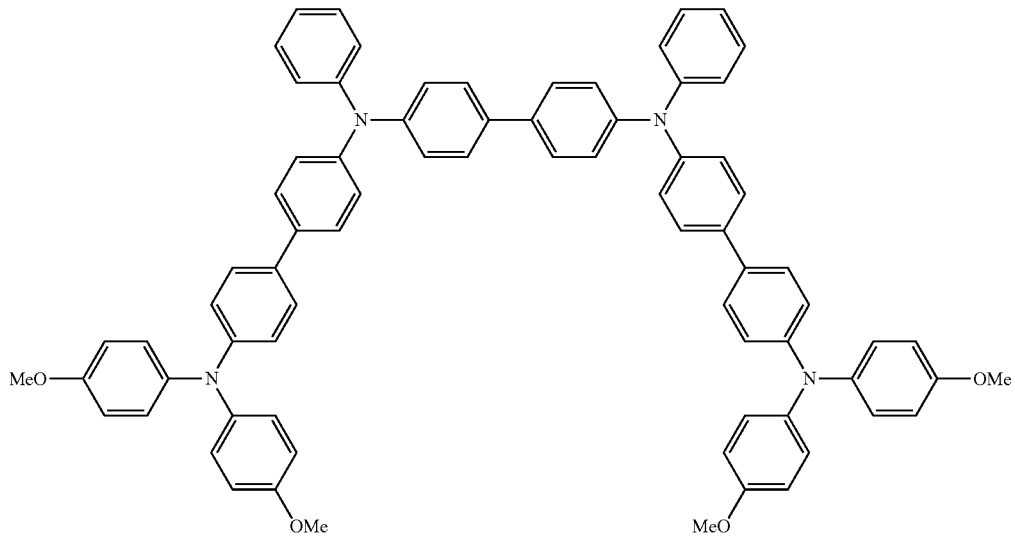 [SMILES: COc1ccc(N(c2ccc(OC)cc2)c2ccc(-c3ccc(N(c4ccccc4)c4ccc(-c5ccc(N(c6ccccc6)c6ccc(-c7ccc(N(c8ccc(OC)cc8)c8ccc(OC)cc8)cc7)cc6)cc5)cc4)cc3)cc2)cc1]
¹H NMR (300 MHz, THF-d₈): δ 7.37-7.50 (t, 8H), 7.37-7.40 (d, 4H), 7.21-7.26 (d, 4H), 6.96-7.12 (m, 22H), 6.90-6.93 (d, 4H), 6.81-6.84 (d, 8H), 3.74 (s, 12H)
(E3) Synthesis Example 6
Compound ID366
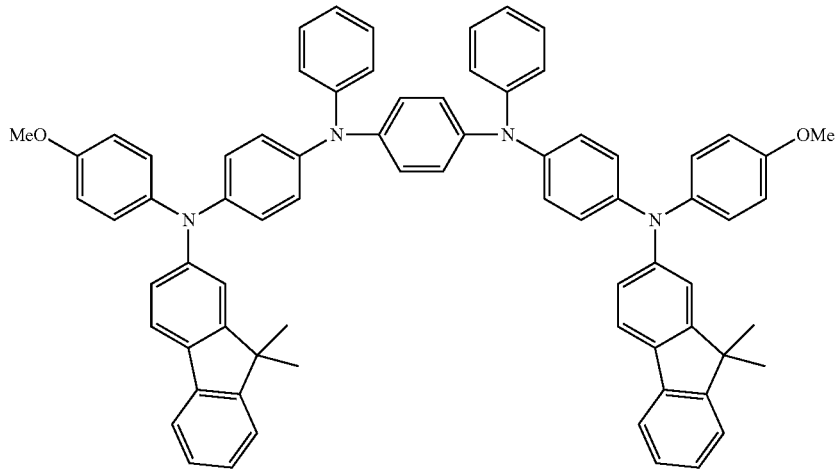 [SMILES: COc1ccc(N(c2ccc(N(c3ccccc3)c3ccc(N(c4ccccc4)c4ccc(N(c5ccc(OC)cc5)c5ccc6c(c5)C(C)(C)c5ccccc5-6)cc4)cc3)cc2)c2ccc3c(c2)C(C)(C)c2ccccc2-3)cc1]
¹H NMR (400 MHz, DMSO-d6): δ 7.60-7.70 (t, 4H), 7.40-7.55 (d, 2H), 7.17-7.29 (m, 8H), 7.07-7.09 (t, 4H), 7.06 (s, 2H), 6.86-7.00 (m, 24H), 3.73 (s, 6H), 1.31 (s, 12H)

(E4) Synthesis Example 7
Compound ID368
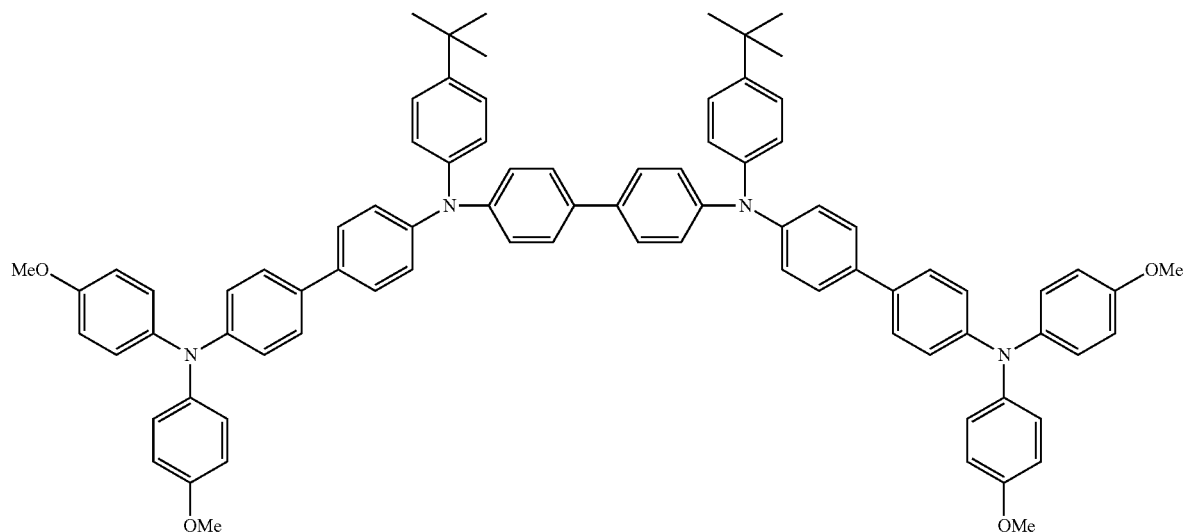 [SMILES: COc1ccc(N(c2ccc(OC)cc2)c2ccc(-c3ccc(N(c4ccc(-c5ccc(N(c6ccc(-c7ccc(N(c8ccc(OC)cc8)c8ccc(OC)cc8)cc7)cc6)c6ccc(C(C)(C)C)cc6)cc5)cc4)c4ccc(C(C)(C)C)cc4)cc3)cc2)cc1]
¹H NMR (400 MHz, DMSO-d6): δ 7.48-7.55 (m, 8H), 7.42-7.46 (d, 4H), 7.33-7.28 (d, 4H), 6.98-7.06 (m, 20H), 6.88-6.94 (m, 8H), 6.78-6.84 (d, 4H), 3.73 (s, 12H), 1.27 (s, 18H)
(E5) Synthesis Example 8
Compound ID369
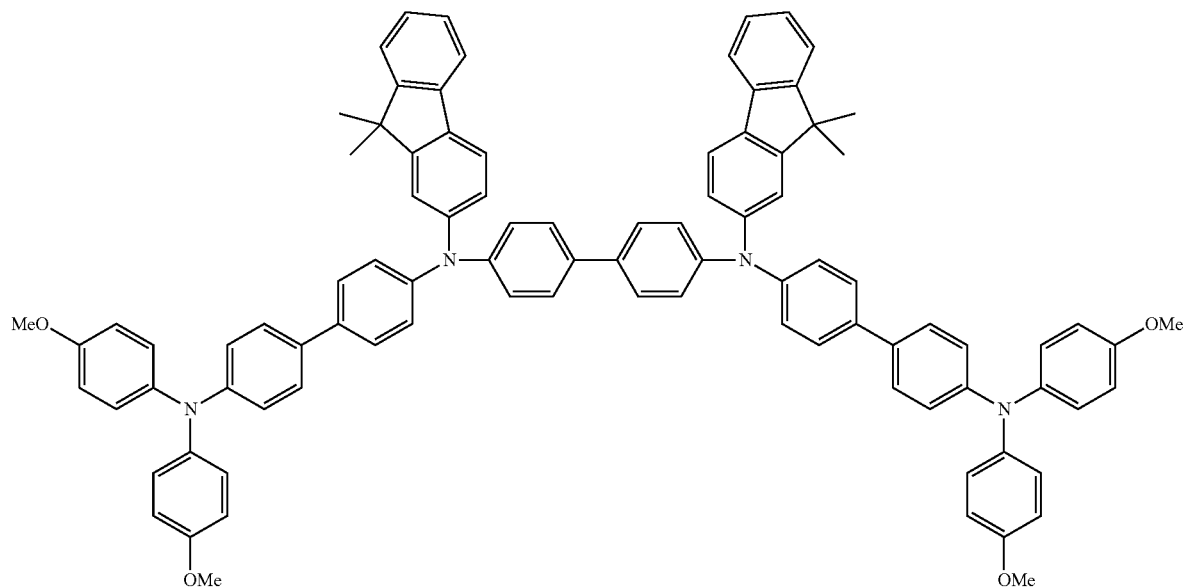 [SMILES: COc1ccc(N(c2ccc(OC)cc2)c2ccc(-c3ccc(N(c4ccc(-c5ccc(N(c6ccc(-c7ccc(N(c8ccc(OC)cc8)c8ccc(OC)cc8)cc7)cc6)c6ccc7c(c6)C(C)(C)c6ccccc6-7)cc5)cc4)c4ccc5c(c4)C(C)(C)c4ccccc4-5)cc3)cc2)cc1]
¹H NMR (400 MHz, THF-d8): δ 7.60-7.70 (t, 4H), 7.57-7.54 (d, 4H), 7.48-7.51 (d, 4H), 7.39-7.44 (t, 6H), 7.32-7.33 (d, 2H), 7.14-7.27 (m, 12H), 7.00-7.10 (m, 10H), 6.90-6.96 (m, 4H), 6.80-6.87 (m, 8H), 3.75 (s, 12H), 1.42 (s, 12H)

(E6) Synthesis Example 9
Compound ID446
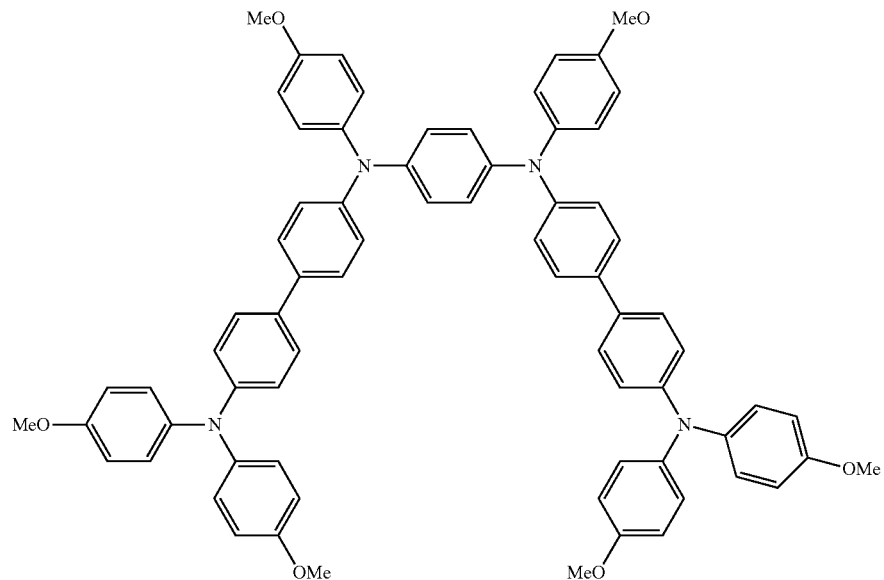 [SMILES: COc1ccc(N(c2ccc(OC)cc2)c2ccc(-c3ccc(N(c4ccc(OC)cc4)c4ccc(N(c5ccc(OC)cc5)c5ccc(-c6ccc(N(c7ccc(OC)cc7)c7ccc(OC)cc7)cc6)cc5)cc4)cc3)cc2)cc1]
¹H NMR (400 MHz, dmso-d₆): δ 7.39-7.44 (m, 8H), 7.00-7.07 (m, 13H), 6.89-6.94 (m, 19H), 6.79-6.81 (d, 4H), 3.73 (s, 18H)
(E7) Synthesis Example 10
Compound ID450
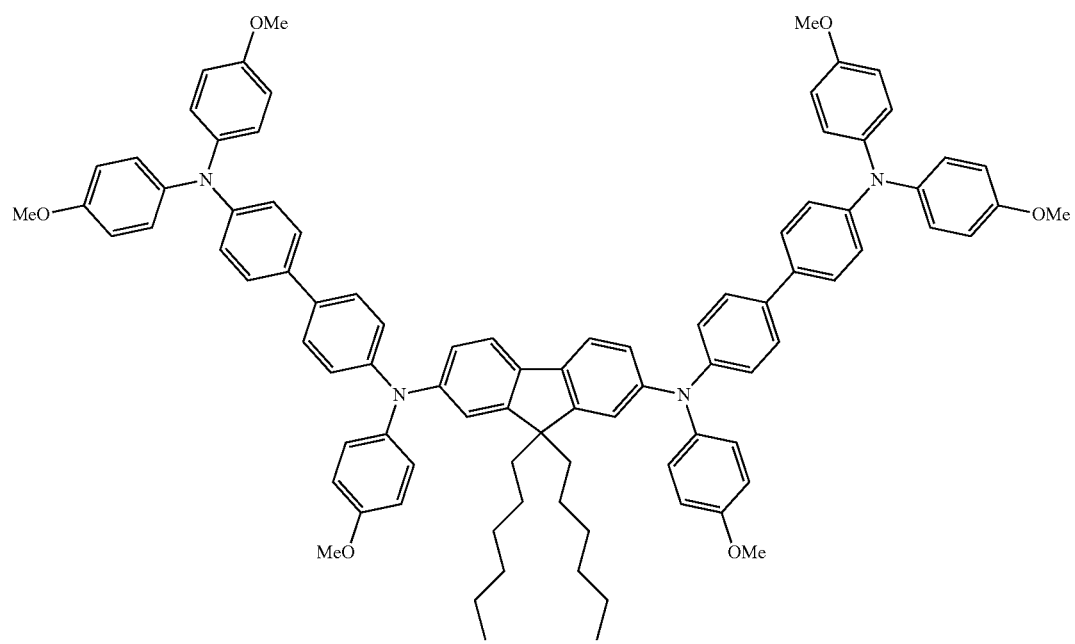 [SMILES: CCCCCCC1(CCCCCC)c2cc(N(c3ccc(OC)cc3)c3ccc(-c4ccc(N(c5ccc(OC)cc5)c5ccc(OC)cc5)cc4)cc3)ccc2-c2ccc(N(c3ccc(OC)cc3)c3ccc(-c4ccc(N(c5ccc(OC)cc5)c5ccc(OC)cc5)cc4)cc3)cc21]
¹H NMR (400 MHz, dmso-d₆): δ 7.55-7.57 (d, 2H), 7.39-7.45 (m, 8H), 6.99-7.04 (m, 15H), 6.85-6.93 (m, 19H), 6.78-6.80 (d, 4H), 3.72 (s, 18H), 1.68-1.71 (m, 6H), 1.07 (m, 6H), 0.98-0.99 (m, 8H), 0.58 (m, 6H)

(E8) Synthesis Example 11
Compound ID452
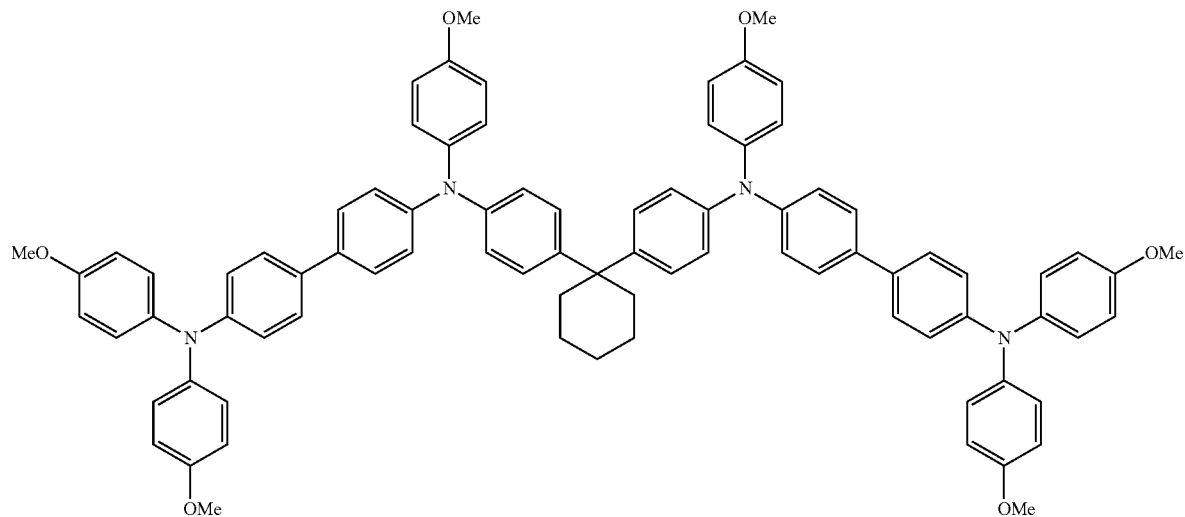 [SMILES: COc1ccc(N(c2ccc(OC)cc2)c2ccc(-c3ccc(N(c4ccc(OC)cc4)c4ccc(C5(c6ccc(N(c7ccc(OC)cc7)c7ccc(-c8ccc(N(c9ccc(OC)cc9)c9ccc(OC)cc9)cc8)cc7)cc6)CCCCC5)cc4)cc3)cc2)cc1]
$^1$H NMR (400 MHz, DMSO-d6): δ 7.38-7.44 (m, 8H), 7.16-7.19 (d, 4H), 6.99-7.03 (m, 12H), 6.85-6.92 (m, 20H), 6.77-6.79 (d, 4H), 3.74 (s, 18H), 2.00-2.25 (m, 4H), 1.25-1.50 (m, 6H)
(E9) Synthesis Example 12
Compound ID480
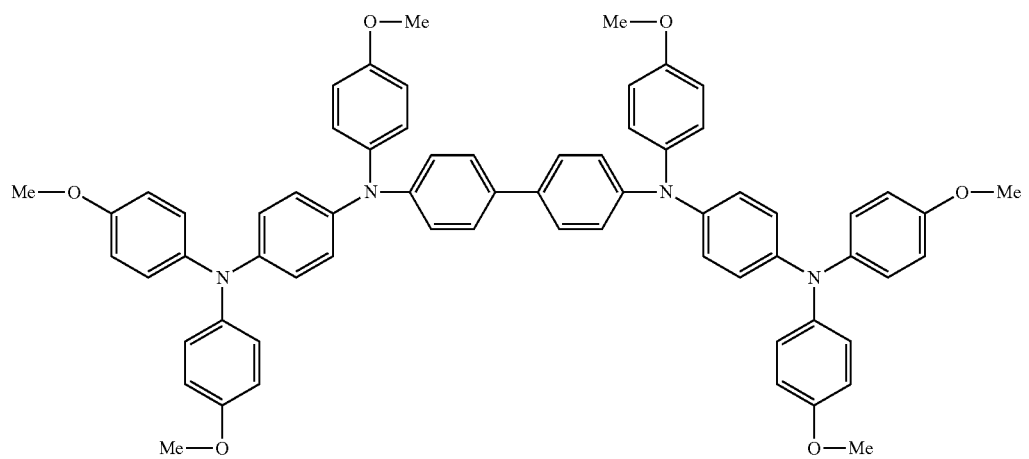 [SMILES: COc1ccc(N(c2ccc(OC)cc2)c2ccc(N(c3ccc(OC)cc3)c3ccc(-c4ccc(N(c5ccc(OC)cc5)c5ccc(N(c6ccc(OC)cc6)c6ccc(OC)cc6)cc5)cc4)cc3)cc2)cc1]
$^1$H NMR (400 MHz, DMSO-d6): δ 7.40-7.42 (d, 4H), 7.02-7.05 (d, 4H), 6.96-6.99 (m, 28H), 6.74-6.77 (d, 4H), 3.73 (s, 6H), 3.71 (s, 12H)

(E10) Synthesis Example 13
Compound ID518
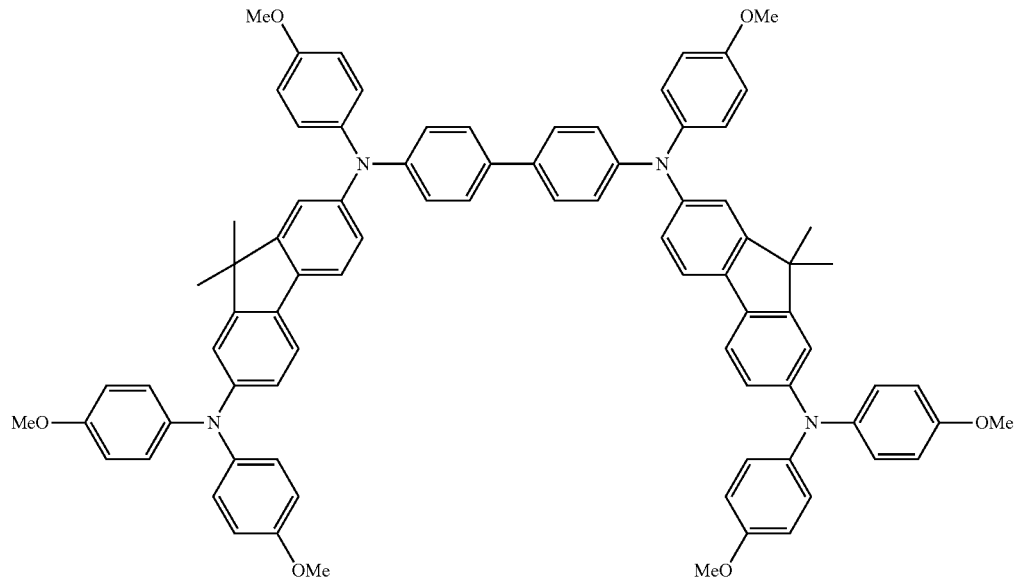 [SMILES: COc1ccc(N(c2ccc(OC)cc2)c2ccc3c(c2)C(C)(C)c2cc(N(c4ccc(OC)cc4)c4ccc(-c5ccc(N(c6ccc(OC)cc6)c6ccc7c(c6)C(C)(C)c6cc(N(c8ccc(OC)cc8)c8ccc(OC)cc8)ccc6-7)cc5)cc4)ccc2-3)cc1]
$^1$H NMR (400 MHz, DMSO-d6): 7.46-7.51 (m, 8H), 7.10-7.12 (d, 2H), 7.05-7.08 (d, 4H), 6.97-7.00 (d, 8H), 6.86-6.95 (m, 20H), 6.69-6.72 (m, 2H), 3.74 (s, 6H), 3.72 (s, 12H), 1.24 (t, 12H)
(E11) Synthesis Example 14
Compound ID519
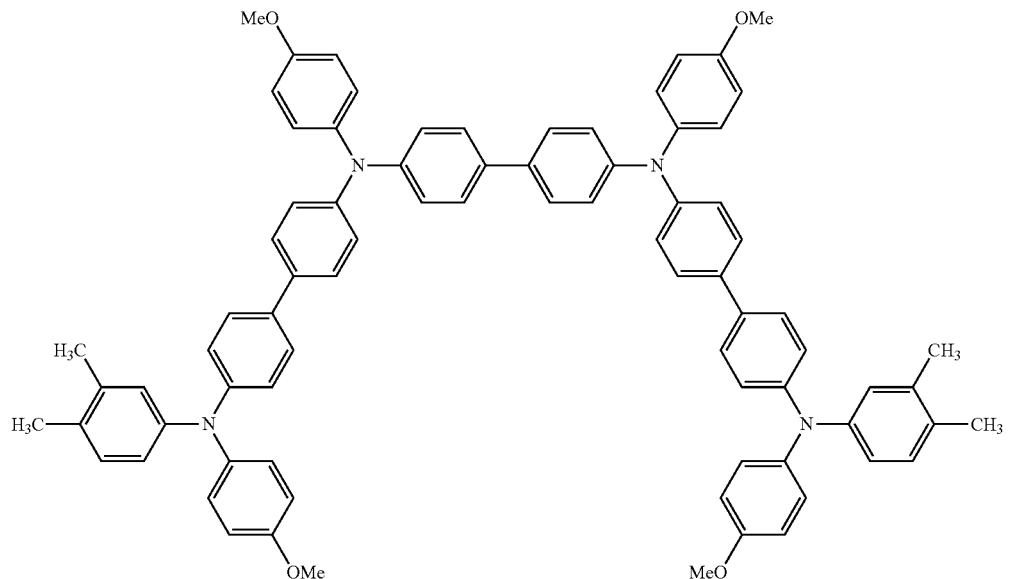
$^1$H NMR (400 MHz, DMSO-d6): 7.44-7.53 (m, 12H), 6.84-7.11 (m, 32H), 6.74-6.77 (d, 2H), 3.76 (s, 6H), 3.74 (s, 6H), 2.17 (s, 6H), 2.13 (s, 6H)

(E12) Synthesis Example 15
Compound ID521
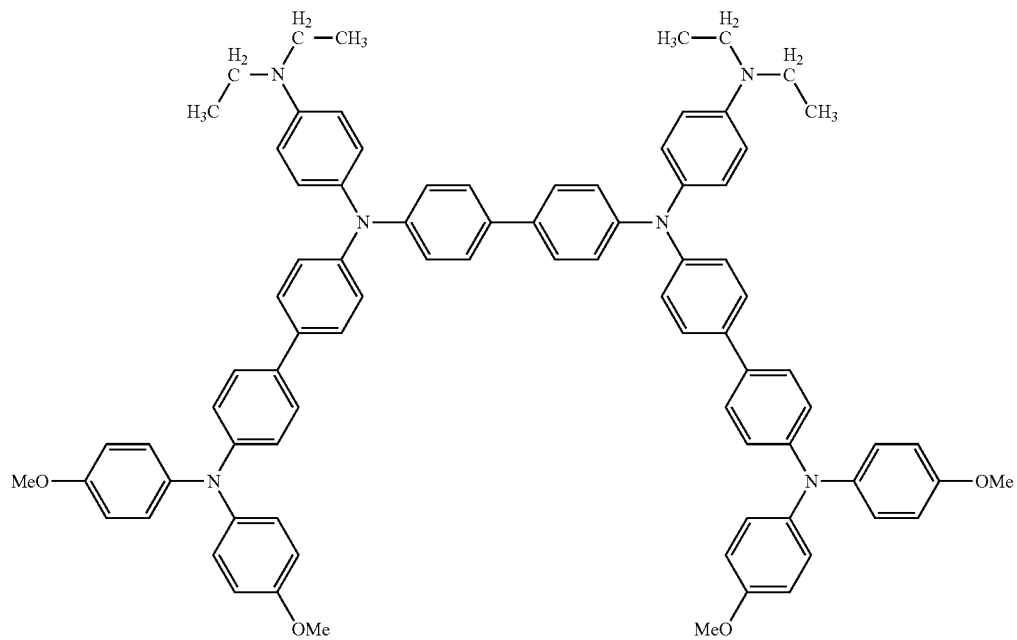 [SMILES: CCN(CC)c1ccc(N(c2ccc(-c3ccc(N(c4ccc(OC)cc4)c4ccc(OC)cc4)cc3)cc2)c2ccc(-c3ccc(N(c4ccc(-c5ccc(N(c6ccc(OC)cc6)c6ccc(OC)cc6)cc5)cc4)c4ccc(N(CC)CC)cc4)cc3)cc2)cc1]
$^1$H NMR (400 MHz, THF-$d_6$): 7.36-7.42 (m, 12H), 6.99-7.07 (m, 20H), 6.90-6.92 (d, 4H), 6.81-6.84 (m, 8H), 6.66-6.69 (d, 4H), 3.74 (s, 12H), 3.36-3.38 (q, 8H), 1.41-1.17 (t, 12H)
(E13) Synthesis Example 16
Compound ID522
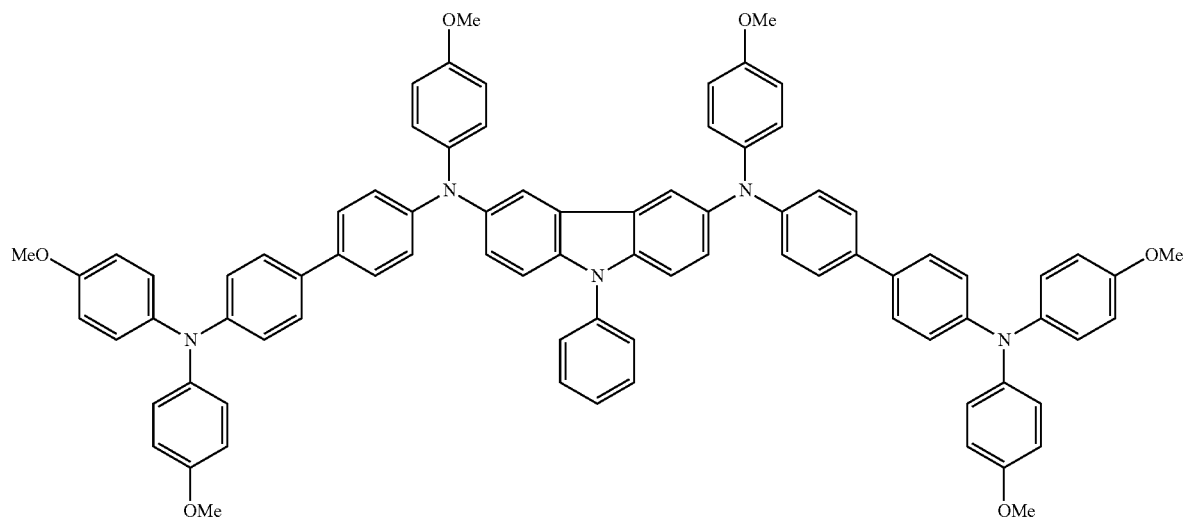 [SMILES: COc1ccc(N(c2ccc(OC)cc2)c2ccc(-c3ccc(N(c4ccc(OC)cc4)c4ccc5c(c4)c4cc(N(c6ccc(OC)cc6)c6ccc(-c7ccc(N(c8ccc(OC)cc8)c8ccc(OC)cc8)cc7)cc6)ccc4n5-c4ccccc4)cc3)cc2)cc1]
$^1$H NMR (400 MHz, DMSO-$d_6$): 7.65 (s, 2H), 7.52-7.56 (t, 2H), 7.44-7.47 (t, 1H), 7.37-7.39 (d, 2H), 7.20-7.22 (m, 10H), 7.05-7.08 (dd, 2H), 6.86-6.94 (m, 8H), 6.79-6.80-6.86 (m, 12H), 6.68-6.73, (dd, 8H), 6.60-6.62 (d, 4H), 3.68 (s, 12H), 3.62 (s, 6H)

(E14) Synthesis Example 17
Compound ID523
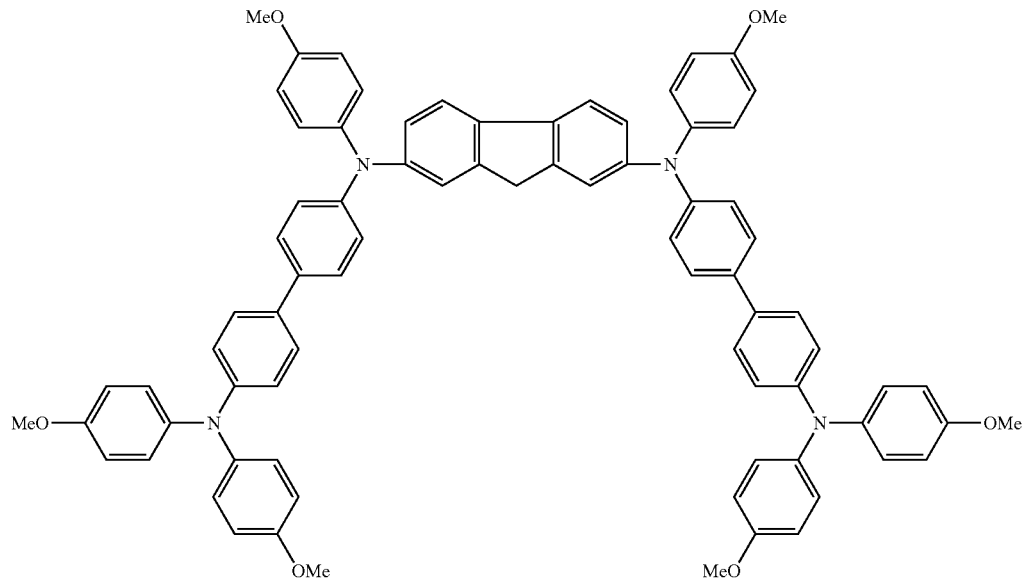 [SMILES: COc1ccc(N(c2ccc(OC)cc2)c2ccc(-c3ccc(N(c4ccc(OC)cc4)c4ccc5c(c4)Cc4cc(N(c6ccc(OC)cc6)c6ccc(-c7ccc(N(c8ccc(OC)cc8)c8ccc(OC)cc8)cc7)cc6)ccc4-5)cc3)cc2)cc1]
$^1$H NMR (400 MHz, THF-$d_8$): 7.54-7.56 (d, 2H), 7.35-7.40 (dd, 8H), 7.18 (s, 2H), 7.00-7.08 (m, 18H), 6.90-6.92 (d, 4H), 6.81-6.86 (m, 12H), 3.75 (s, 6H), 3.74 (s, 12H), 3.69 (s, 2H)
(E15) Synthesis Example 18
Compound ID565
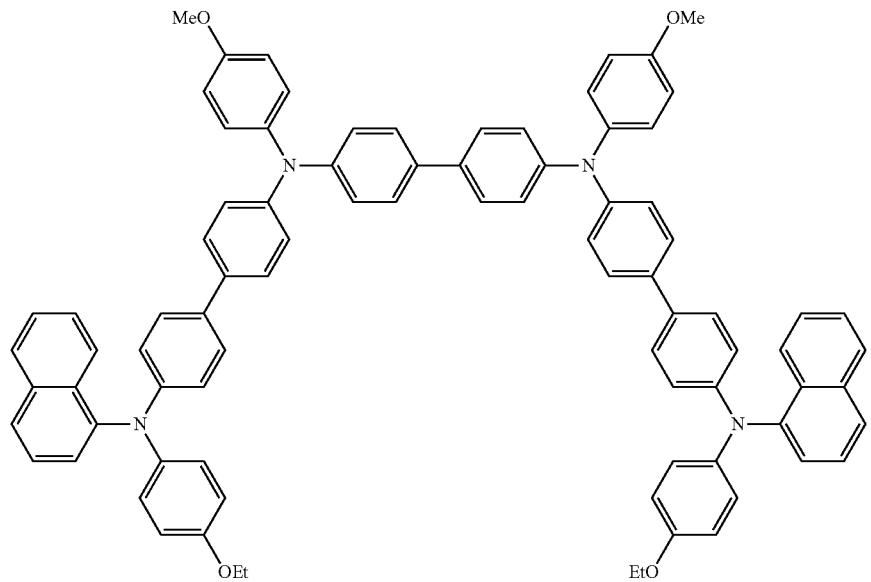 [SMILES: CCOc1ccc(N(c2ccc(-c3ccc(N(c4ccc(OC)cc4)c4ccc(-c5ccc(N(c6ccc(OC)cc6)c6ccc(-c7ccc(N(c8ccc(OCC)cc8)c8cccc9ccccc89)cc7)cc6)cc5)cc4)cc3)cc2)c2cccc3ccccc23)cc1]
$^1$H NMR (400 MHz, THF-d8): 7.97-8.00 (d, 2H), 7.86-7.89 (d, 2H), 7.73-7.76 (d, 2H), 7.28-7.47 (m, 20H), 7.03-7.08 (m, 16H), 6.78-6.90 (m, 12H), 3.93-3.99 (q, 4H), 3.77 (s, 6H), 1.32-1.36 (s, 6H)

(E16) Synthesis Example 19
Compound ID568
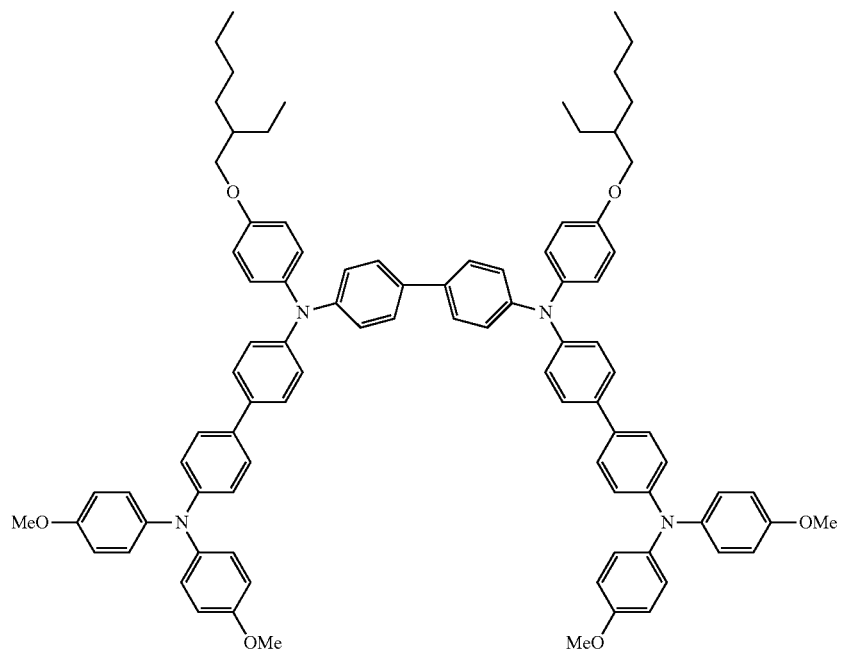 [SMILES: CCCCC(CC)COc1ccc(N(c2ccc(-c3ccc(N(c4ccc(OC)cc4)c4ccc(OC)cc4)cc3)cc2)c2ccc(-c3ccc(N(c4ccc(OCC(CC)CCCC)cc4)c4ccc(-c5ccc(N(c6ccc(OC)cc6)c6ccc(OC)cc6)cc5)cc4)cc3)cc2)cc1]
¹H NMR (400 MHz, DMSO-d6): 7.41-7.51 (m, 12H), 6.78-7.06 (m, 36H), 3.82-3.84 (d, 4H), 3.79 (s, 12H), 1.60-1.80 (m, 2H), 0.60-1.60 (m, 28H)
(E17) Synthesis Example 20
Compound ID569
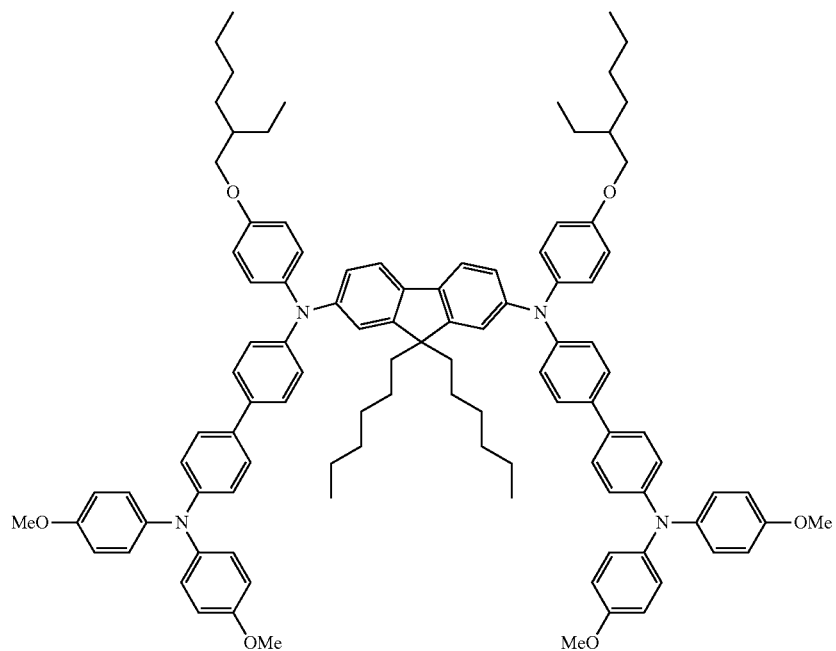 [SMILES: CCCCCCC1(CCCCCC)c2cc(N(c3ccc(OCC(CC)CCCC)cc3)c3ccc(-c4ccc(N(c5ccc(OC)cc5)c5ccc(OC)cc5)cc4)cc3)ccc2-c2ccc(N(c3ccc(OCC(CC)CCCC)cc3)c3ccc(-c4ccc(N(c5ccc(OC)cc5)c5ccc(OC)cc5)cc4)cc3)cc21]

$^1$H NMR (400 MHz, DMSO-d6): 7.40-7.70 (m, 10H), 6.80-7.20 (m, 36H), 3.92-3.93 (d, 4H), 2.81 (s, 12H), 0.60-1.90 (m, 56H)
(E18) Synthesis Example 21
Compound ID572
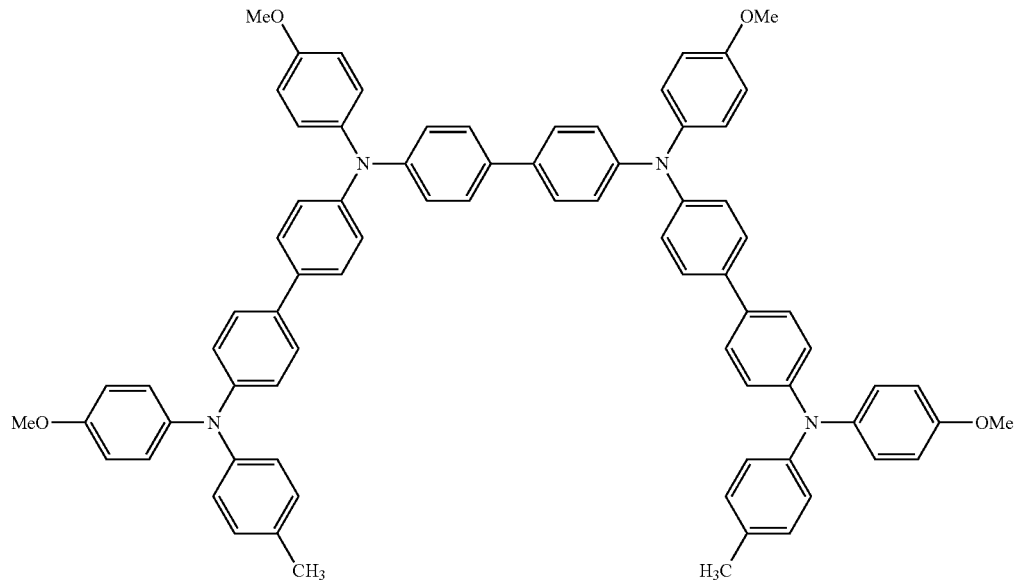 [SMILES: COc1ccc(N(c2ccc(C)cc2)c2ccc(-c3ccc(N(c4ccc(OC)cc4)c4ccc(-c5ccc(N(c6ccc(OC)cc6)c6ccc(-c7ccc(N(c8ccc(C)cc8)c8ccc(OC)cc8)cc7)cc6)cc5)cc4)cc3)cc2)cc1]
$^1$H NMR (400 MHz, THF-d8): 7.39-7.47 (m, 12H), 7.03-7.11 (m, 20H), 6.39-6.99 (m, 8H), 6.83-6.90 (m, 8H), 3.78 (s, 6H), 3.76 (s, 6H), 2.27 (s, 6H)
(E19) Synthesis Example 22
Compound ID573
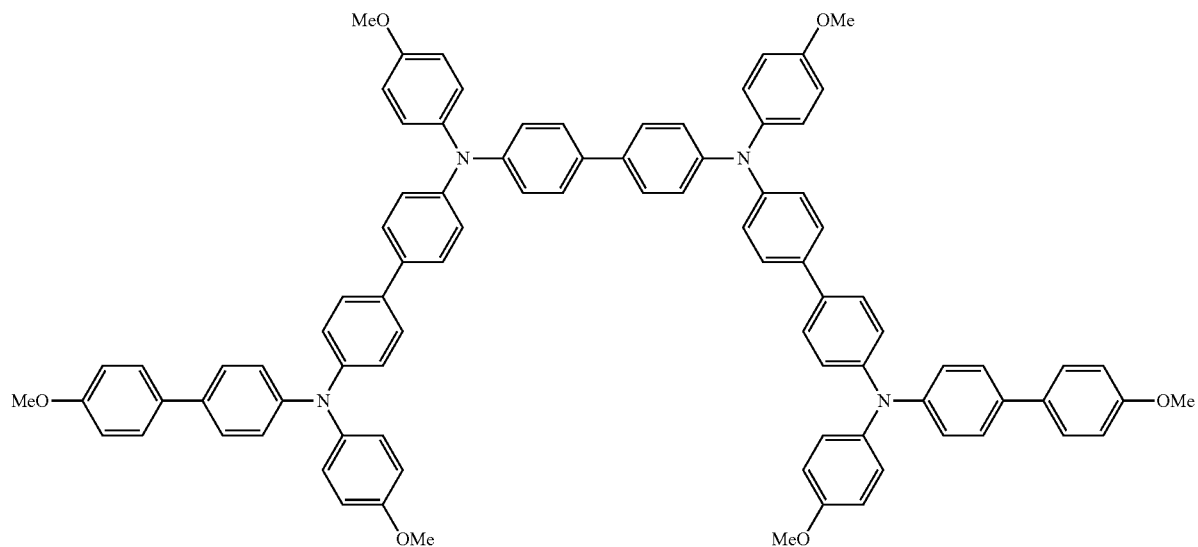 [SMILES: COc1ccc(-c2ccc(N(c3ccc(OC)cc3)c3ccc(-c4ccc(N(c5ccc(OC)cc5)c5ccc(-c6ccc(N(c7ccc(OC)cc7)c7ccc(-c8ccc(N(c9ccc(OC)cc9)c9ccc(-c%10ccc(OC)cc%10)cc9)cc8)cc7)cc6)cc5)cc4)cc3)cc2)cc1]

$^1$H NMR (400 MHz, THF-d8): 7.43-7.51 (m, 20H), 7.05-7.12 (m, 24H), 6.87-6.95 (m, 12H), 3.79 (s, 6H), 3.78 (s, 12H)
(E20) Synthesis Example 23
Compound ID575
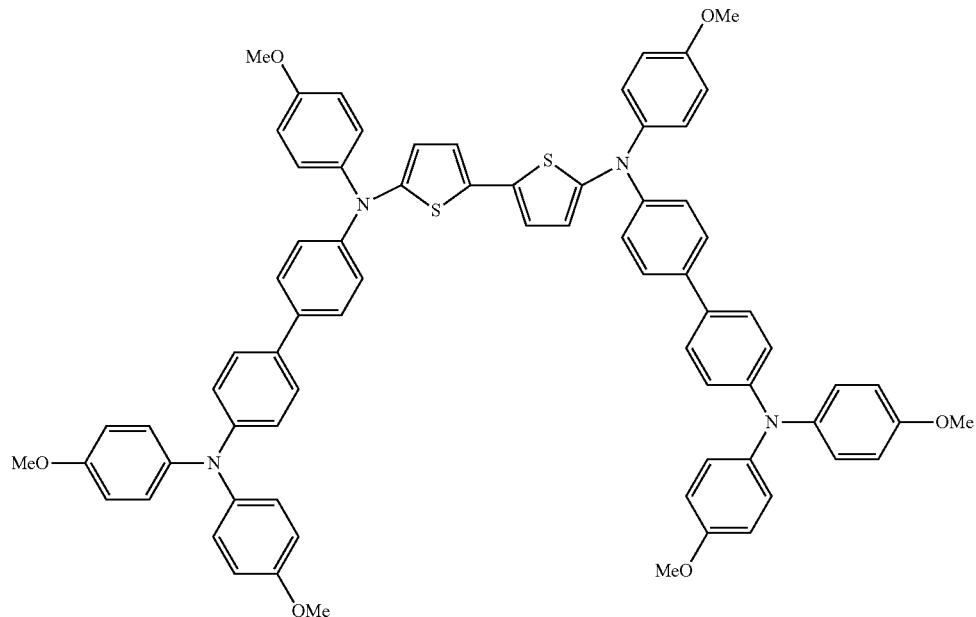 [SMILES: COc1ccc(N(c2ccc(OC)cc2)c2ccc(-c3ccc(N(c4ccc(OC)cc4)c4ccc(-c5ccc(N(c6ccc(OC)cc6)c6ccc(-c7ccc(N(c8ccc(OC)cc8)c8ccc(OC)cc8)cc7)cc6)s5)s4)cc3)cc2)cc1]
$^1$H NMR (400 MHz, DMSO-d6): 7.35-7.55 (m, 8H), 7.15-7.45 (m, 4H), 6.85-7.10 (m, 26H), 6.75-6.85 (d, 4H), 6.50-6.60 (d, 2H), 3.76 (s, 6H), 3.74 (s, 12H)
(E21) Synthesis Example 24
Compound ID629
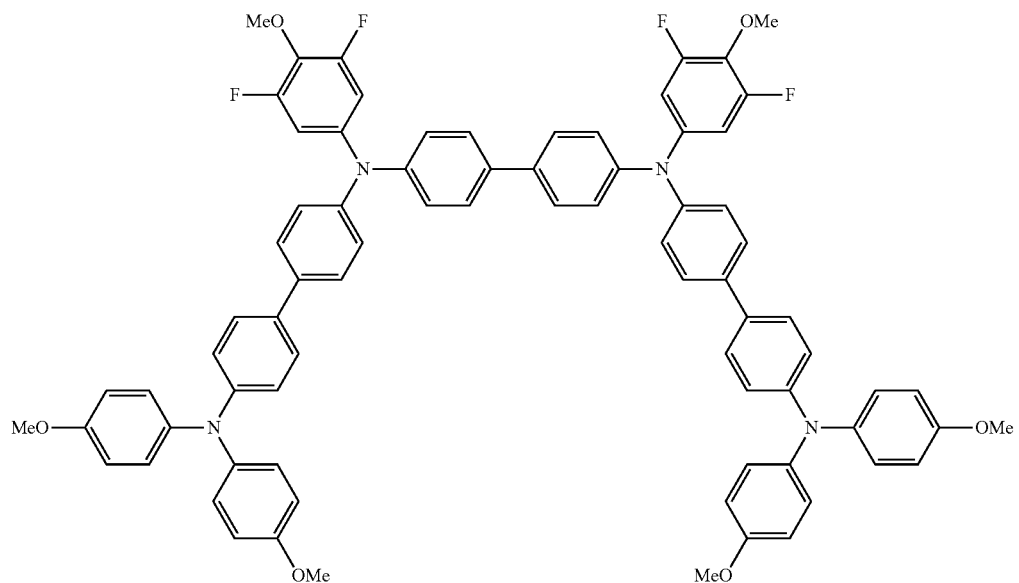 [SMILES: COc1ccc(N(c2ccc(OC)cc2)c2ccc(-c3ccc(N(c4ccc(-c5ccc(N(c6ccc(-c7ccc(N(c8ccc(OC)cc8)c8ccc(OC)cc8)cc7)cc6)c6cc(F)c(OC)c(F)c6)cc5)cc4)c4cc(F)c(OC)c(F)c4)cc3)cc2)cc1]

$^1$H NMR (400 MHz, THF-d$_8$): 7.50-7.56 (dd, 8H), 7.38-7.41 (dd, 4H), 7.12-7.16 (d, 8H), 7.02-7.04 (dd, 8H), 6.91-6.93 (d, 4H), 6.82-6.84 (dd, 8H), 6.65-6.68 (d, 4H) 3.87 (s, 6H), 3.74 (s, 12H)

(E22) Synthesis Example 25

Compound ID631

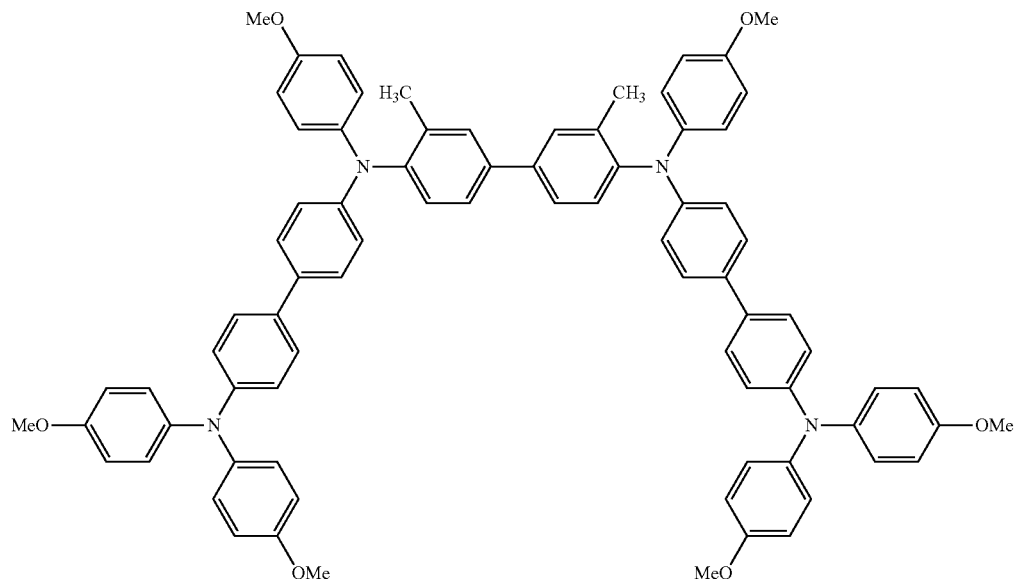 [SMILES: COc1ccc(N(c2ccc(OC)cc2)c2ccc(-c3ccc(N(c4ccc(OC)cc4)c4ccc(-c5ccc(N(c6ccc(OC)cc6)c6ccc(-c7ccc(N(c8ccc(OC)cc8)c8ccc(OC)cc8)cc7)cc6)c(C)c5)cc4C)cc3)cc2)cc1]

$^1$H NMR (400 MHz, THF-d$_6$): 7.52 (d, 2H), 7.43-7.47 (dd, 2H), 7.34-7.38 (m, 8H), 7.12-7.14 (d, 2H), 6.99-7.03 (m, 12H), 6.81-6.92 (m, 20H), 3.74 (s, 18H), 2.10 (s, 6H)

(F) Synthesis of Compounds of the Formula IV (IV)

(a) Coupling of p-anisidine and 2-bromo-9,9-dimethyl-9H-fluorene

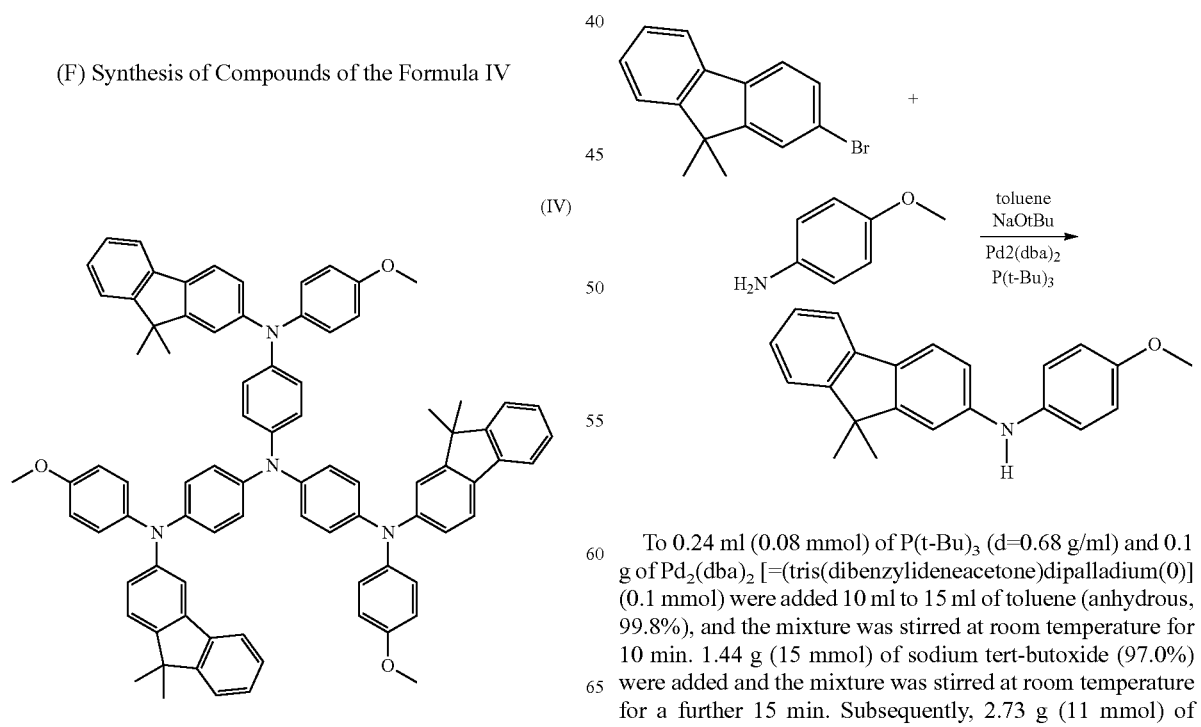

To 0.24 ml (0.08 mmol) of P(t-Bu)$_3$ (d=0.68 g/ml) and 0.1 g of Pd$_2$(dba)$_2$ [=(tris(dibenzylideneacetone)dipalladium(0)] (0.1 mmol) were added 10 ml to 15 ml of toluene (anhydrous, 99.8%), and the mixture was stirred at room temperature for 10 min. 1.44 g (15 mmol) of sodium tert-butoxide (97.0%) were added and the mixture was stirred at room temperature for a further 15 min. Subsequently, 2.73 g (11 mmol) of 2-bromo-9,9-dimethyl-9H-fluorene were added and the reaction mixture was stirred for a further 15 min. Finally, 1.23 g (10 mmol) of p-anisidine were added and the mixture was stirred at 90° C. for 4 h.

The reaction mixture was admixed with water and the product was precipitated from hexane. The aqueous phase was additionally extracted with ethyl acetate. The organic phase and the precipitated solid which had been filtered off were combined and purified by column chromatography on an SiO₂ phase (10:1 hexane:ethyl acetate).

1.5 g (yield: 47.6%) of a yellow solid were obtained.
¹HNMR (300 MHz, C6D6): 6.7-7.6 (m, 11H), 5.00 (s, 1H,), 3.35 (s, 3H), 1.37 (s, 6H)

(b) Coupling of the Product from (a) with tris(4-bromophenyl)amine

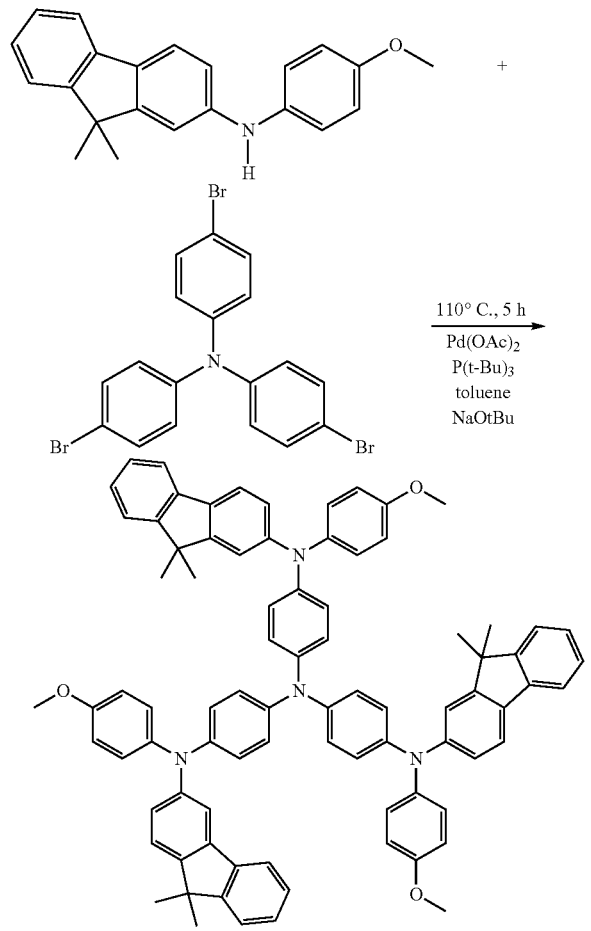

To 0.2 ml (0.07 mmol) of P(t-Bu)₃ (D=0.68 g/ml) and 0.02 g (0.1 mmol) of palladium acetate were added 25 ml of toluene (anhydrous), and the mixture was stirred at room temperature for 10 min. 0.4 g (1.2 mmol) of sodium tert-butoxide (97.0%) was added and the mixture was stirred at room temperature for a further 15 min. Subsequently, 0.63 g (1.3 mmol) of tris(4-bromophenyl)amine was added and the reaction mixture was stirred for a further 15 min. Finally, 1.3 g (1.4 mmol) of the product from step (a) were added and the mixture was stirred at 90° C. for 5 h.

The reaction mixture was admixed with ice-cold water and extracted with ethyl acetate. The product was precipitated from a mixture of hexane/ethyl acetate and purified by column chromatography on SiO₂ phase (9:1→5:1 hexane:ethyl acetate gradient).

0.7 g (yield: 45%) of a yellow product was obtained.
¹HNMR (300 MHz, C6D6): 6.6-7.6 (m, 45H), 3.28 (s, 9H), 1.26 (s, 18H)

(G) Synthesis of Compounds ID504

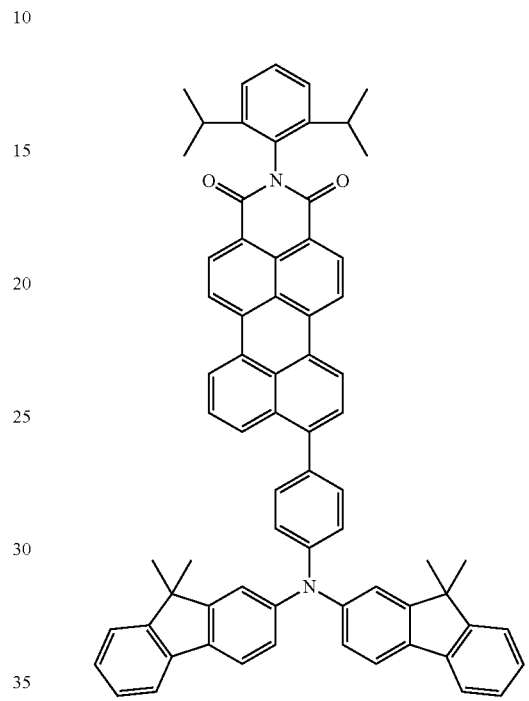

The preparation proceeded from (4-bromophenyl)bis(9,9-dimethyl-9H-fluoren-2-yl) (see Chemical Communications, 2004, 68-69), which was first reacted with 4,4,5,5,4',4',5',5'-octamethyl-[2,2']bi[[1,3,2]dioxaborolanyl] (step a). This was followed by coupling with 9Br-DIPP-PDCI (step b). This was followed by hydrolysis to give the anhydride (step c) and subsequent reaction with glycine to give the final compound (step d).

Step a:

A mixture of 30 g (54 mmol) of (4-bromophenyl)bis(9,9-dimethyl-9H-fluoren-2-yl), 41 g (162 mmol) of 4,4,5,5,4',4', 5',5'-octamethyl-[2,2']bi[[1,3,2]dioxaborolanyl], 1 g (1.4 mmol) of Pd(dpf)₂Cl₂, 15.9 g (162 mmol) of potassium acetate and 300 ml of dioxane was heated to 80° C. and stirred for 36 h.

After cooling, the solvent was removed and the residue was dried at 50° C. in a vacuum drying cabinet.

Purification was effected by filtration through silica gel with the eluent 1:1 n-hexane:dichloromethane. After the removal of the reactant, the eluent was switched to dichloromethane. The product was isolated as a reddish and tacky residue. This was extracted by stirring with methanol at RT for 0.5 h. The light-colored precipitate was filtered off. After drying at 45° C. in a vacuum drying cabinet, 24 g of a light-colored solid were obtained, which corresponds to a yield of 74%.

Analytical Data

¹H NMR (500 MHz, CD₂Cl₂, 25° C.): δ=7.66-7.61 (m, 6H); 7.41-7.4 (m, 2H); 7.33-7.25 (m, 6H); 7.13-7.12 (m, 2H); 7.09-7.07 (m, 2H); 1.40 (s, 12H); 1.32 (s, 12H)

Step b:

17.8 g (32 mmol) of 9Br-DIPP-PDCI and 19 ml (95 mmol) of 5 molar NaOH were introduced into 500 ml of dioxane. This mixture was degassed with argon for 30 min. Then 570 mg (1.1 mmol) of Pd[P(tBu)$_3$]$_2$ and 23 g (38 mmol) of stage a were added and the mixture was stirred at 85° C. under argon for 17 h.

Purification was effected by column chromatography with the eluent 4:1 dichloromethane:toluene.

22.4 g of a violet solid were obtained, which corresponds to a yield of 74%.

Analytical Data:

$^1$H NMR (500 MHz, CH$_2$Cl$_2$, 25° C.): δ=8.59-8.56 (m, 2H); 8.46-8.38 (m, 4H); 8.21-8.19 (d, 1H); 7.69-7.60 (m, 6H); 7.52-7.25 (m, 17H); 2.79-2.77 (m, 2H); 1.44 (s, 12H); 1.17-1.15 (d, 12H)

Step c:

22.4 g (23 mmol) of step b and 73 g (1.3 mol) of KOH were introduced into 200 ml of 2-methyl-2-butanol and the mixture was stirred at reflux for 17 h.

After cooling, the reaction mixture was added to 1 l of ice-water+50 ml of concentrated acetic acid. The orange-brown solid was filtered through a frit and washed with water.

The solid was dissolved in dichloromethane and extracted with demineralized water. 10 ml of concentrated acetic acid were added to the organic phase, which was stirred at RT. The solvent was removed from the solution. The residue was extracted by stirring with methanol at RT for 30 min, filtered with suction through a frit and dried at 55° C. in a vacuum drying cabinet.

This afforded 17.5 g of a violet solid, which corresponds to a yield of 94%. The product was used unpurified in the next step.

Step d:

17.5 g (22 mmol) of stage c, 16.4 g (220 mmol) of glycine and 4 g (22 mmol) of zinc acetate were introduced into 350 ml of N-methylpyrrolidone and the mixture was stirred at 130° C. for 12 h.

After cooling, the reaction mixture was added to 1 l of demineralized water. The precipitate was filtered through a frit, washed with water and dried at 70° C. in a vacuum drying cabinet.

Purification was effected by means of column chromatography with the eluent 3:1 dichloromethane:ethanol+2% triethylamine. The isolated product was extracted by stirring at 60° C. with 50% acetic acid. The solid was filtered off with suction through a frit, washed with water and dried at 80° C. in a vacuum drying cabinet.

7.9 g of a violet solid were obtained, which corresponds to a yield of 42%.

Analytical Data:

$^1$H NMR (500 MHz, THF, 25° C.): δ=8.37-8.34 (m, 2H); 8.25-8.18 (m, 4H); 8.12-8.10 (d, 1H); 7.74-7.70 (m, 4H); 7.59-7.53 (m, 4H); 7.45-7.43 (m, 4H); 7.39-7.37 (m, 2H); 7.32-7.22 (m, 6H); 4.82 (s, 2H); 1.46 (s, 12H)

(H) Synthesis of Compounds ID662

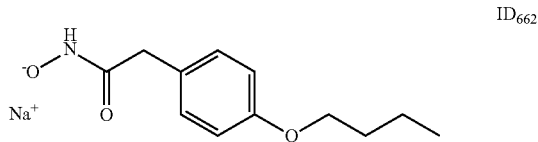

ID$_{662}$

ID662 was prepared by reacting the corresponding commercially available hydroxamic acid [2-(4-butoxyphenyl)-N-hydroxyacetamide] with sodium hydroxide.

LIST OF REFERENCE SIGNS

| | |
|---|---|
| 110 | Detector |
| 112 | Object |
| 114 | Optical sensor |
| 116 | Sensor region |
| 118 | Sensor area |
| 120 | Measuring device |
| 122 | Evaluation device |
| 124 | Data processing device |
| 126 | Data storage device |
| 128 | Interface |
| 130 | Transfer device |
| 132 | Lens |
| 134 | Electromagnetic radiation |
| 136 | Light spot |
| 138 | Modulation device |
| 140 | Beam interrupter |
| 142 | Illumination source |
| 144 | Primary radiation |
| 146 | Reflective surface |
| 148 | Semiconductor detector |
| 150 | Organic semiconductor detector |
| 152 | Organic solar cell |
| 154 | Dye solar cell |
| 156 | Substrate |
| 158 | First electrode |
| 160 | Blocking layer, buffer layer |
| 162 | n-semiconducting metal oxide |
| 164 | Dye |
| 166 | p-type semiconductor |
| 168 | Second electrode |
| 170 | Layer structure |
| 172 | Encapsulation |
| 174 | Fermi level |
| 176 | HOMO |
| 178 | LUMO |
| 180 | Distance measuring device |
| 182 | Light spot |
| 184 | Light spot |
| 186 | Housing |
| 188 | Front side |
| 190 | First motor vehicle |
| 192 | Rear side |
| 194 | Second motor vehicle |
| 196 | Imaging device |
| 198 | Sample |
| 200 | Confocal microscope |
| 202 | Focus |
| 204 | Beam splitter |
| 206 | Diaphragm |
| 208 | Sensor |
| 210 | Stack |
| 212 | Layer |
| 214 | Human-machine interface |
| 216 | Entertainment device |
| 218 | User |

| | |
|---|---|
| 220 | Machine |
| 222 | Display |
| 224 | Keyboard |
| 226 | Security device |
| 228 | Memory device |
| 230 | Optical data storage device |
| 232 | Reading beam |
| 234 | Interface |

The invention claimed is:

1. A detector comprising an optical sensor,
wherein
the optical sensor has a sensor region,
the optical sensor is designed to generate a sensor signal in a manner dependent on an illumination of the sensor region,
the sensor signal, given the same total power of the illumination is dependent on a geometry of the illumination,
the detector has an evaluation device, and
the evaluation device is designed to generate an item of geometrical information from the sensor signal.

2. The detector according to claim 1, wherein the detector has a modulation device for modulating the illumination.

3. The detector according to claim 2, wherein the detector is designed to detect at least two sensor signals in the case of different modulations, wherein the evaluation device is designed to generate the geometrical information from the at least two sensor signals.

4. The detector according to claim 1, wherein the optical sensor is designed in such a way that the sensor signal, given the same total power of the illumination, is dependent on a modulation frequency of a modulation of the illumination.

5. The detector according to claim 1, wherein the sensor region is exactly one continuous sensor region, and the sensor signal is a uniform sensor signal for the entire sensor region.

6. The detector according to claim 1, wherein the sensor signal is at least one selected from the group consisting of a photocurrent and a photovoltage.

7. The detector according to claim 1, wherein the optical sensor comprises a semiconductor detector.

8. The detector according to claim 7, wherein the optical sensor comprises a first electrode, a n-semiconducting metal oxide, a dye, a p-semiconducting organic material, and a second electrode.

9. The detector according to claim 1, wherein the geometrical information comprises an item of location information of an object.

10. The detector according to claim 9, wherein the evaluation device is designed to determine the geometrical information from a predefined relationship between the geometry of the illumination and a relative positioning of an object with respect to the detector, optionally taking account of a known power of the illumination and of a modulation frequency with which the illumination is modulated.

11. The detector according to claim 1, further comprising a transfer device, wherein the transfer device is designed to feed electromagnetic radiation emerging from an object to the optical sensor and thereby to illuminate the sensor region.

12. The detector according to claim 1, further comprising an illumination source.

13. The detector according to claim 12, wherein the illumination source is selected from the group consisting of an illumination source, which is at least partly connected to an object, is at least partly identical to the object, or both, and an illumination source which is designed to at least partly illuminate the object with a primary radiation.

14. A distance measuring device, comprising a detector according to claim 1, wherein the detector is designed to determine an item of geometrical information of an object, wherein the geometrical information comprises an item of location information of the object.

15. An imaging device comprising a detector according to claim 1, wherein
the imaging device is designed to image a plurality of partial regions of a sample onto the sensor region and to thereby generate sensor signals assigned to partial regions,
the imaging device is designed to generate items of geometrical information of the respective partial regions from the sensor signals, and
the items of geometrical information comprise items of location information.

16. A human-machine interface comprising a detector according to claim 1, wherein the human-machine interface is designed to generate an item of geometrical information of a user by means of the detector, and to assign to the geometrical information an item of information wherein the interface is suitable for exchanging the item of information between a user and a machine.

17. An entertainment device, comprising a human-machine interface according to claim 16, wherein the entertainment device is designed to enable an item of information to be input by a player by means of the human-machine interface, and to vary an entertainment function in accordance with the information.

18. A security device comprising a detector according to claim 1, wherein the security device is designed to identify, by means of the detector, impingement of focused electromagnetic radiation on the security device and optionally to generate a warning signal.

19. A method for optically detecting an object, comprising detecting an object with a detector according to claim 1,
wherein
the detecting comprises feeding electromagnetic radiation emerging from the object to optical sensor and thereby illuminating the sensor region,
the optical sensor generates a sensor signal in a manner dependent on the illumination of the sensor region, and
the sensor signal, given a same total power of the illumination, is dependent on a geometry of the illumination.

20. The method according to claim 19, wherein an item of geometrical information of the object is generated from the sensor signal.

21. The detector according to claim 1, wherein the detector is suitable for at least one selected from the group consisting of: distance measurement, imaging, an entertainment application, a security application, and a human-machine interface application.

22. The device according to claim 1, wherein the optical sensor is an organic solar cell.

* * * * *